(12) United States Patent
Ye et al.

(10) Patent No.: US 6,884,984 B2
(45) Date of Patent: Apr. 26, 2005

(54) SYSTEM AND METHOD FOR LITHOGRAPHY PROCESS MONITORING AND CONTROL

(75) Inventors: Jun Ye, Palo Alto, CA (US); R. Fabian W. Pease, Stanford, CT (US); Xun Chen, Palo Alto, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/755,809

(22) Filed: Jan. 12, 2004

(65) Prior Publication Data

US 2004/0140418 A1 Jul. 22, 2004

Related U.S. Application Data

(62) Division of application No. 10/390,806, filed on Mar. 18, 2003, now Pat. No. 6,828,542.
(60) Provisional application No. 60/432,725, filed on Dec. 12, 2002, and provisional application No. 60/386,408, filed on Jun. 7, 2002.

(51) Int. Cl.$^7$ ............................................. H01L 27/00
(52) U.S. Cl. ................................... 250/208.1; 250/548
(58) Field of Search ............................. 250/208.1, 548, 250/559.4; 356/399, 400, 401; 355/53, 55

(56) References Cited

U.S. PATENT DOCUMENTS

| | | | |
|---|---|---|---|
| 4,585,342 A | | 4/1986 | Lin et al. |
| 4,701,606 A | | 10/1987 | Tanimoto et al. |
| 4,929,083 A | | 5/1990 | Brunner |
| 5,015,866 A | * | 5/1991 | Hayashi ............... 250/548 |
| 5,202,748 A | | 4/1993 | MacDonald et al. |
| 5,235,400 A | | 8/1993 | Terasawa et al. |
| 5,316,896 A | | 5/1994 | Fukuda et al. |
| 5,481,624 A | | 1/1996 | Kamon |
| 5,491,724 A | | 2/1996 | Altes |
| 5,594,328 A | | 1/1997 | Lukaszek |

(Continued)

FOREIGN PATENT DOCUMENTS

| | | |
|---|---|---|
| EP | 0 628 806 | 4/1994 |
| WO | WO 02/17030 | 2/2002 |
| WO | WO 00/59206 | 10/2002 |

OTHER PUBLICATIONS

"A New Mask Evaluation Tool, the Microlithography Simulation Microscope Aerial Image Measurement System", Budd, et al., SPIE vol. 2197, 1994, pp. 530–540.

(Continued)

*Primary Examiner*—Que T. Le
(74) *Attorney, Agent, or Firm*—Neil A. Steinberg

(57) ABSTRACT

In one aspect, the present invention is a technique of, and a system and sensor for measuring, inspecting, characterizing and/or evaluating optical lithographic equipment, methods, and/or materials used therewith, for example, photomasks. In one embodiment, the system, sensor and technique measures, collects and/or detects an aerial image (or portion thereof) produced or generated by the interaction between the photomask and lithographic equipment. An image sensor unit may measure, collect, sense and/or detect the aerial image in situ—that is, the aerial image at the wafer plane produced, in part, by a production-type photomask (i.e., a wafer having integrated circuits formed during the integrated circuit fabrication process) and/or by associated lithographic equipment used, or to be used, to manufacture of integrated circuits. A processing unit, coupled to the image sensor unit, may measure the critical dimensions of features of the photomask, using data which is representative of the intensity of light sampled by the image sensor unit, to control at least one operating parameter of the lithographic equipment.

53 Claims, 30 Drawing Sheets

U.S. PATENT DOCUMENTS

| | | |
|---|---|---|
| 5,597,868 A | 1/1997 | Kunz |
| 5,629,772 A | 5/1997 | Ausschnitt |
| 5,631,731 A | 5/1997 | Sogard |
| 5,638,211 A | 6/1997 | Shiraishi |
| 5,700,601 A | 12/1997 | Hasegawa et al. |
| 5,746,513 A | 5/1998 | Renken |
| 5,795,688 A | 8/1998 | Burdorf et al. |
| 5,828,455 A | 10/1998 | Smith et al. |
| 5,866,935 A | 2/1999 | Sogard |
| 5,888,675 A | 3/1999 | Moore et al. |
| 5,891,959 A | 4/1999 | Kunz |
| 5,898,479 A | 4/1999 | Hubbard et al. |
| 5,914,774 A | 6/1999 | Ota |
| 5,969,639 A | 10/1999 | Lauf et al. |
| 5,973,316 A | 10/1999 | Ebbesen et al. |
| 5,978,085 A | 11/1999 | Smith et al. |
| 6,002,740 A | 12/1999 | Cerrina et al. |
| 6,005,682 A | 12/1999 | Wu et al. |
| RE36,509 E | 1/2000 | Shigihara |
| 6,040,936 A | 3/2000 | Kim et al. |
| 6,052,238 A | 4/2000 | Ebbesen et al. |
| 6,236,033 B1 | 5/2001 | Ebbesen et al. |
| 6,240,219 B1 | 5/2001 | Gregory |
| 6,268,093 B1 | 7/2001 | Kenan et al. |
| 6,278,101 B1 | 8/2001 | Puyot |
| 6,285,020 B1 | 9/2001 | Kim et al. |
| 6,329,112 B1 | 12/2001 | Fukuda et al. |
| 6,335,220 B1 | 1/2002 | Shioyama et al. |
| 6,356,345 B1 | 3/2002 | McArthur et al. |
| 6,360,012 B1 | 3/2002 | Kreuzer |
| 6,362,907 B1 | 3/2002 | Stone et al. |
| 6,368,763 B1 | 4/2002 | Dirksen et al. |
| 6,451,490 B1 | 9/2002 | Advocate et al. |
| 6,459,823 B1 | 10/2002 | Altunbasak et al. |
| 6,515,272 B1 | 2/2003 | Fontaine et al. |
| 6,534,798 B1 | 3/2003 | Scherer et al. |
| 6,542,835 B1 | 4/2003 | Mundt |
| 2001/0055415 A1 | 12/2001 | Nozaki |
| 2002/0003216 A1 | 1/2002 | Kida et al. |
| 2002/0005947 A1 | 1/2002 | Golberg et al. |
| 2002/0036775 A1 | 3/2002 | Wolleschensky et al. |
| 2002/0041377 A1 | 4/2002 | Hagiwara et al. |
| 2002/0062206 A1 | 5/2002 | Liebchen |
| 2002/0067418 A1 | 6/2002 | Karpol et al. |
| 2002/0070355 A1 | 6/2002 | Ota |
| 2002/0105629 A1 | 8/2002 | Sandstrom et al. |
| 2002/0122187 A1 | 9/2002 | Bruce et al. |
| 2002/0134912 A1 | 9/2002 | Veneklasen et al. |
| 2002/0145717 A1 | 10/2002 | Baselmans et al. |
| 2002/0167651 A1 | 11/2002 | Boonman et al. |
| 2002/0172876 A1 | 11/2002 | Baselmans |
| 2002/0192598 A1 | 12/2002 | Hirayanagi |
| 2003/0001107 A1 | 1/2003 | Kroon et al. |
| 2003/0017805 A1 | 1/2003 | Yeung et al. |
| 2003/0027057 A1 | 2/2003 | Schroeder et al. |
| 2003/0027366 A1 | 2/2003 | Dulman et al. |
| 2003/0042433 A1 | 3/2003 | Kamijo |
| 2003/0047694 A1 | 3/2003 | Van Der Laan |

OTHER PUBLICATIONS

"Characterization of Lithographic System Performance Through Direct Aerial Measurements", C.H. Fields, SRC/SEMATECH, 1996 (96–MC–500).

"Aerial Image Measurements on a Commercial Stepper", Fields, et al., SPIE vol. 2197, 1994, pp. 585–595.

"A Novel High–Resolution Large–Field Scan–and–Repeat Projection Lithography System", K. Jain, SPIE vol. 1463 Optical/Laser Microlithography IV, 1991, pp. 666–677.

"Direct Aerial Image Measurements to Evaluate the Performance of an Extreme Ultraviolet Projection Lithography System", Fields, et al., J. Vac. Sci. Technol. B, vol. 14, No. 6, Microelectronics and Nanometer Structures, Nov./Dec. 1996, pp. 4000–4003.

"Direct Aerial Image Measurement as a Method of Testing High Numerical Aperture Microlithographic Lenses", Partlo et al., J. Vac. Sci. Technol. B, vol. 11, No. 6, Nov./Dec. 1993, pp. 2686–2691.

"In Situ Measurement of an Image During Lithographic Exposure", Brunner et al., IEEE Electron Device Letters, vol. EDL–6, No. 7, Jul. 1985, pp. 329–331.

"Improving Photomask Linewidth Measurement Accuracy via Emulated Stepper Aerial Image Measurement", J. Potzick, SPIE vol. 2322, Photomask Technology and Management, 1994, pp. 353–359.

"Pattern Shape Analysis Tool for Quantitative Estimate of Photomask and Process", Yonekura, et al., Proceedings of SPIE vol. 4409, Photomask and Next–Generation Lithography Mask Technology VIII, 2001, pp. 204–211.

"Meeting the Challenge of Advanced Lithography Reticle Inspection", Zurbrick et al., SPIE vol. 2322, Photomask Technology and Management, 1994, pp. 7–15.

"In Situ Resolution and Overlay Measurement on a Stepper", Brunner et al., SPIE vol. 565, Micron and Submicron Integrated Circuit Metrology, 1985, pp. 6–13.

"Application of the Aerial Image Measurement System (AIMS™) to the Analysis of Binary Mask Imaging and Resolution Enhancement Techniques", Martino et al., SPIE vol. 2197, 1994, pp. 573–584.

"Optical Limitations to Cell Size Reduction in IT–CCD Image Sensors", Satoh et al., IEEE, Transactions on Electron Devices, vol. 44, No. 10, Oct. 1997, pp. 1599–1603.

"Direct Aerial Image Monitoring for Extreme Ultraviolet Lithography Systems", C.H. Fields, Ph.D. Dissertation Thesis, University of California, Berkeley, Spring 1997.

"Extraordinary optical transmission through sub–wavelength hole arrays", Ebbesen et al., Nature, vol. 391, Feb. 1998, pp., 1994, pp. 667669.

"Control of Optical Transmission Through Metals Perforated with Subwavelength Hole Arrays", Kim et al., Optics Letters, vol. 24, No. 4, Feb. 1999, pp. 256–258.

"Image Monitor for Markle–Dyson Optics", Grenville et al., Journal of Vacuum Science Technology B, vol. 6, No. 11, Nov./Dec. 1993, pp. 2700–2704.

"A General Simulator for VLSI Lithography and Etching Processes: Part I—Application to Projection Lithography", Oldham et al., IEEE Transactions on Electron Devices, vol. ED–26, No. 4, Apr. 1979, pp. 717–722.

"High–Resolution Lithography with Projection Printing", H. Moritz, IEEE Transactions on Electron Devices, vol. ED–26, No. 4, Apr. 1979, pp. 705–710.

"Contrast Studies in High–Performance Projection Optics", Oldham et al., IEEE Transactions on Electron Devices, vol. ED–30, No. 11, Nov. 1983, pp. 1474–1479.

"High Resolution, Low–Voltage Probes from a Field Emmission Source Close to the Target Plane", McCord and Pease, Journal of Vacuum Science Technology B, vol. 1, No. 3, Jan./Feb. 1985, pp. 198–201.

"Near–Field Optics: Microscopy, Spectroscopy, and Surface Modification Beyond the Diffraction Limit", Betzig and Trautman, Science, vol. 257, Jul. 1992, pp. 189–195.

"Direct Aerial Image Measurement as a Method of Testing High Numerical Aperture Microlithographic Lenses", Partlo et al., Journal of Vacuum Science Technology B, vol. 6, No. 11, Nov./Dec. 1993, pp. 2686–2691.

"Moire Technique for Overlay Metrology", Brunner and Smith, SPIE Integrated Circuit Metrology II, vol. 480, 1984, pp 164–170.

"In Situ Resolution and Overlay Measurement on a Stepper", Brunner and Allen, SPIE Micron and Submicron Integrated Circuit Metrology, vol. 565, 1985, pp. 6–13.

"Growth of Low–Defect Density In 0.25Ga0.75As on GaAs by Molecular Beam Epitaxy", Pickrell et al., Journal of Vacuum Science Technology B, vol. 6, No. 18, Nov./Dec. 2000, pp. 2611–2614.

"Super–Resolved Surface Reconstruction From Multiple Images", Cheeseman et al., Technical Report FIA–94–12, NASA Ames Research Center, Dec. 1994.

"Monolithic Detector Array Comprised of>1000 Aerial Image Sensing Elements", Kunz et al., To be published in the SPIE Proceeding of the Microlithography, 2003.

"Initial Experiments on Direct Aerial Image Measurements in the Extreme Ultraviolet", Fields et al., Proc. OSA Trends in Optics and Photonics, Extreme Ultraviolet Lithography, Boston, MA, 1996.

"Autonomous On–Wafer Sensors for Process Modeling, Diagnosis, and Control", Freed et al., IEEE Transactions on Semiconductor Manufacturing, vol. 14, No. 3, Aug. 2001, pp. 255–264.

"Smart Dummy Wafers", Freed and Fisher, University of California, Berkeley, Presentation, May 1998.

"A Multi–Blanker for Parallel Electron Beam Lithography", G. Winograd, Ph.D. Dissertation, Stanford University, May, 2001.

"Wafer–Mounted Sensor Arrays for Plasma Etch Processes", M. Freed, Ph.D. Dissertation, University of California, Berkeley, Fall 2001.

Kodak KAI–1100M Kodak KAI–11000CM Image Sensor, Device Performance Specification, Revision 3.0, Jun. 2, 2003, 42 pages.

* cited by examiner

Dashed box represents the full field

Dashed box represents the full field

SYSTEM AND METHOD FOR LITHOGRAPHY PROCESS MONITORING AND CONTROL

CROSS-REFERENCE TO RELATED APPLICATIONS

This application is a divisional of application Ser. No. 10/390,806, filed Mar. 18, 2003, now U.S. Pat. No. 6,828,542.

This application claims priority to: (1) U.S. Provisional Application Ser. No. 60/386,408, entitled "Complete Optical Lithography Inspection and Process Control", filed Jun. 7, 2002; and (2) U.S. Provisional Application Ser. No. 60/432,725, entitled "Method and Apparatus for Aerial Imaging", filed Dec. 12, 2002. The contents of these provisional applications are incorporated by reference herein in their entirety.

BACKGROUND OF THE INVENTION

This invention relates to lithographic systems and techniques that are used in, for example, integrated circuit manufacturing; and more particularly, in one aspect, to measure, inspect, characterize and/or evaluate optical lithographic equipment, methods, and/or sub-systems related thereto (for example, the optical sub-systems and control systems of the equipment as well as photomasks used therewith).

In the fabrication of integrated circuit, lithography is employed to "print" circuit patterns on a wafer (e.g., silicon or GaAs semiconductor substrate). Currently, optical lithography is the predominant form of lithography used in volume integrated circuit manufacturing. Optical lithography typically employs visible or ultraviolet light to expose a given pattern (generally defined by the photomask) on the resist that is disposed on a wafer to be transferred into the substrate through resist development and subsequent process steps, for example, etching, deposition and implantation In optical lithography, the photomask (or mask), is first written using electron-beam or laser-beam direct-write tools. The mask contains certain patterns and features that are used to create desired circuit patterns on a wafer. The process of fabricating a complete integrated circuit typically requires the use of many masks.

In the field of integrated circuit manufacturing, a common lithographic tool used in projecting an image or pattern formed in a photomask onto a wafer is known as a "stepper" or "scanner". With reference to FIG. 1, lithographic equipment 10 (for example, a stepper) may include mirror 12, light source 14 to generate light 16 at, for example, an exposure wavelength $\lambda_o$. The lithographic equipment 10 may also include illumination optics 18, projection optics 20, and a chuck 22 upon which a wafer 24 is temporally secured, typically by way of electrostatic or vacuum forces, in a wafer plane. The mask 26 is positioned and optically aligned to project an image of the circuit pattern to be duplicated onto wafer 24. The lithographic equipment 10 may employ a variety of well known stepping, scanning or imaging techniques to produce or replicate the mask pattern on wafer 24.

In general, there are three stages at which the integrity of the lithography process is measured, characterized or inspected. First, the mask is inspected to determine whether the pattern on the mask accurately represents the desired mask design. Second, the optics of the stepper (for example, light source 14, illumination optics 18, and projection optics 20) are measured or characterized to confirm that they are within acceptable guidelines. Third, the pattern "printed" or formed on the wafer or die (discrete pieces of the wafer) is inspected and analyzed to determine or measure the quality of the fabrication process.

The photomasks are typically inspected first by the photomask fabricator before providing them to an integrated circuit manufacturer, and then periodically by the integrated circuit manufacturer, for example, during initial mask qualification and re-qualification. The fabricator and manufacturer tend to use standalone equipment, for example, tools made by KLA-Tencor (e.g., TeraStar series equipment) or Applied Materials (e.g., ARIS-100I equipment). This standalone equipment, among other things, assesses the accuracy or integrity of the photomask as well as its ability to produce an accurate representation of the circuit design onto the wafer or die, when used in conjunction with appropriate stepper optics and settings. While such inspection equipment may provide an accurate representation of the photomask, it tends to be quite expensive and hence its use tends to be minimized.

Moreover, such inspection equipment often employs optical imaging systems (or sub-systems) that are fundamentally different from that used by the stepper in "printing" the image on the wafer during mass production. For example, such standalone tools may include optical imaging systems that employ wavelengths that are different from optical imaging systems used in the mass production steppers. The response and/or characteristics of photomask may depend upon the wavelength of the light used to measure or detect the mask (via, for example, an aerial image). Indeed, a photomask may exhibit defects in the production stepper environment that may not be detectable in the standalone inspection tool because, for example, detection of certain contaminants depends on wavelength. That is, certain contaminants may present serious issues at the wavelength used during production but may be undetectable at the wavelength used during inspection.

The optics of the stepper are typically characterized by the manufacturer after the stepper is manufactured using grating and wavefront interference methods. The manufacturer may also employ scanning electron microscopy (SEM) techniques to measure the patterns printed, formed or projected on test wafers. In this regard, the manufacturer typically uses photomasks having specifically designed test patterns. In this way, a resist pattern developed on a test wafer may be measured using SEM techniques and compared to a known, predetermined, fixed or expected pattern.

Due primarily to complexity of the inspection techniques, the inspection procedure of the stepper tends to require or consume an extended period of time, often days to complete, and thus represents an expensive procedure for the integrated circuit manufacturer to carry out.

The integrated circuit manufacturer, however, may inspect and evaluate a stepper indirectly, using SEM inspection and analysis of the developed resist image. Here again, due to the extended test time, inspection of the stepper is not performed very often, and, as a result, there are few samples and/or data to form a reliable measure of the stepper.

Conventional techniques to evaluate the final printed circuit pattern on the wafer or die tend to require examining the pattern formed on the wafer using SEM techniques. In this regard, the characterization or verification of the accuracy and quality of the circuit pattern permits an indirect method of characterizing or verifying the mask and stepper (including optics), as well as the interactions between the mask and stepper. Because the final printed circuit pattern on the wafer or die is formed after the resist development and may be after substrate treatment (for example, material etching or deposition), it may be difficult to attribute, discriminate or isolate errors in the final printed circuit pattern to problems associated with the photomask, the stepper, or the resist deposition and/or the developing processes. Moreover, as with inspection of the optics of the stepper, inspecting the final printed circuit pattern on the wafer or die using an SEM tends to offer a limited number of samples upon which to detect, determine, and resolve any processing issues. This process may be labor intensive and presents an extensive inspection and analysis time.

Thus, there is a need for a system and technique to overcome the shortcomings of one, some or all of the conventional systems and techniques. In this regard, there is a need for an improved system and technique to inspect and characterize optical lithographic equipment, including the optical sub-systems, control systems and photomasks, that are used in, for example, integrated circuit manufacturing.

In addition, there is a need for a system and technique of photomask inspection and characterization of in-situ or in a mass production/fabrication environment. In this regard, there is a need for a system and technique to measure, sense, inspect, detect, capture and/or evaluate the aerial image of a photomask in situ—that is, in the mass production environment using the lithographic production equipment of that environment. In this way, the errors may be isolated and attributed to a given aspect of the process or system. Indeed, the causes of errors in a final printed circuit pattern may be isolated, characterized and/or measured (in, for example, the photomask, stepper, and/or resist developing process) so that appropriate corrective measures may be determined efficiently, rapidly and in a cost-effective manner. Thus, there is a need for a system and technique that permits errors in the lithographic fabrication process to be attributed or isolated to certain methods or equipment (for example, the photomask or optical sub-system) in order to facilitate appropriate and/or efficient correction of such errors in the final printed circuit pattern and thereby enhance or improve the quality, yield and cost of integrated circuits.

Further, there is a need for an improved lithographic image evaluation technique and system that overcomes one, some or all of the conventional systems and techniques. In this regard, there is a need for a system and technique to more thoroughly, quickly and/or more often evaluate and calibrate lithographic imaging systems, for example, steppers, in an efficient and cost-effective manner. In this way, the quality, yield and cost of integrated circuits may be improved.

SUMMARY OF THE INVENTION

There are many inventions described herein. In a first principal aspect, the present invention is an image sensor unit, for use with a highly precise moveable platform. The image sensor unit of this aspect of the invention includes a substrate having a wafer-shaped profile or form factor that may allow automated handling of image sensor unit in the same manner as a product-type wafer. The image sensor unit further includes a sensor array (for example, charge coupled, CMOS or photodiode devices) disposed on the substrate.

The sensor array includes a plurality of sensor cells wherein each sensor cell includes an active area to sense light of a predetermined wavelength that is incident thereon. The sensor array also includes a film, disposed over the active areas of sensor cells and comprised of a material that impedes passage of light of the predetermined wavelength. The film includes a plurality of apertures that are arranged such that at least one aperture overlies an active area of a corresponding sensor cell to expose a portion of the active area and wherein light of the predetermined wavelength is capable of being sensed by the portion of the active area that is exposed by the corresponding aperture.

In one embodiment of this aspect of the invention, the image sensor unit may include a transparent medium, having a predetermined refractive index, disposed on the sensor array. In another embodiment, the image sensor unit may include photon-conversion material disposed over and/or within the sensor array. The photo-conversion material may be disposed between the film and the plurality of sensors.

In another embodiment, the image sensor unit may include communications circuitry disposed on the substrate. The communications circuitry may employ wired, wireless and/or optical techniques. In one embodiment, the communications circuitry outputs data from the sensor array, using wired and/or wireless techniques, during collection of image data by the sensor array.

In another embodiment, the image sensor unit may include at least one battery, disposed on the wafer-shaped substrate or within a cavity in the wafer-shaped substrate. The battery may be rechargeable and may provide electrical power to the sensor array and/or the communications circuitry.

In another embodiment, the image sensor unit may also include data storage circuitry and data compression circuitry. In this embodiment, the data storage circuitry is coupled to the sensor array to receive and store the data from the sensor array. The data compression circuitry is coupled to the data storage circuitry to compress the data.

In another principal aspect, the present invention is an image sensor unit, for use with a highly precise moveable platform, which includes a wafer-shaped substrate and a sensor array, integrated into the substrate. The sensor array includes a plurality of sensor cells (for example, charge coupled devices, CMOS devices or photodiodes) wherein each sensor cell includes an active area to sense light of a predetermined wavelength that is incident thereon. The sensor array also includes a film, disposed over the plurality of active areas of the sensor cells and comprised of a material that impedes passage of light of the predetermined wavelength. The film includes a plurality of apertures that are arranged such that an aperture of the plurality of apertures overlies an active area of a corresponding sensor cell to expose a portion of the active area. In this way, light of the predetermined wavelength is capable of being sensed by the portion of the active area that is exposed by the corresponding aperture.

In one embodiment of this aspect of the present invention, the image sensor unit may include communications circuitry disposed on the substrate. The communications circuitry may employ wired, wireless and/or optical techniques. In one embodiment, the communications circuitry outputs data from the sensor array, using wireless techniques, during collection of image data by the sensor array.

In another embodiment, the image sensor unit may include at least one battery, disposed on the wafer-shaped substrate or within a cavity in the wafer-shaped substrate. The battery may be rechargeable.

In yet another embodiment, the image sensor unit may also include data storage circuitry and data compression circuitry. In this embodiment, the data storage circuitry is coupled to the sensor array to receive and store the data from the sensor array. The data compression circuitry is coupled to the data storage circuitry to compress the data.

The image sensor unit may include photon-conversion material disposed over and/or within the sensor array. In another embodiment, the photo-conversion material is disposed between the film and the plurality of sensors.

In yet another principal aspect, the present invention is a system to collect image data which is representative of an aerial image of a mask (for example, a product-type or test mask) that is projected on a wafer plane. The system includes an optical system to produce the image of the mask on the wafer plane, a moveable platform and an image sensor unit, disposed on the moveable platform, to collect image data which is representative of the aerial image of the mask.

The image sensor unit includes a wafer-shaped substrate and a sensor array. The sensor array is disposed on or in the wafer-shaped substrate, such that when position on the moveable platform, the sensor array is disposed in the wafer plane.

The sensor array includes a plurality of sensor cells wherein each sensor cell includes an active area to sense light of a predetermined wavelength that is incident thereon. The sensor array further includes a film, disposed over the active areas of the sensor cells. The film is comprised of a material that impedes passage of light of the predetermined wavelength and includes a plurality of apertures which are arranged such that an aperture of the plurality of apertures overlies a corresponding active area of a corresponding sensor cell to expose a portion of the active area. In this way, the light of the predetermined wavelength is capable of being sensed by the portion of the active area that is exposed by the corresponding aperture.

In one embodiment of this aspect of the present invention, the image sensor unit may include communications circuitry disposed on the substrate. The communications circuitry may employ wired, wireless and/or optical techniques. In one embodiment, the communications circuitry outputs data from the sensor array, using wired and/or wireless techniques, during collection of image data by the sensor array.

In another embodiment, the image sensor unit may include a data processing unit and/or at least one battery (for example, a rechargeable-type), disposed on, or within a cavity in, the wafer-shaped substrate, to provide electrical power to the sensor array and/or the communications circuitry. The data processing unit may be configured to receive the image data which is representative of the aerial image.

In one embodiment, the moveable platform may move in first and second directions to a plurality of discrete locations wherein at each discrete location, the sensor cells sample the light incident on the exposed portion of the active area. The data processing unit may use the data to generate the aerial image.

The distance between the plurality of discrete locations in the first direction may be less than or equal to the width of the apertures. Further, the distance between the plurality of discrete locations in the second direction may be less than or equal to the width of the apertures. In one embodiment, the processing unit interleaves the image data to generate the aerial image.

In one embodiment, the image sensor unit collects data which is representative of the aerial image in a raster-type manner. In another embodiment, the image sensor unit collects image data which is representative of the aerial image in a vector-type manner.

In another aspect, the present invention is an image sensor unit that may be employed to collect image data which is representative of an aerial image of a mask (for example, a product-type mask) that is projected on a wafer plane by a lithographic unit. The image sensor unit of this aspect of the invention includes a sensor array which is disposed in the moveable platform of the lithographic unit and capable of being located in the wafer plane. The sensor array (for example, a charge coupled, CMOS or photodiode device) includes a plurality of sensor cells wherein each sensor cell includes an active area to sense light of a predetermined wavelength that is incident thereon. The sensor array also includes a film, disposed over the active areas of the plurality of sensor cells and comprised of a material that impedes passage of light of the predetermined wavelength. The film includes a plurality of apertures which are arranged such that an aperture of the plurality of apertures overlies a corresponding active area of a corresponding sensor cell to expose a portion of the active area so that light of the predetermined wavelength is capable of being sensed by the portion of the active area that is exposed by the corresponding aperture.

In one embodiment, the sensor array is capable of being moved between a plurality of discrete locations in first and second directions while disposed on the moveable platform. The sensor cells sample the light incident on the exposed portion of the active area at each discrete location. The distance between the plurality of discrete locations in the first direction may be less than or equal to the width of the apertures. Further, the distance between the plurality of discrete locations in the second direction may be less than or equal to the width of the apertures. In one embodiment, the processing unit interleaves the image data to generate the aerial image.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

Figure 1:
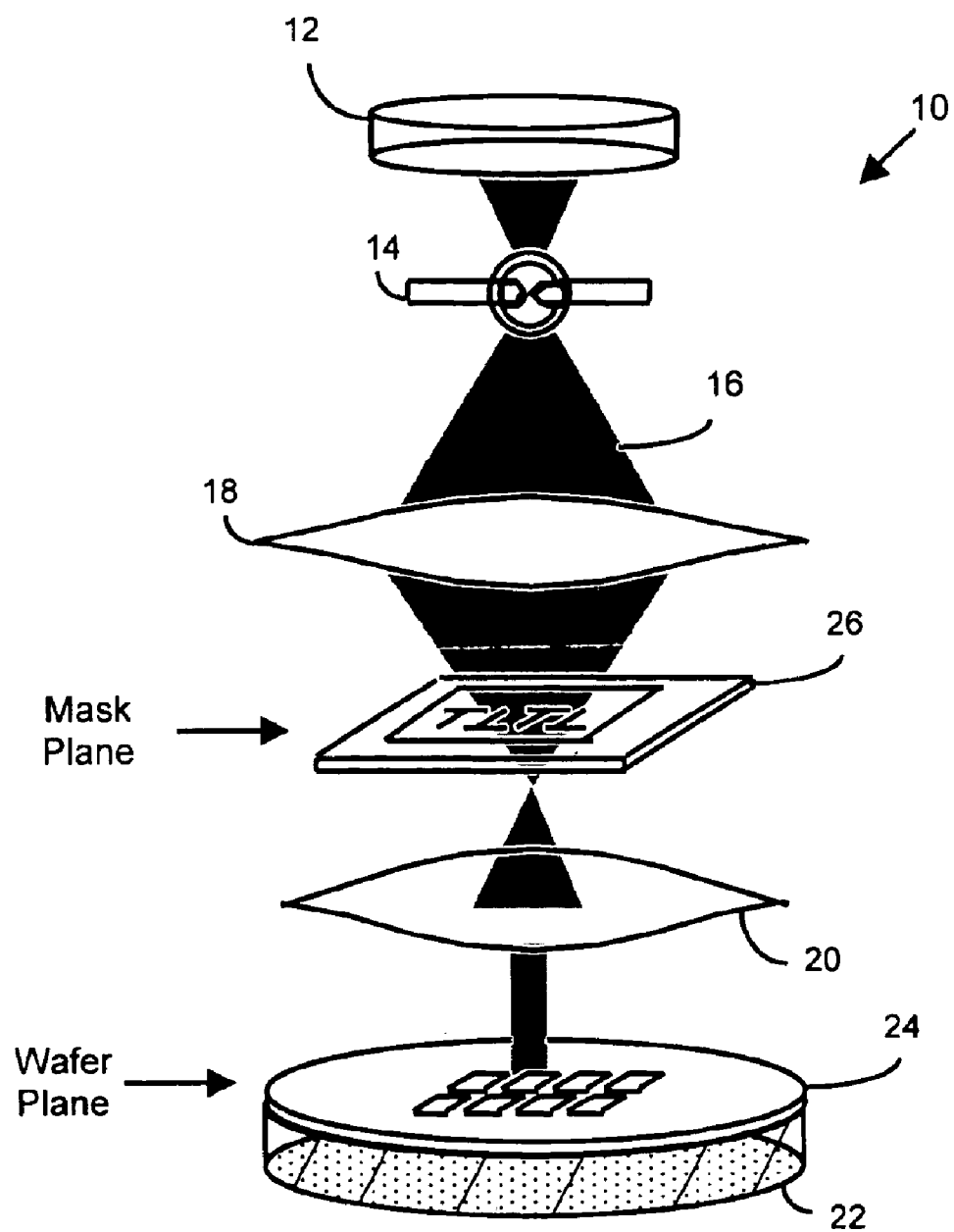
FIG. 1 is a block diagram representation of a conventional optical stepper used in the fabrication process of an integrated circuit.

There are many inventions described herein. In one aspect, the present invention is directed to a technique of, and system for measuring, inspecting, characterizing and/or evaluating optical lithographic equipment, methods, and/or materials used therewith, for example, photomasks. In this regard, the present invention is a system, sensor and technique to sample, measure, collect and/or detect an aerial image produced or generated by the interaction between the photomask and lithographic equipment. An image sensor unit may be employed to sample, measure, collect and/or detect the aerial image of a product-type photomask (i.e., a photomask that is used in the production of integrated circuits on product wafers) in situ—that is, the aerial image at the wafer plane produced by the interaction between the photomask and the lithographic equipment that are used (or to be used) during manufacture of integrated circuits. In this way, the aerial image used, generated or produced to measure, inspect, characterize and/or evaluate the photomask is the same aerial image used, generated or produced during wafer exposure in integrated circuit manufacturing.

In another aspect, the present invention is a technique of, and system and sensor for measuring, inspecting, characterizing, sensing and/or evaluating the performance of the optical lithographic equipment, for example, the optical sub-system of such equipment. In this regard, in one embodiment, an image sensor unit measures, collects, senses, and/or detects the aerial image produced or generated by the interaction between lithographic equipment and a photomask having a known, predetermined or fixed pattern (i.e., test mask). The sensor unit senses, collects and/or detects the aerial image produced or generated by the test mask—lithographic equipment in order to measure, inspect, and/or characterize the performance of the optical sub-system of the lithographic equipment.

In another aspect, the present invention is a technique of, and imaging system and sensor for generating or producing the same or substantially the same aerial image (or producing, sampling, collecting and/or detecting information relating to), with the same or substantially the same spatial resolution, as certain lithographic equipment (for example a particular stepper system having a given set of parameters, features or attributes). Here, the imaging system emulates that lithographic equipment. As such, the imaging system includes a precision mechanical movement stage having the same or substantially the same mechanical precision and controllability as lithographic equipment. The imaging system may be employed as a standalone aerial image monitoring tool that may be used in the reviewing of the aerial image of a mask under the predetermined optic sub-system.

This "standalone tool" may be designed and fabricated to have one or more of the following parameters that is/are the same or substantially the same as one or more of the following features or parameters of the lithographic equipment: (1) wavelength of light; (2) characteristics of light source (e.g., excimer laser); (3) illumination system including partial coherence; and (4) numerical aperture (NA). In this way, the differences in the aerial image collected, sampled, produced, and/or measured using the imaging system and the sensor, in relation to the lithographic equipment, may be minimized and/or reduced. Moreover, the standalone tool of this aspect of the invention may be a "mini-stepper" (which has a much smaller field than a production stepper, but otherwise substantially the same imaging properties).

In certain embodiments of the invention, the image sensor unit may be disposed on, or integrated in a wafer-shaped platform or substrate. The sensor of this embodiment includes a profile (for example, height and shape, and flatness of the sensing cells of the sensor) that facilitates implementation in lithographic equipment much like a product-type wafer and maintains a stage position along the optical axis similar to, or substantially similar to, that of a product wafer. In this regard, the wafer-shaped sensor may be secured to the chuck and reside in the wafer plane in a manner similar to a product-type wafer. Moreover, the wafer-shaped platform may permit automated handling by a robotic loader of the lithographic equipment. In addition, electrical power may be supplied to the image sensor unit by a battery (rechargeable or otherwise) and/or the lithographic equipment; and data/command transmission may be accomplished using wired, wireless and/or optical techniques.

In other embodiments, the image sensor unit may be disposed in, or integral with a subsystem, for instance, the wafer chuck of the lithographic equipment. In this way, the image sensor unit need not be loaded into the lithographic equipment but may be positioned in the wafer plane during inspection, characterization and/or evaluation of a photomask and/or the optical system of the lithographic equipment. The electrical power may be provided to the image sensor unit from the lithographic equipment. Moreover, the image sensor unit may receive/provide data and commands using wired, wireless, or optical communications.

Thus, in one aspect, the present invention measures, inspects, characterizes and/or evaluates photomasks directly, and in the actual production environment in which the photomasks are used during the manufacture of integrated circuits (i.e., employing the same or substantially the same lithographic equipment used during integrated circuit fabrication or production). In another aspect, the present invention measures, inspects, characterizes and/or evaluates the optical system of lithographic equipment using a photomask having a known, predetermined or fixed pattern.

In another aspect, the present invention is an image sensor that includes an array of sensor cells wherein each sensor cell includes an enhanced, limited or restricted spatial resolution. In this regard, each sensor cell has "effective" active or photon sensitive area that is less than or substantially less (i.e., greater than 50%) than the active or photon sensitive area of the sensor cell. The image sensor unit of this aspect of the present invention may be employed on or in a highly precise spatial positioning and/or moveable platform, for example the stage of a stepper. In this way, the image sensor may measure, detect, sense, collect and/or sample an aerial image projected or incident thereon. The data measured, detected, sensed, collected and/or sampled by all sensor cells may be combined to construct the aerial image, or to deduce relevant information directly without constructing the aerial image. The data may also be measured, detected, sensed, collected and/or sampled using vectoring (absolute coordinates) techniques or vector scanning techniques.

Figure 2:
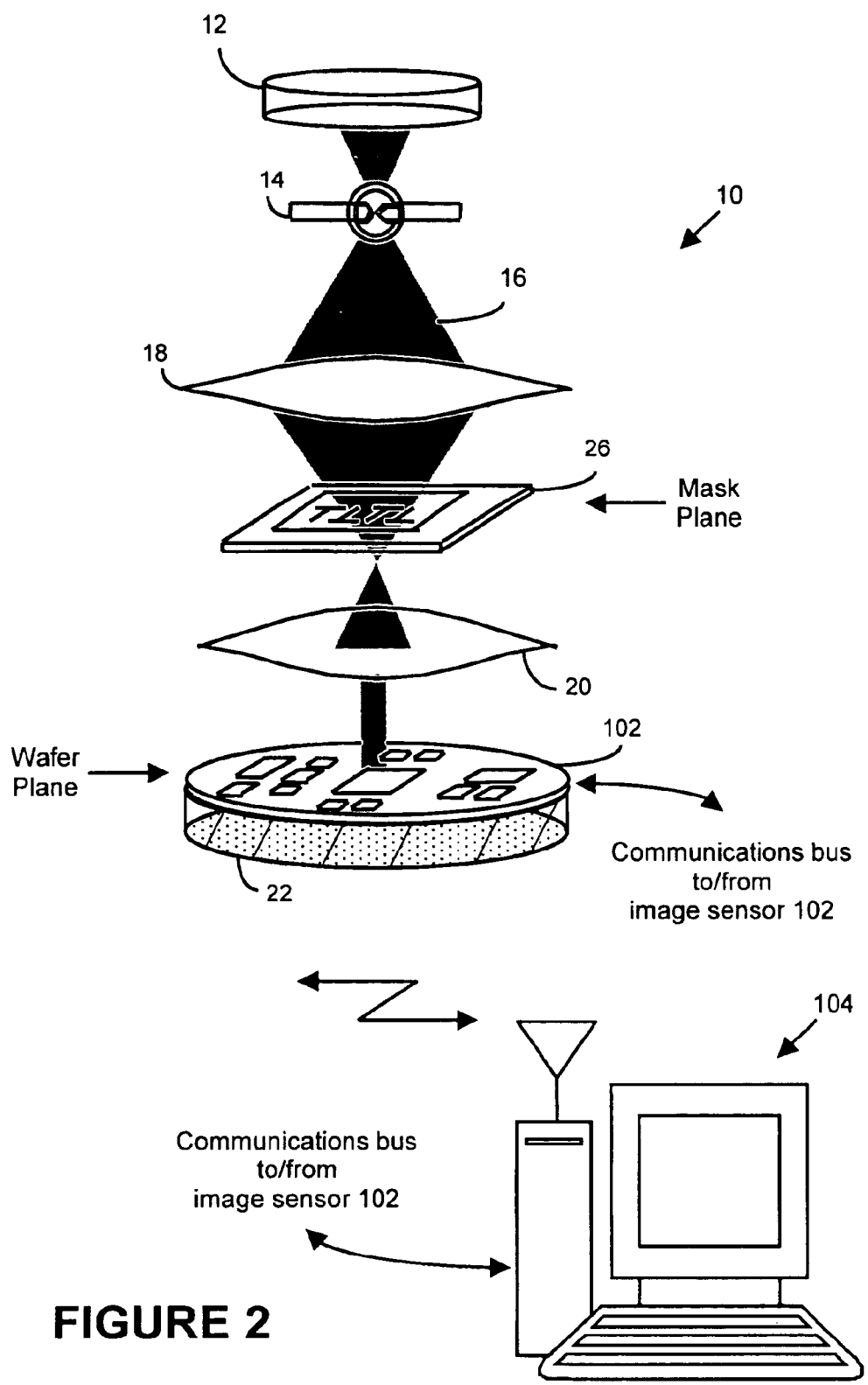
FIG. 2 is a block diagram representation of a system according to at least one embodiment of the present invention.

With reference to FIG. 2, in one embodiment, aerial image sensing system 100 of the present invention includes lithographic equipment 10 (for example, a stepper), image sensor unit 102, and processor/controller 104, for example, a computer and/or data or image processing unit. The lithographic equipment 10 is similar to that described above with respect to FIG. 1. That is, lithographic equipment 10 may include mirror 12, light source 14 to generate light 16 at, for example, an exposure wavelength $\lambda_o$, illumination optics 18, projection optics 20, and a chuck 22. The chuck 22 secures sensor unit 102 in a fixed location, using, for example, electrostatic or vacuum forces.

The optics of lithographic equipment 10 (for example, light source 14, illumination optics 18, and projection optics 20) interacts with mask 26 to project an aerial image onto image sensor unit 102. In one embodiment, photomask 26 may be a product-type mask; that is, a photomask used to form circuits during integrated circuit fabrication. As such, photomask 26, in one embodiment, contains the pattern to be replicated or printed on a wafer that ultimately contains the circuit design (or a portion thereof of the integrated circuit. In this embodiment, image sensor unit 102 may be employed to evaluate the interaction between photomask 26 and lithographic equipment 10 (whether production or non-production equipment) as well as characterize the performance of lithographic equipment 10.

In another embodiment, mask 26 may be a test mask that is used to inspect, characterize and/or evaluate the optical characteristics or response of lithographic equipment 10. In this regard, mask 26 may include a fixed, predetermined and/or known pattern against which the aerial image collected, sensed, sampled, measured and/or detected by image sensor unit 102 will be evaluated, measured, and/or compared. In this way, any errors or discrepancies in the aerial images may be isolated or attributed to the optical system of lithographic equipment 10 and the performance of that system may be evaluated or characterized.

With continued reference to FIG. 2, image sensor unit 102 collects, measures, senses and/or detects the aerial image produced or generated by lithographic equipment 10 in conjunction with photomask 26. The image sensor unit 102 provides image data, which is representative of the aerial image, to processor/controller 104. The processor/controller 104, in response, evaluates and/or analyzes that data to inspect, characterize and/or evaluate photomask 26 and/or lithographic equipment 10 (or sub-systems thereof, for example, the optical sub-system). In this regard, processor/controller implements data processing and analysis algorithms to process the data from image sensor unit 102 to reconstruct a full or partial aerial image, or to extract desired information directly without reconstructing a full or partial aerial image. Such image processing may involve deconvolution or other techniques familiar to those skilled in the art.

In addition, processor/controller 104 may use the data from sensor unit 102, to perform and evaluate critical dimension measurements, and/or conduct defect inspection, for example, by comparing the measured aerial image to pattern design database, or do die-to-die inspection if there are multiple dice on the same mask. The processor/controller 104 may also implement algorithms that conduct or perform resist modeling and/or integrated circuit yield analyses.

The processor/controller 104 may be employed as a control or operator console and data/image processing device. The processor/controller 104 may store algorithms and software that process the data representative of the aerial image (received from image sensor unit 102), extract information, manage data storage, and/or interface with users/operators. The processor/controller 104 may be located near or next to lithographic equipment 10 or in another locale, which is remote from lithographic equipment 10.

The processor/controller 104 may also provide and/or apply appropriate corrective measures to lithographic equipment 10 in order to enhance or improve the performance or operation of lithographic equipment 10 and/or enhance or improve the interaction between mask 26 and lithographic equipment 10. In this way, the quality, yield and cost of integrated circuits fabricated using lithographic equipment 10 and/or mask 26 may be improved or enhanced.

It should be noted that processor/controller 104 may be a stand-alone unit, as illustrated in FIG. 2, or partially or wholly integrated in lithographic equipment 10. In this regard, suitable circuitry in lithographic equipment 10 may perform, execute and/or accomplish the functions and/or operations of processor/controller 104 (for example, evaluation and/or analysis of the data representative of the aerial image collected, measured, sensed and/or detected at the wafer plane). Thus, in one embodiment, the inspection, characterization and/or evaluation circuitry/electronics may be partially or wholly integrated into lithographic equipment 10 and, as such, this "integrated system" may determine, assess, apply and/or implement appropriate corrective measures to enhance or improve its operation and thereby improve or enhance the quality, yield and cost of integrated circuits manufactured therein.

It should be further noted that processor/controller 104 may also be partially or wholly integrated in, or on, image sensor unit 102. In this regard, some or all of the functions and operations to be performed by processor/controller 104 may be performed, executed and/or accomplished by suitable circuitry in, or on image sensor unit 102. As such, the collection and analysis of data representative of the aerial image may be less cumbersome in that a bus may be integrated and/or fabricated on or within image sensor unit 102 to facilitate communication of data and commands to/from the circuitry used to measure, detect and/or sense the aerial image and the circuitry used to evaluate and/or analyze the data representative of the aerial image.

It should be noted that, in at least one embodiment, processor/controller 104 may interact with multiple sensor units 102 and/or multiple lithographic equipment 10.

Figure 3A:
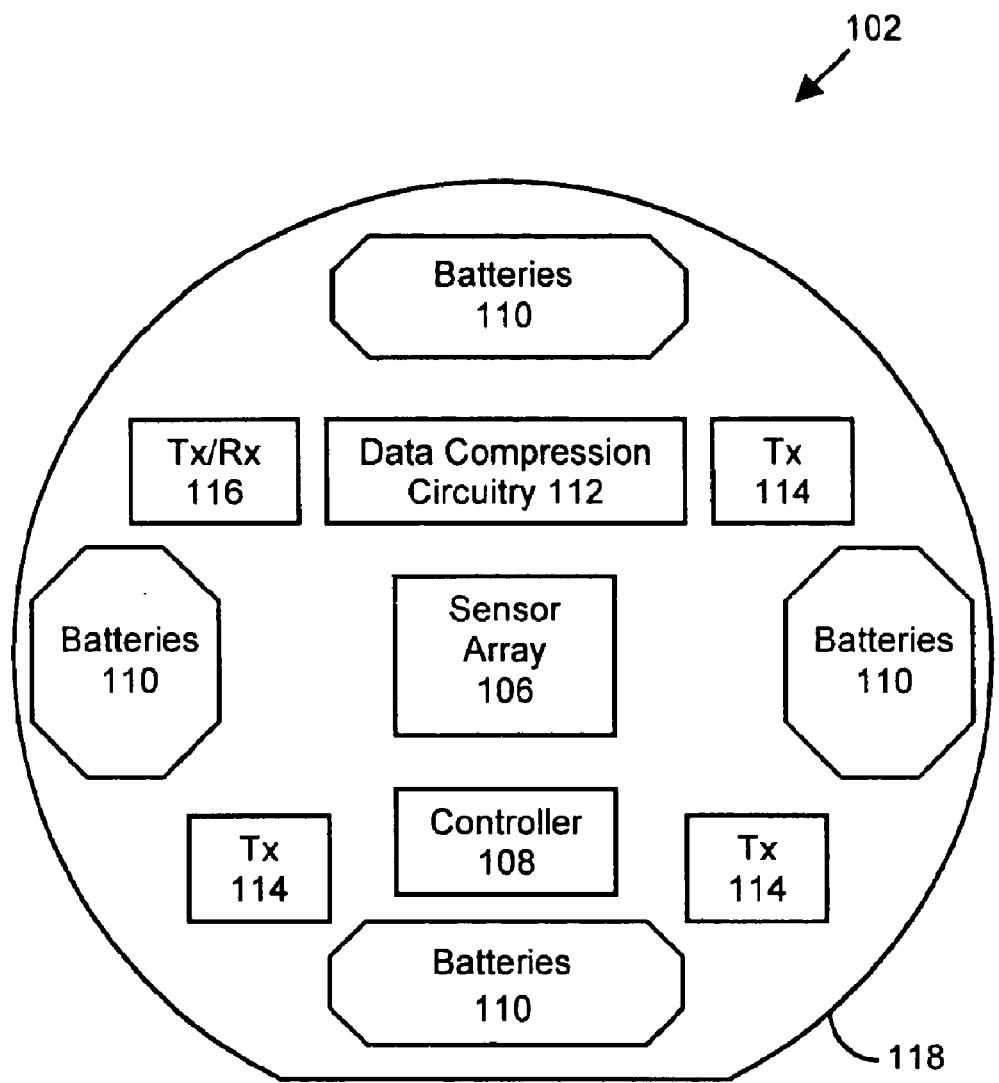
FIGS. 3A–C are block diagram representations of a wafer-shaped image sensor unit, according to certain embodiments of the present invention.

With reference to FIG. 3A, in one embodiment, image sensor unit 102 includes sensor array 106, controller 108, batteries 110, data compression circuitry 112, transmitter circuitry 114, and transmitter/receiver circuitry 116. The image sensor unit 102 may be formed in or on substrate 118. The substrate 118, and, in particular, image sensor 102, may include a size and shape that facilitates image sensor 102 being accepted by, or installed or mounted on chuck 22 of lithographic equipment 10 in a manner that is similar to that of a product wafer. As such, image sensor unit 102, and in particular sensor array 106, may reside in the wafer plane so the aerial image measured, collected, sensed or detected is the same (or substantially the same) as the aerial image projected on a product wafer by the interaction of mask 26 and lithographic equipment 10.

Moreover, the wafer-shaped size and shape of image sensor unit 102 may permit normal and/or typical operation of lithographic equipment 10. In those instances where lithographic equipment 10 includes automated loading of wafers, the wafer-shaped profile or form factor of image sensor 102 may allow automated handling of image sensor unit 102 in the same manner as a product-type wafer. Indeed, in a preferred embodiment, the wafer-shaped size and shape of image sensor 102 includes a physical form factor that permits the wafer handling apparatus (whether automated or partially or fully manual) of lithographic equipment 10 to manipulate the image sensor 102 without significant modifications to the wafer handling apparatus. In this way, the "down-time" of lithographic equipment 10, due to inspection and/or characterization of the interaction between mask 26 and lithographic equipment 10, may be minimized.

Figure 4:
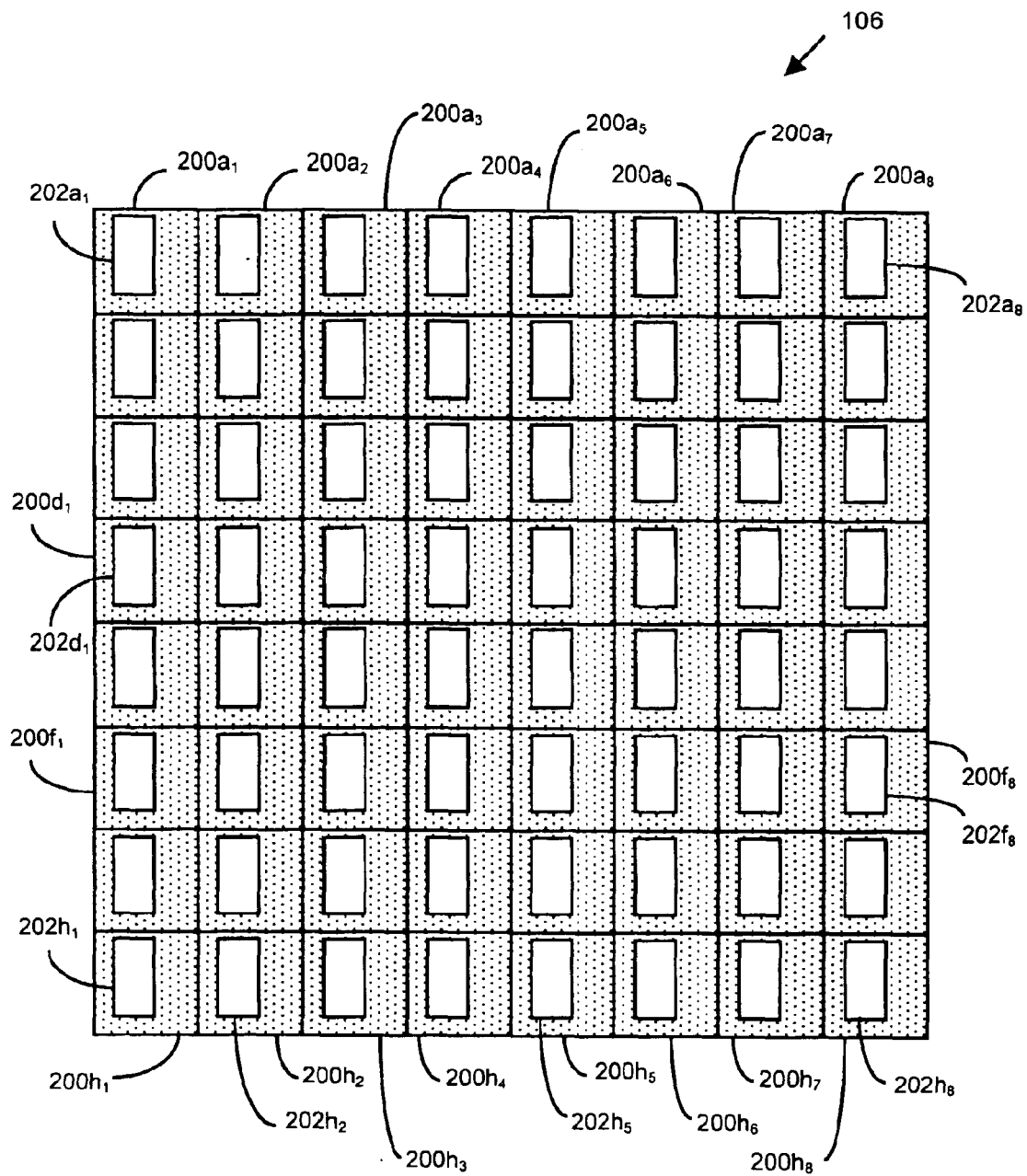
FIG. 4 is a block diagram representation of a sensor array according to one embodiment of the present invention.

The sensor array 106 may be a plurality of photo or photon sensitive detectors or sensor cells that measure, sense, detect and/or collect incident energy or radiation, for example, incident visible or ultraviolet light (for example, deep ultraviolet light). With reference to FIG. 4, in one embodiment, sensor array 106 includes a plurality of sensor cells $200a_1$–$200a_8$, $200b_1$–$200b_8$, $200c_1$–$200c_8$, $200d_1$ to $200d_8$, $200e_1$–$200e_8$, $200f_1$–$200f_8$, $200g_1$–$200g_8$, and $200h_1$–$200h_8$, arranged or configured in a two dimensional array. The sensor cells $200a_x$–$200h_x$ (x=1 to 8) of sensor array 106 may be comprised of light or radiation sensing semiconductor devices, for example, charge coupled devices (CCDs), CMOS sensor cells and/or photo diodes.

With continued reference to FIG. 4, sensor cells $200a_x$–$200h_x$ (x=1 to 8) include active area $202a_x$–$202h_x$ (x=1 to 8), respectively. The active area $202a_x$–$202h_x$ is that portion or area of sensor cells $200a_x$–$200h_x$ (x=1 to 8), respectively, which is sensitive to the energy or radiation incident thereon. The dimensions of active areas $202a_x$–$202h_x$ (x=1 to 8) may impact the spatial resolution of the aerial image.

Figure 5:
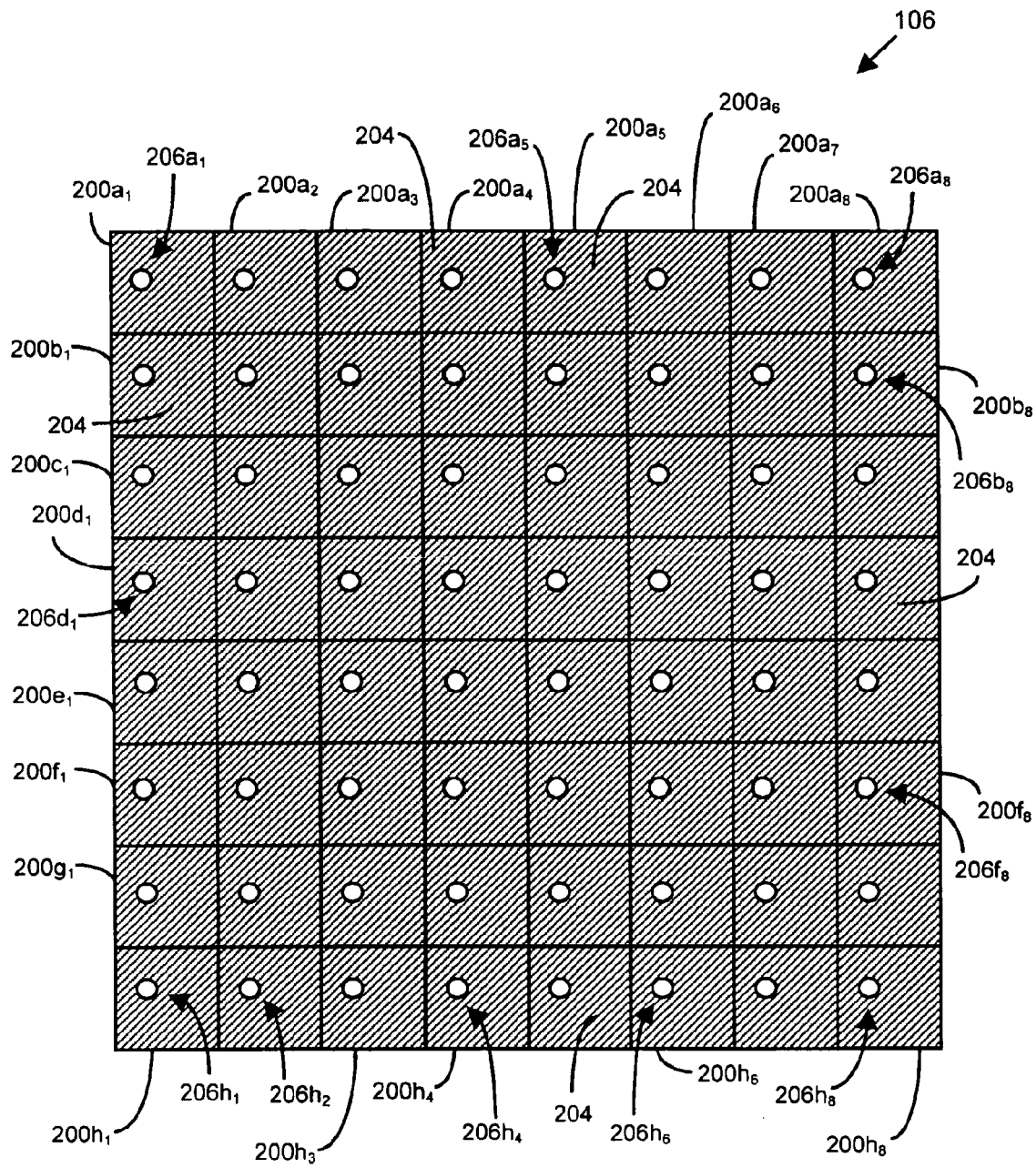
FIG. 5 is a two-dimensional (top view) schematic representation of the sensor array, in conjunction with a selectively patterned, shaped and/or etched opaque film, according to one embodiment of the present invention.
Figure 6A:
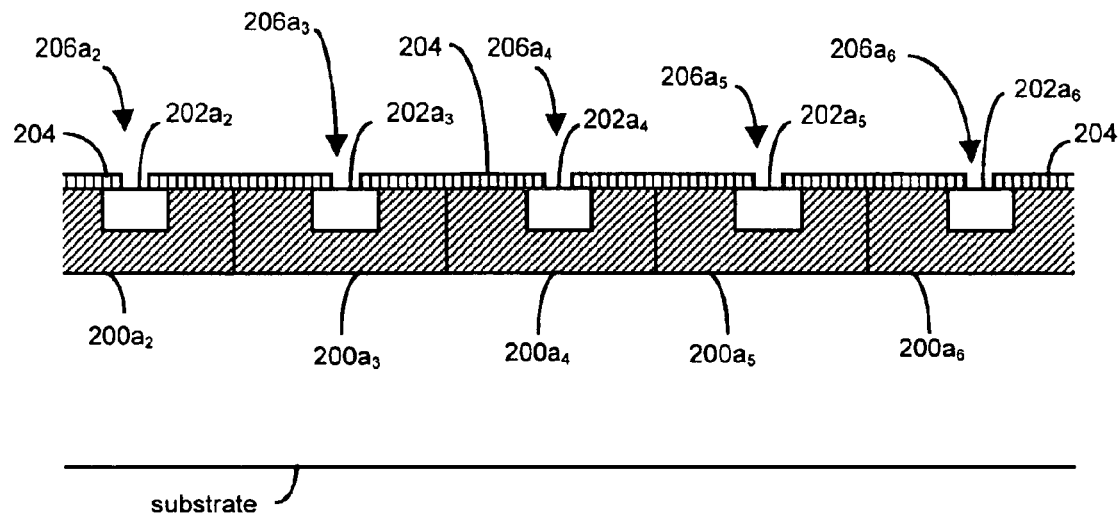
FIGS. 6A and 6B are cross-sectional views of the sensor array, in conjunction with a selectively patterned, shaped and/or etched opaque film, according to certain embodiments of FIG. 5.

In those instances where the dimensions of active areas $202a_x$–$202h_x$ (x=1 to 8) are too large to provide a desired or required spatial resolution, it may be necessary to limit, restrict and/or reduce the photo-sensitive area of sensor cells $200a_x$–$200h_x$ (x=1 to 8). With reference to FIGS. 5 and 6, sensor array 106, in one embodiment, may include a patterned opaque film 204 that impedes, obstructs, absorbs and/or blocks passage of photons or light of a given wavelength (that is, at the wavelength to be measured, sensed or detected by sensor cells $200a_x$–$200h_x$, x=1 to 8).

The opaque film 204 includes apertures $206a_x$–$206h_x$ (x=1 to 8). The apertures $206a_x$–$206h_x$ (x=1 to 8) are configured or arranged to overlie a respective one of active area $202a_x$–$202h_x$ (x=1 to 8). In this way, opaque film 204 overlies sensor cells $200a_x$–$200h_x$ (x=1 to 8) to partially cover active areas $202a_x$–$202h_x$ (x=1 to 8) and thereby limit the photo-sensitive area of active area $202a_x$–$202h_x$ (x=1 to 8) to the portion(s) effectively exposed by apertures $206a_x$–$206h_x$ (x=1 to 8). The portion of active area $202a_x$–$202h_x$ (x=1 to 8) that is covered by film 204 does not measure, sense, detect and/or collect incident energy or radiation or is substantially unaffected by such energy or radiation. As such, the spatial resolution of the energy measured by sensor cells $200a_x$–$200h_x$ (x=1 to 8) is enhanced or improved because the portion or area of the sensor cell that is effectively exposed to, and/or measures, senses, detects and/or collects energy or radiation is limited or restricted.

In certain embodiments, it may be advantageous to selectively pattern opaque film 204 to include apertures $206a_x$–$206h_x$ (x=1 to 8) that are located or positioned in, or near, the center of active areas $202a_x$–$202h_x$ (x=1 to 8). In this way, a significant number of photons that enter apertures $206a_x$–$206h_x$ (x=1 to 8) may be collected, measured, sensed and/or detected by the underlying active areas $202a_x$–$202h_x$ (x=1 to 8), respectively, regardless of scattering caused or induced by apertures $206a_x$–$206h_x$ (x=1 to 8). In addition, locating or positioning apertures $206a_x$–$206h_x$ (x=1 to 8) at or near the center of active areas $202a_x$–$202h_x$ (x=1 to 8) may ease alignment constraints during fabrication of opaque film 204 and apertures $206a_x$–$206h_x$ (x=1 to 8).

The opaque film 204 may be any material that may be deposited, grown and/or formed on or in sensor cells 200, and patterned, shaped and/or etched such that active areas 202 receive, measure, collect photons from a smaller, limited and/or restricted area or region (substantially or proportionally equal to the area of apertures 206 relative to the entire active area). The opaque film 204 may be a metal or other material (for example, ploy-silicon or amorphous-silicon) that effectively blocks the light/radiation at the wavelength of concern. For example, opaque film 204 may be a film, such as tungsten, silicon, platinum, aluminum, chromium, copper, gold, silver, or an oxide (for example, $Ta_2O_5$, tantalum-pentoxide) of a sufficient thickness to alter, modify, impede, obstruct, absorbs and/or block photons or light (of at least a given wavelength) from being measured, sensed and/or detected by that portion of active area 202. In one embodiment, opaque film 204 may be tungsten of a thickness in the range of 100 nm. Indeed, any material that (wholly, substantially or effectively) alter or modifies photons or light (of at least a given wavelength) from being measured, sensed and/or detected by a certain portion of active areas 202, and/or any material that impedes, obstructs, absorbs and/or blocks passage of the wavelength of the photons to be measured, sensed or detected by sensor cells 200, whether now known or later developed, is intended to be within the scope of the present invention.

The opaque film 204 should be of sufficient thickness to wholly, partially or effectively impede, obstruct, absorb and/or block passage of the wavelength of the photons to be measured, sensed or detected by sensor cells 200. In certain embodiments, the thicker film 204, the more effective film 204 may be in impeding, obstructing, absorbing and/or blocking passage of at least the wavelength of interest. However, in certain instances, a thicker film may present more difficulties in forming apertures 206 in film 204.

Moreover, a thicker film 204 may also present a higher aspect ratio (i.e., the ratio between aperture wall height and aperture diameter). A higher aspect ratio may allow less light impinging upon sensor cells 200 to pass through apertures 206 as well as cause an aperture "response" function that is more complex than a summation of the photon energy impinging on the inlet of aperture 206. In this regard, a higher aspect ratio may cause opaque film 204 to block oblique rays (due, for example, to high NA optics) more than the film blocks rays having a straight angle. Further, higher aspect ratio increases the aperture response function's dependence on the process variation, e.g., for the same amount of sidewall angle variation between apertures, the aperture response changes more when the aspect ratio is higher. As such, in one embodiment, the thickness of opaque film 204 is selected to be a minimum but also sufficient to block, obstruct, and/or absorb the radiation to be measured, sensed or detected by sensor cells 200.

In that regard, where the total light collecting area under the opaque film is $A_1$, and the aperture area is $A_2$, and assuming the signal from the aperture to be at least N times larger than the total signal from the blocked area (N can be called as the signal-to-noise-ratio, i.e. SNR, of the blocking), in one embodiment the attenuation of the opaque film to the light may be characterized as:

$$D=N*(A_1/A_2)$$

As such, where N=1000, A1 is $5 \mu m \times 5 \mu m$, and A2 is 100 nm diameter, the attenuation factor D will need to be $3.2e^6$.

The attenuation may be computed or characterized using the following steps:

(1) Penetration depth of the light in the film is: $d=\lambda/(2*\pi*k)$, where $\lambda$ is the wavelength of light, and k is the imaginary part of the refractive index, which depends on the wavelength and material, and can be looked up in material handbooks (see, for example, "Handbook of Optical Constants of Solids", Editor Edward D. Palik, Volume 1, 2, 3). The k value is usually in the range of 1.5 to 4.0. The larger the k, the smaller the penetration depth and the better blocking.

(2) With the known penetration depth, the attenuation after thickness of T is then:

$$D=e^{T/d}$$

Hence, for a chosen opaque material and any specific wavelength, the thickness T may be computed to achieve the required or desired attenuation factor D. To give an order of magnitude, using, for example, tungsten or poly-silicon as the material for opaque film 204, for 193 nm wavelength, and using the area ratio used in the above example, the film thickness may be around 100 nm.

Figure 6B:
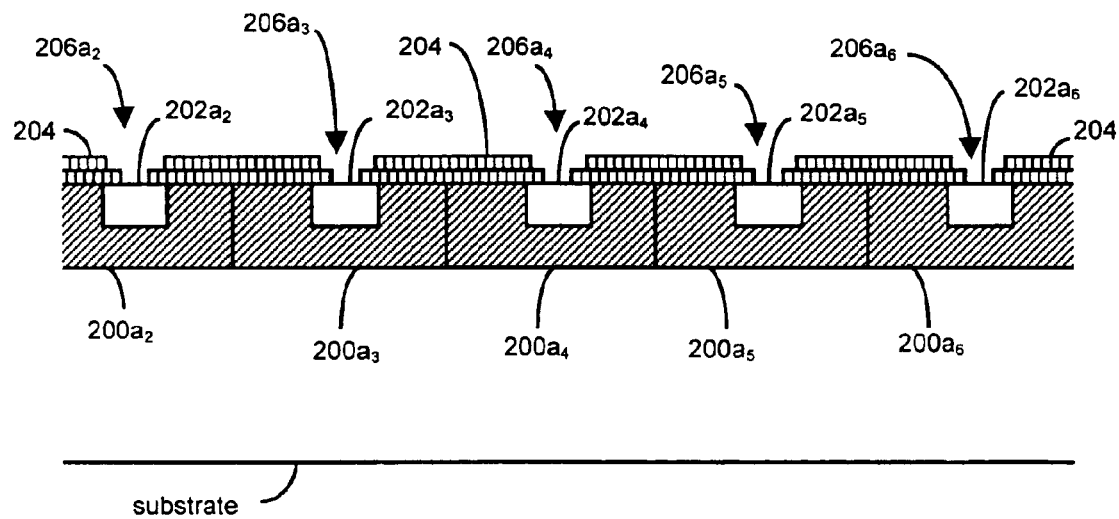

In one embodiment, as illustrated in FIG. 6B, opaque film 204 includes a step configuration around the proximity of apertures 206. Where opaque film 204 is fabricated from a metal material, a first layer or lower step may be deposited or formed and, at the same time or shortly thereafter, a second layer or upper step may be deposited or formed between apertures 206. In this embodiment, the configuration of opaque film 204 may effectively change the area ratio ($A_1/A_2$) to the area ratio between the surface of the lower layer of film 204 and aperture 206. In one embodiment, this ratio may be less than 5.

Notably, in the example above, this embodiment may reduce the requirement on the attenuation ratio (D) by a factor of about 500, which could translate to about 40% reduction in the required aperture aspect ratio (which may be characterized as the ratio between the thickness of the lower step metal film and the aperture diameter).

The apertures 206 in opaque film 204 may be formed using a milling technique (for example, focused beam of ions), etching technique (for example, anisotropic plasma etching) combined with e-beam direct write techniques. Indeed, any technique to form, create and/or produce apertures 206 in opaque film 204, whether now known or later developed, is intended to be within the scope of the present invention.

The size and shape of apertures 206 determine, to some extent, the number of photons sensed by sensor cells 200 and the maximum spatial frequency of the measured aerial image. In one embodiment, apertures 206 are substantially circular and have a diameter of between approximately 50 nm to approximately 200 nm, and preferably between about 75 nm to about 150 nm. An appropriate size of the diameter of apertures 206 may be determined using the wavelength of the photons of light 16 and the numerical aperture of lithographic equipment 10 (typical characterized as n (i.e., the refractive index of the medium above the sensor or wafer in lithographic equipment 10)×sin θ).

It should be noted that, for those skilled in image processing, it is well known that, assuming the response of the aperture is a simple summation of all photo energy impinged on it, the aperture will very likely "behave" like a low pass-filter to the aerial image intensity distribution. Assuming a square aperture of size d by d, the first zero in the spatial frequency pass band may be at 1/d. If the aperture is a round aperture with diameter $d_1$ the first zero in the spatial frequency pass band may be at 1.22/d. To preserve a substantial amount of, or all spatial information, 1/d (for square aperture) or 1.22/d (for round aperture) should be higher than the maximum spatial frequency existing in the intensity distribution of the aerial image.

The discussion below may be applicable to round and/or square apertures. Moreover, the first zero in the spatial frequency pass band when the aperture size is d, where d is either the side length of a square aperture, or 1/d is the diameter of a round aperture.

It should be further noted that a response function, which may be an acceptable approximation, is a summation of all the energy impinging on the inlet of the aperture 206. More sophisticated response functions will likely require detailed calibration and/or implementation of suitable computer simulations tools. Once such computer simulation tool is "TEMPEST" available from UC Berkeley.

Regardless of illumination, partial coherence, and/or Reticle Enhancement Techniques (for example, Optical Proximity Correction (OPC), and Phase-Shift Masks (PSM)) on masks, the maximum spatial frequency in the light intensity distribution on wafer plane may be characterized as $2\times NA/\lambda$, where NA is the Numerical Aperture of the stepper projection optics, and $\lambda$ is the wavelength used in the imaging. Therefore, in one embodiment, the aperture size that preserves all or substantially all spatial frequency, may be characterized as:

$$1/d > 2 \times NA/\lambda \text{---or---} d < \lambda/(2 \times NA)$$

In one embodiment, where lithographic equipment 10 includes an NA of 0.75 and employs a wavelength of 193 nm, the size of apertures 206 may be smaller than 128 nm. In those instances where lithographic equipment 10 includes an NA of 0.65 employing a wavelength of 248 nm, the size of apertures 206 may be smaller than 190 nm.

In certain instances, the smaller the size of aperture 206, the higher spatial frequencies can be preserved; in contrast, the smaller the size of apertures 206, the less light or radiation passes to sensor cells 200. An aperture size smaller than λ/3 may severely reduce the light that can pass through, and aperture size smaller than λ/6 may effectively block the light passage. Therefore, in one embodiment, the aperture size is equal to or greater than λ/2. As such, for 193 nm wavelength, the aperture size may be 90 nm or greater; and for 248 nm wavelength, the aperture size may be 120 nm or greater.

Thus, in at least one embodiment, where the dimension size of active areas 202 of sensor cells 200 are in the order of a few μm×a few μm (for example, 2 μm×5 μm), and where a spatial resolution of between about 75 nm to about 150 nm may be desired, required or advantageous, patterned film 204 (for example, tungsten, aluminum, or silicon) may be employed to limit or restrict the exposed active areas of sensor cells $200a_x$–$200h_x$ (x=1 to 8) thereby enhancing the spatial resolution of sensor cells $200a_x$–$200h_x$ (x=1 to 8). A spatial resolution of between about 75 nm and about 150 nm may be sufficient to properly, accurately and/or adequately characterize, measure, collect, sense and/or detect the aerial image of mask 26 as projected at the wafer plane.

It should be noted that in one embodiment the sidewalls of apertures 206 may be shaped to provide, among other things, an enhanced response. After dry etching or ion milling, the sidewall shape may be close to vertical. By shaping the walls of apertures 206, the shape can be modified to have tilted angles, which may enhance the amount of radiation that passes through apertures 206 for the oblique rays. Such shaping may be by isotropic etching or other suitable technique.

The dimensions of sensor array 106 may depend, to some extent, on size of the aerial image to be measured, the technique employed to capture that image, the data collection time, and/or any the spatial constraints of sensor array 106 due to constraints imposed by image sensor unit 102 and/or lithographic equipment 10. In one embodiment, sensor array 106 may be the same, substantially the same or about the same size as the aerial image to be measured. In this way, the data collection time is minimized relative to a sensor array of substantially smaller size while the footprint of the sensor array is not too large. For example, where the aerial image at the wafer plane is about 26 mm×32 mm, sensor array 106 may be about 27 mm×33 mm.

Figure 7A:
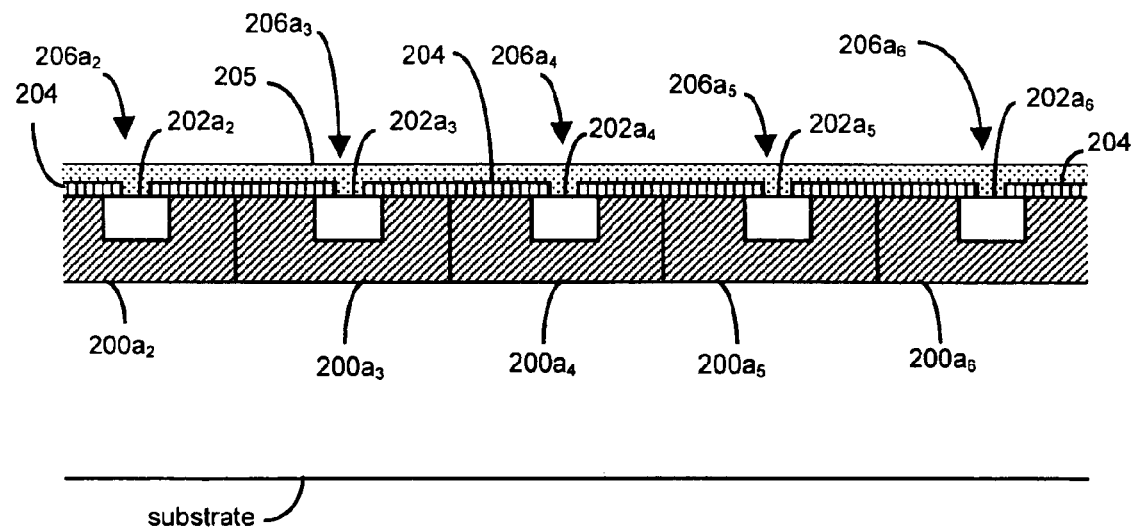
FIGS. 7A and 7B are cross-sectional views of a sensor array, in conjunction with a selectively patterned, shaped and/or etched opaque film as well as a transparent medium of a predetermined refractive index, according to several embodiments of the present invention.
Figure 7B:
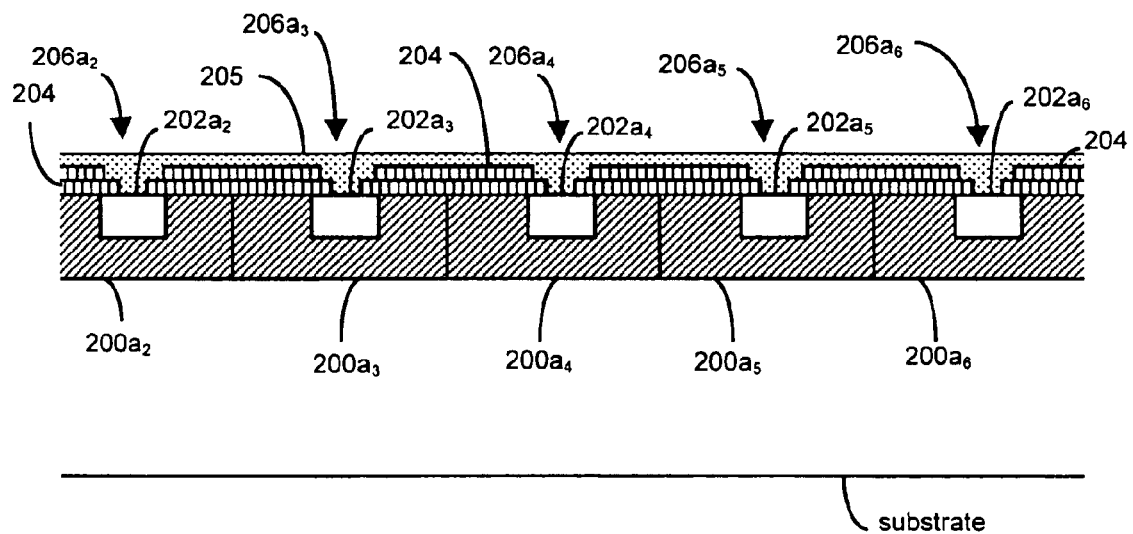

With reference to FIGS. 7A and 7B, in at least one embodiment, the surface of sensor array 106 (or sensor cells 200) may be coated with a transparent medium 205 having predetermined refractive index "n". In one embodiment, the refractive index is equal to or substantially equal to that of photoresist. In this way, a coating may: (1) reduce the wavelength to λ/n within apertures 206, and hence potentially increase the light energy pass ratio by the aperture; (2) enhance the refraction to oblique rays to make the direction of oblique rays more "straight down" toward apertures 206, and hence improve the passing ratio of oblique rays; (3) emulate the refraction effect of resist on aerial image, and thereby cause the sensed aerial image to be a closer approximation of the aerial image "inside" resist; and/or (4) increase the effective ratio between the aperture size and the wavelength (due to the reduced wavelength inside the aperture), which may reduce the aperture response function's variation due to aperture process variation (for example, the variation in size between the apertures). In this embodiment, transparent medium 205 may be deposited or grown after formation of opaque film 204.

It should be noted that transparent medium 205 may be grown or deposited in apertures 206 rather than over all or substantially all of the surface of sensor cells 200 or sensor array 106. In this embodiment, transparent medium 205 may be deposited or grown before or after formation of opaque film 204.

Figure 8A:
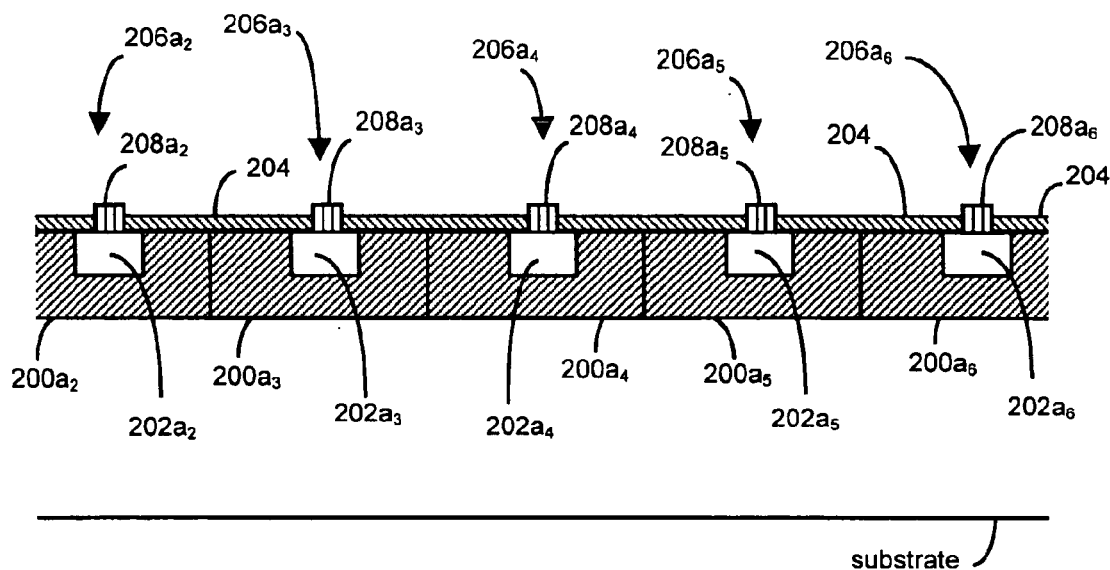
FIGS. 8A, 8B, 9A–D, 10 and 11A–C are cross-sectional views of the sensor cells and/or sensor array according to other embodiments of the present invention.

It may be desirable, or in certain circumstances, advantageous, to enhance the photo-reception or photon efficiency of sensor cells 200. With reference to FIG. 8A, in one embodiment, a photo or photon detection enhancement material $208a_x$–$208h_x$ (x=1 to 8) (for example, a photo or photon sensitive semiconductor material) may be deposited, grown and/or formed within aperture $206a_x$–$206h_x$ (x=1 to 8), respectively, to enhance the ability or capacity of sensor array 106 to measure, sample, sense and/or detect incident photons or energy at a given wavelength (for example, $\lambda_o$). Thus, in this embodiment, detection enhancement material $208a_x$–$208h_x$ enhances the ability or capacity of active areas $202a_x$–$202h_x$ (x=1 to 8) to measure, sample, sense and/or detect incident radiation and thereby improve the ability or capacity of sensor array 106 to characterize, measure, collect, sense and/or detect the aerial image of mask 26 as projected at the wafer plane.

With continued reference to FIG. 8A, the detection enhancement material $208a_x$–$208h_x$ (x=1 to 8) may be deposited, grown and/or formed before and/or after formation or patterning of apertures $206a_x$–$206h_x$ (x=1 to 8). The detection enhancement material $208a_x$–$208h_x$ (x=1 to 8) may also be deposited, grown and/or formed before and/or after deposition, growth or formation of opaque film 204. One example for the detection enhancement material 208 may be the semiconductor material used in the photo-sensitive area 202, so that photons can be converted to electrons before they travel through the aperture.

Figure 8B:
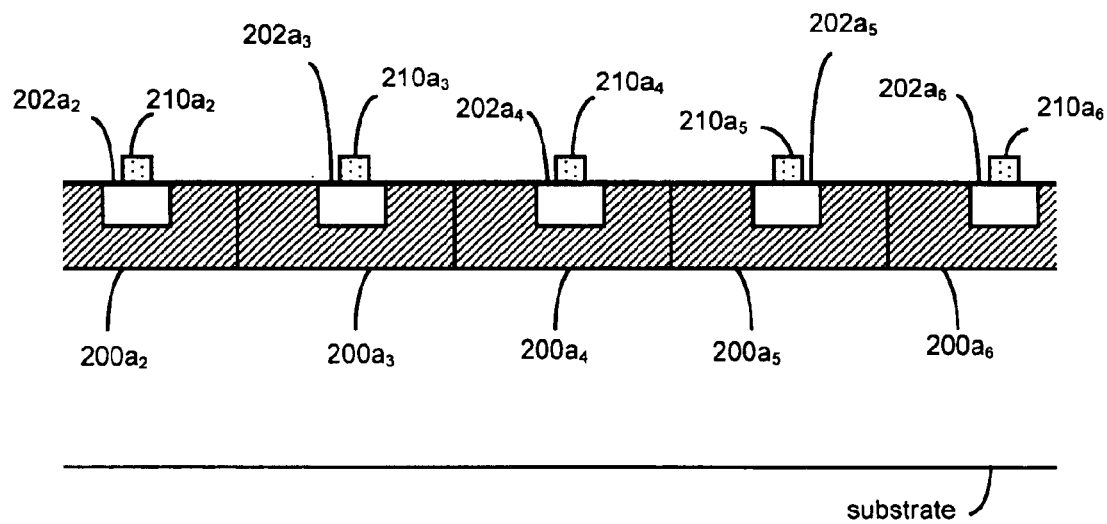

With reference to FIG. 8B, in another embodiment, sensor array 106 may include sensor cells $200a_x$–$200h_x$ (x=1 to 8) that are insensitive (or relatively insensitive) to the wavelength of the energy employed by the photolithographic equipment 10 to expose the wafer during integrated circuit fabrication (for example, photons or light at wavelength $\lambda_o$). The sensor array 106 may also include photon-conversion material $210a_x$–$210h_x$ (x=1 to 8), for example, a "lumigen" or "lumogen" material, selectively disposed on active areas $202a_x$–$202h_x$ (x=1 to 8) of sensor cells $200a_x$–$200h_x$ (x=1 to 8), respectively, to convert the energy into a form that is measurable by sensor cells $200a_x$–$200h_x$ (x=1 to 8). In this way, the active areas 202 are effectively limited or reduced proportionally with the footprint of photon-conversion material 210. Accordingly, the photon-conversion material 210 enhances the spatial resolution of each sensor cell 200.

For example, where sensor array 106 is employed in lithographic equipment 10 that utilizes ultraviolet light, for example, to project the aerial image at the wafer plane, sensor array 106 may include sensor cells $200a_x$–$200h_x$ (x=1 to 8) that are insensitive to ultraviolet light, but measure, sample, sense, detect or collect photons in the visible light spectrum. The photon-conversion material $210a_x$–$210h_x$ (x=1 to 8) may be selectively patterned and disposed on active areas $202a_x$–$202h_x$ (x=1 to 8) of sensor cells $200a_x$–$200h_x$ (x=1 to 8), respectively, to convert ultraviolet light incident on photon-conversion material $210a_x$–$210h_x$ (x=1 to 8) to visible light energy (or other wavelength of light that is sensitive to the sensor cells). Thus, the exposed active areas of sensor cells $200a_x$–$200h_x$ (x=1 to 8) are effectively limited or restricted which thereby enhances the spatial resolution of sensor cells $200a_x$–$200h_x$ (x=1 to 8).

The photon-conversion material $210a_x$–$210h_x$ (x=1 to 8) may be selectively patterned and disposed on or over active areas $202a_x$–$202h_x$ (x=1 to 8) to provide an "effective" active area of about 75 nm to about 150 nm. As mentioned above, a spatial resolution of about 75 nm to about 150 nm may be sufficient to properly, accurately and/or adequately characterize or detect the aerial image of mask 26 as projected at the wafer plane.

Figure 9A:
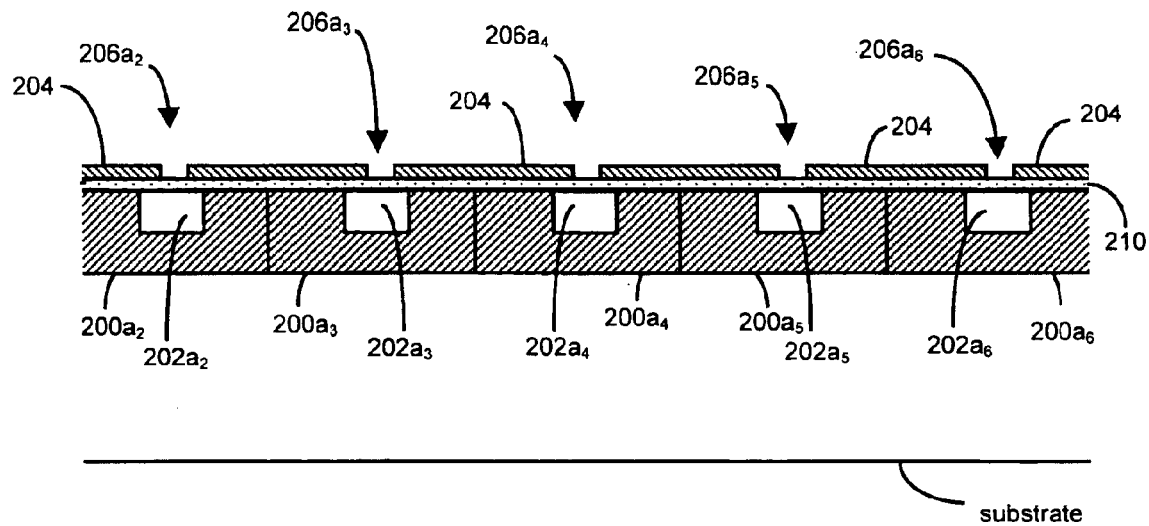

With reference to FIG. 9A, in another embodiment, opaque film 204 (of FIGS. 6A and 6B) is used, in conjunction with photon-conversion material 210 (of FIG. 8B) to enhance the resolution of sensor sells $200a_x$–$200h_x$ (x=1 to 8) of sensor array 106. In this regard, opaque film 204 and photon-conversion material 210 are disposed on or over at least active areas $202a_x$–$202h_x$ (x=1 to 8) of sensor cells $200a_x$–$200h_x$ (x=1 to 8), respectively. The active areas $202a_x$–$202h_x$ (x=1 to 8) of sensor cells $200a_x$–$200h_x$ (x=1 to 8), respectively, measure, sample, sense, detect and/or are responsive to visible light. The photon-conversion material 210 converts energy of a given wavelength to visible light, as described above with respect to FIG. 8A. The opaque film 204 overlies or covers selected portions of the photon-conversion material 210 and active areas $202a_x$–$202h_x$ (x=1 to 8) and forms apertures $206a_x$–$206h_x$ (x=1 to 8) in the same manner as described above with respect to FIGS. 5, 6A and 6B. As such, opaque film 204 limits or restricts the photons (of a given wavelength) incident on the exposed photon-conversion material 210 which, in turn, limits or restricts conversion of the incident photons to visible light to those portions of active areas $202a_x$–$202h_x$ (x=1 to 8) that are incident or contiguous to the photon-conversion material 210 exposed via apertures $206a_x$–$206h_x$ (x=1 to 8).

The embodiment of FIG. 9A may provide the advantage that the photons are still at short ultraviolet wavelength when they pass through apertures 206 of opaque film 204. As such, the scattering effect of the photons caused by the apertures of opaque film 204 may be less severe which may facilitate more photons to pass or travel through the apertures 206, be converted by photon-conversion material 210, and sampled, sensed, detected and/or measured by those portions of active areas 202 that are contiguous with photon-conversion material 210 that is exposed by apertures $206a_x$–$206h$.

Figure 9B:
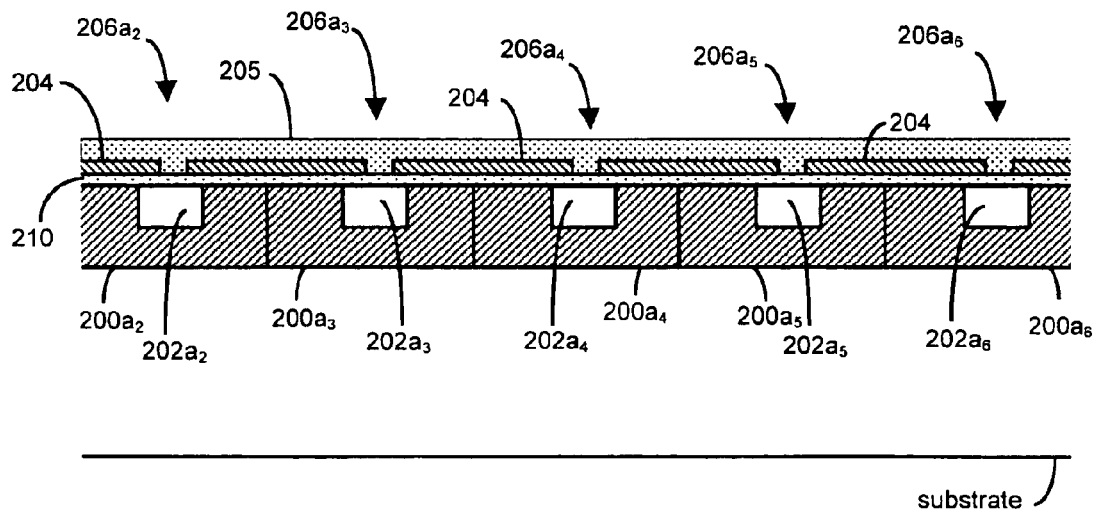

With reference to FIG. 9B, in another embodiment, similar to the embodiments illustrated in FIGS. 7A and 7B, the opaque film 204 and photon-conversion material 210 of FIG. 9A is coated with transparent medium 205 having a refractive index "n". In one embodiment, the refractive index of transparent medium 205 is equal to or substantially equal to that of photoresist. As mentioned above, such a coating may: (1) reduce the wavelength to λ/n within apertures 206; (2) enhance the refraction to oblique rays to make the direction of oblique rays more "straight down" toward apertures 206; (3) emulate the refraction effect of resist on aerial image; and (4) reduce the aperture response variation between apertures. The transparent medium 205 may be deposited or grown after formation of opaque film 204.

Figure 9C:
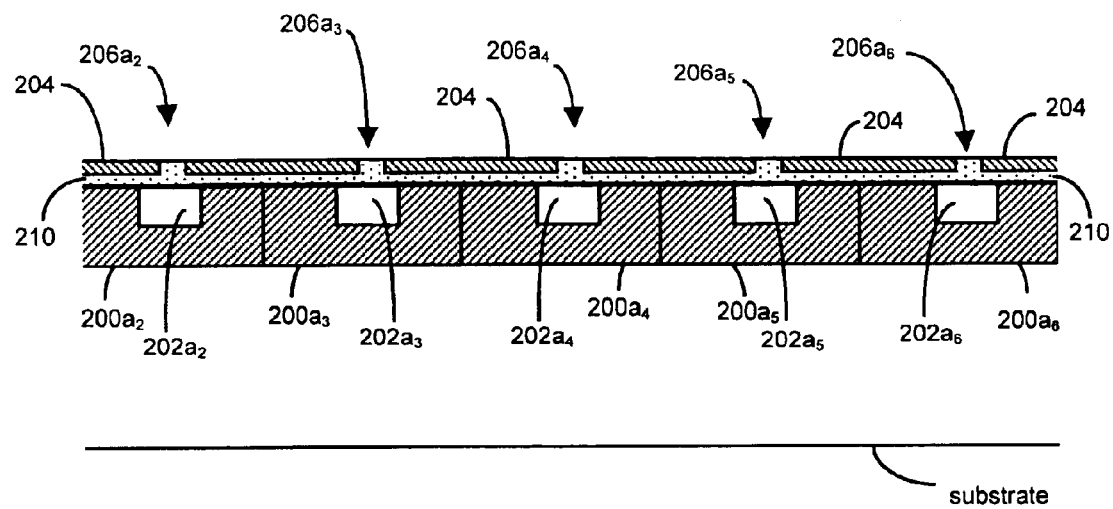
Figure 9D:
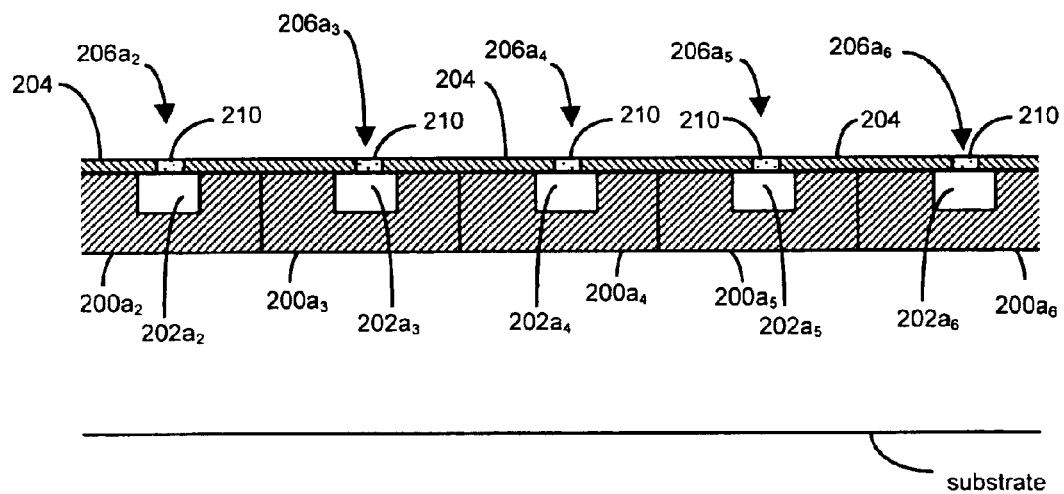

With reference to FIGS. 9C and 9D, photon-conversion material 210 may also be disposed in apertures $206a_x$–$206h_x$ (x=1 to 8) of film 204. For example, photon-conversion material 210 may be deposited, grown and/or formed over sensor cells 200. Thereafter, film 204 may be deposited, grown and/or formed over or in photo-conversion material 210 and apertures $206a_x$–$206h_x$ (x=1 to 8) (see, for example, FIG. 9C). Alternatively, photon-conversion material 210 may be deposited, grown and/or formed within apertures $206a_x$–$206h_x$ (x=1 to 8) of opaque film 204 (see, for example, FIG. 9D). As described above, the photon-conversion material 210 coverts photons of a given wavelength to another wavelength which may be sensed, detected, measured or sampled by selected portions of active areas $202a_x$–$202h_x$ (x=1 to 8) defined, for example, by apertures $206a_x$–$206h_x$ (x=1 to 8), respectively.

Figure 10:
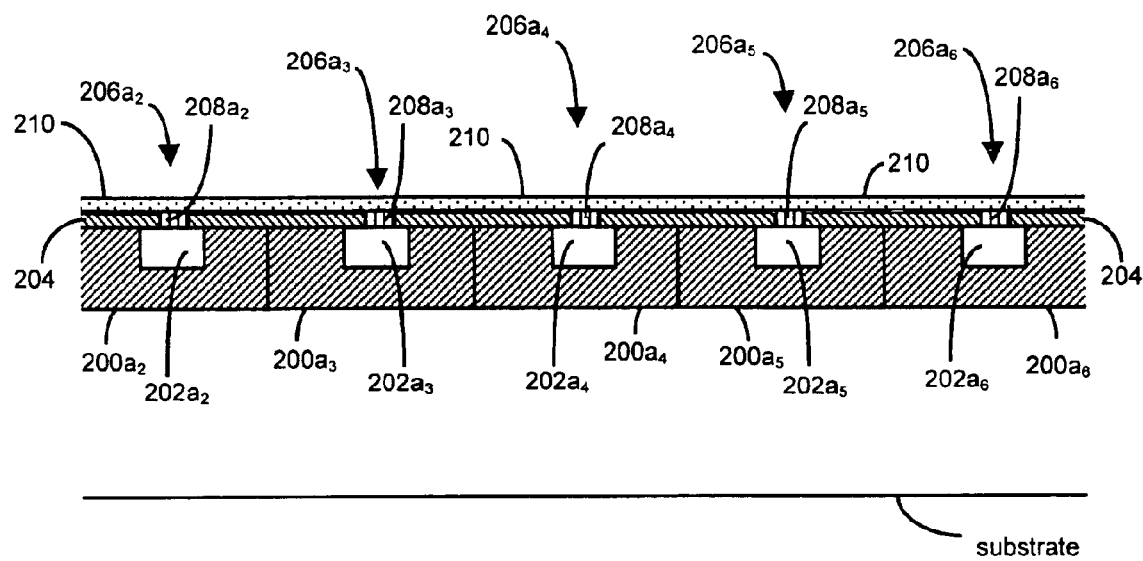

It should be noted that, in another embodiment, photon-conversion material 210 may overlie or be disposed on opaque film 204. In this regard, photon-conversion material 210 is deposited, grown and/or formed over opaque film 204. In operation, the photon-conversion material 210 coverts photons of a given wavelength to energy of another wavelength (for example, visible light) which is then provided to selected portions of active areas $202a_x$–$202h_x$ (x=1 to 8) defined by apertures $206a_x$–$206h_x$ (x=1 to 8), respectively. In this way, the spatial resolution of sensor cells 200 is enhanced, limited and/or reduced Moreover, with reference to FIG. 10, in another embodiment, a photo or photon detection enhancement material $208a_x$–$208h_x$ (x=1 to 8) (for example, a photo or photon sensitive semiconductor material) may be deposited, grown and/or formed within aperture $206a_x$–$206h_x$ (x=1 to 8), respectively, to enhance the efficiency of the active areas $202a_x$–$202h_x$ (x=1 to 8) to receive and detect the visible light.

In another embodiment, sensor cells 200 having "effective" portions of active areas 202 of a suitable size may be fabricated by modifying the electro-gate structure of the CCD cells, CMOS sensor cells, photo diodes, or other light sensing device. In this regard, in one aspect of this embodiment, an aperture in sensor cell 200 may be formed by selectively removing or eliminating certain material overlying the active area of sensor cell 200. For example, with reference to FIG. 11A, an aperture in sensor cells 200 may be created by removing a portion of the layer(s) that obstructs, absorbs and/or impedes, for example, ultraviolet light. In this way, when implemented in an ultraviolet light based lithographic equipment, sensor cells 200 measure, collect, sense and/or detect photons having a wavelength in the ultraviolet region via the aperture overlaying the active areas of sensor cells 200. This technique and structure may be implemented in lithographic equipment or systems employing other wavelengths or lithographic techniques. Thus, the technique and structure of this embodiment provides enhanced resolution of sensor cells 200 by selectively creating and/or forming an aperture in a certain portion of the layer(s) that obstructs, absorbs or impedes photons of a wavelength to be measured by sensor cells 200.

It should be noted that the apertures in the electro-gate structure may be created after fabrication of the sensor cells (for example, by ion milling or e-beam lithography), or during its fabrication by modifying the mask used to create the electro-gate of the sensor cells. It should be further noted that in this embodiment, the layer(s) in which the aperture is formed may be considered to be the same as opaque film 204 discussed above.

In yet another embodiment, sensor cells 200 having "effective" portions of active areas 202 of a suitable size may be fabricated by incorporating opaque film 204 (including apertures 206) within the multiple layers of CCD cells, CMOS sensor cells, photo diodes, or other light sensing device. In this regard, opaque film 204 is integrated into sensor cells 200 and disposed between a protective outer surface of sensor cells 200 and active areas 202 of sensor cells 200. For example, with reference to FIG. 11B, opaque film 204 is disposed between active area 202 and a protective layer of silicon dioxide ($SiO_2$) or silicon nitride ($Si_3N_4$). In this embodiment, opaque film 204 may be any material that may be deposited, grown and/or formed in sensor cells 200, and patterned, milled, shaped and/or etched such that active areas 202 receive, measure, collect photons from a smaller, limited and/or restricted area or region (substantially or proportionally equal to the area of apertures 206 relative to the entire active area 202). Thus, the technique and structure of this embodiment provides enhanced resolution of sensor cells 200 by integrating an additional layer, i.e., opaque film 204 (having apertures 206), in sensor cell 200.

It should be further noted that there are many techniques and materials (and, as a result, structures created thereby) for enhancing the spatial resolution of sensor cells 200. Moreover, there are many techniques and permutations of depositing, growing, milling and/or forming the various layers of sensor 200, opaque film 204, apertures 206, detection enhancement material 208, and/or photon-conversion material 210. For example, with reference to FIG. 11C, detection enhancement material 208 and/or photon-conversion material 210 may be disposed in or near apertures 206 (via, for example, CVD, PECVD or implantation techniques) of the sensor cells illustrated in FIGS. 11A or 11B. Thus, all techniques and materials, and permutations thereof, that enhance the spatial resolution of active areas 202 of sensor cells 200, whether now known or later developed, are intended to be within the scope of the present invention.

Figure 11A:
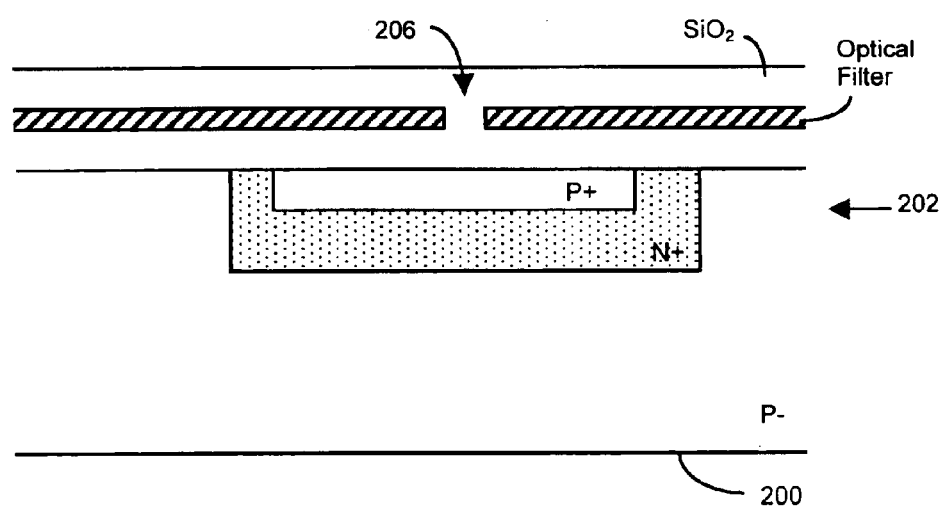
Figure 11B:
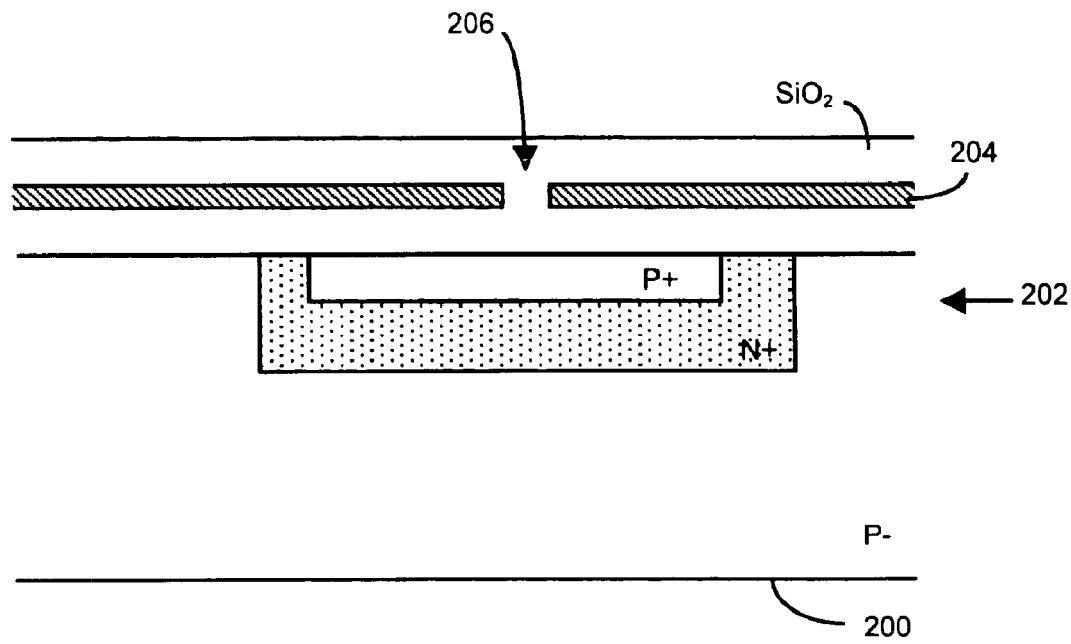
Figure 11C:
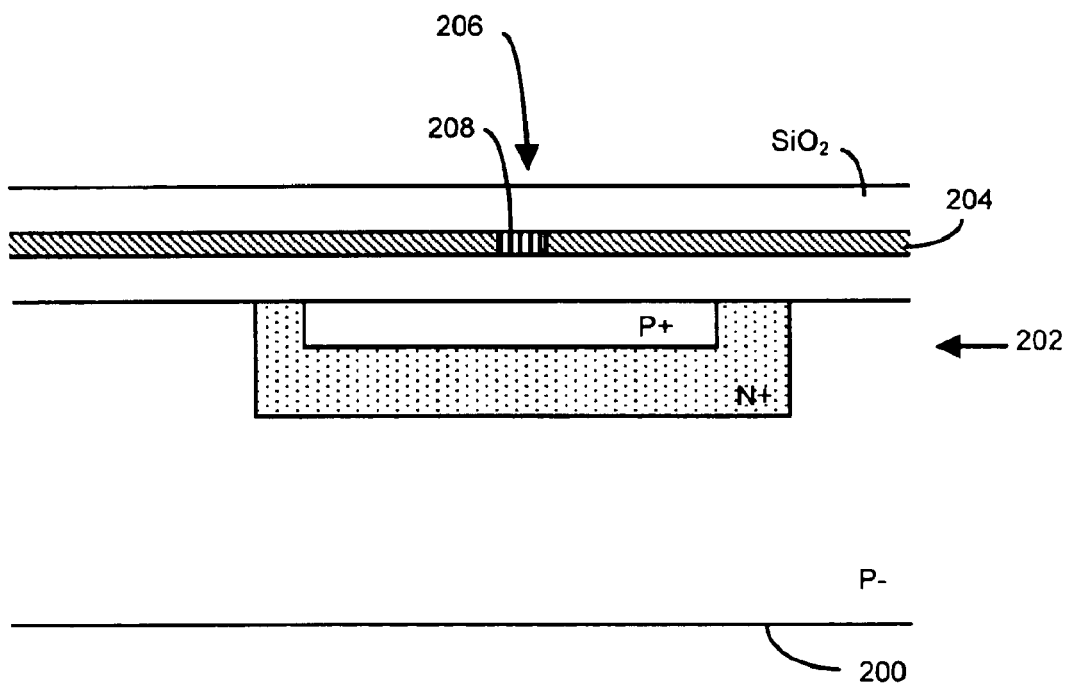
Figure 12A:
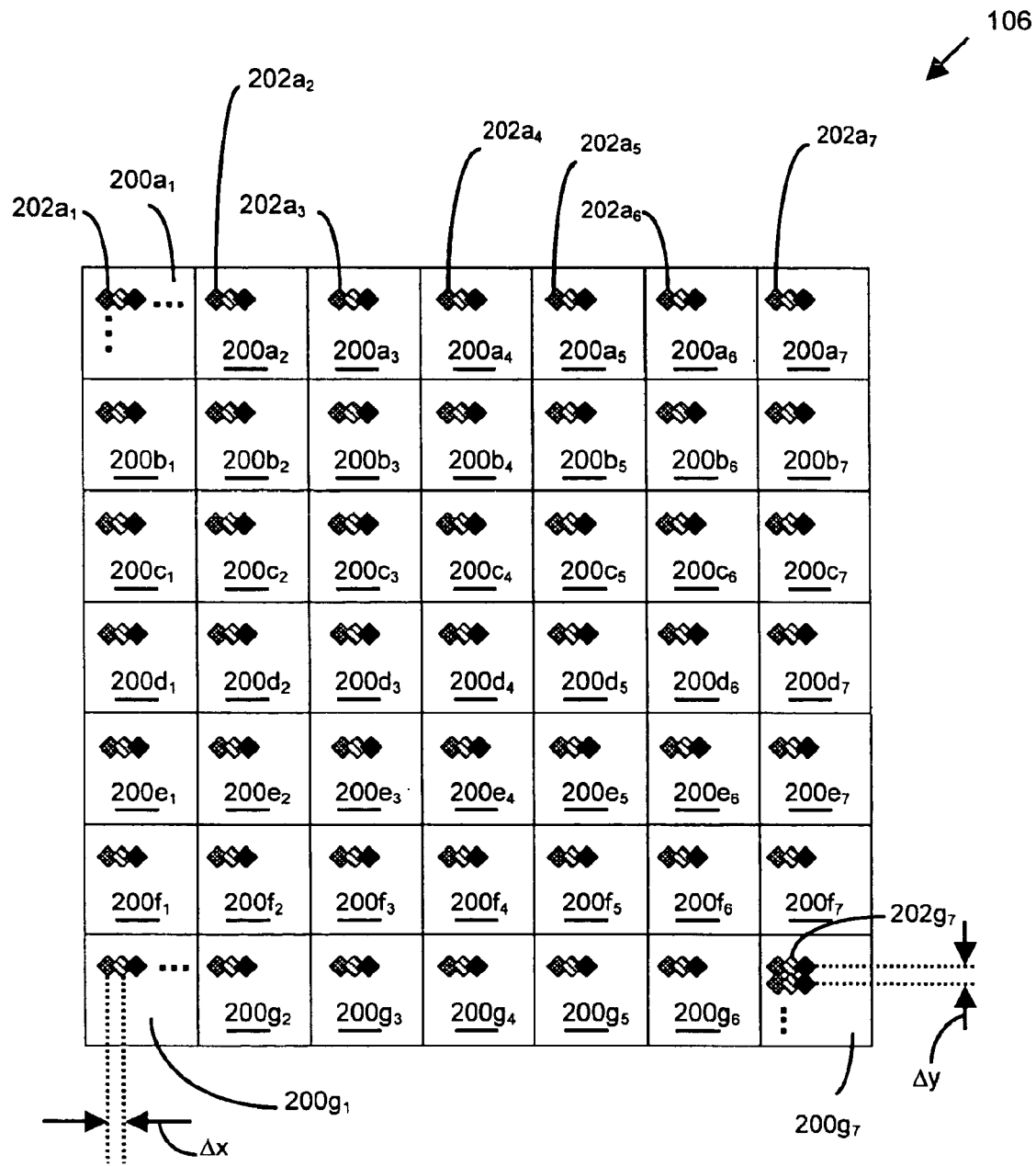
FIGS. 12A–C and 13A–E are representations of the image collection techniques, in relation to the sensor array, according to certain aspects of the present invention.
Figure 12B:
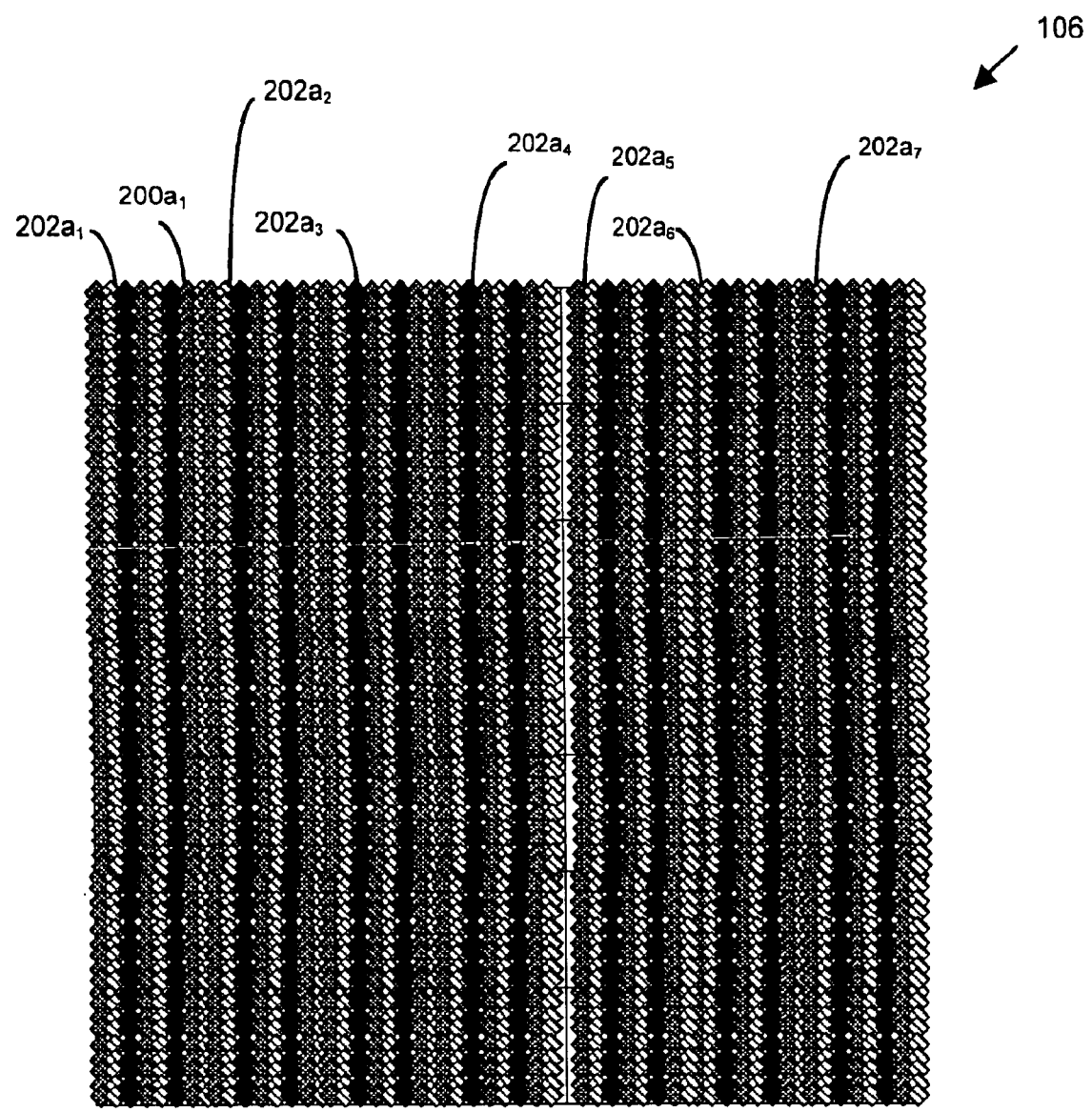
Figure 12C:
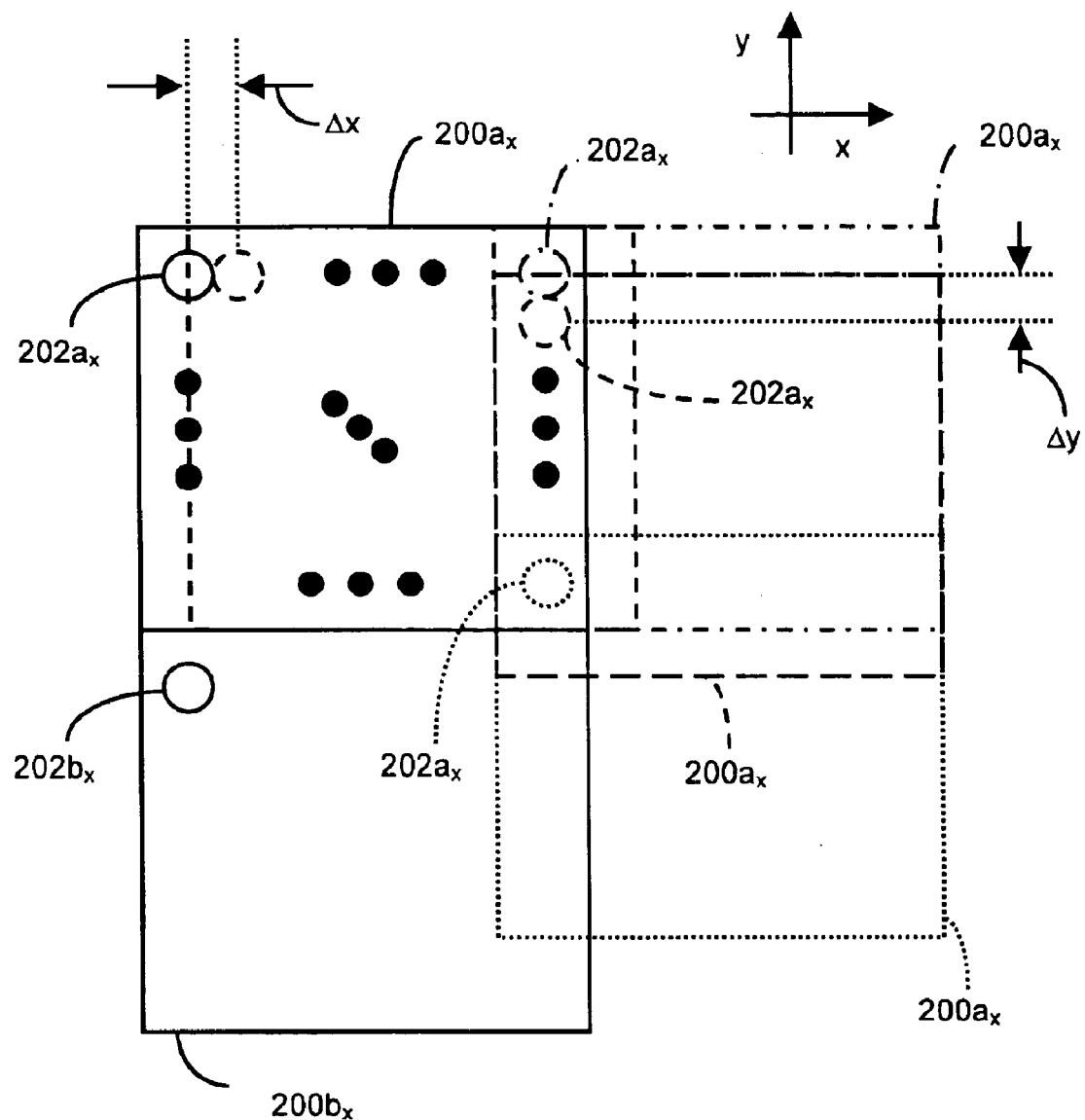

Moreover, in one embodiment, the sensor cells 200 of FIGS. 11A–C may also include transparent material 205 (having the predetermined refractive index "n") disposed over apertures 206 and active areas 202 of sensor cell 200. In another embodiment, the film 204 includes a step configuration around the proximity of apertures 206 as illustrated in FIGS. 6B and 7B. The discussions of sensor array 200 of FIGS. 6A, 6B, 7A and 7B are fully applicable to this aspect of the present invention. However, for the sake of brevity, those discussions will not be repeated.

Figure 3B:
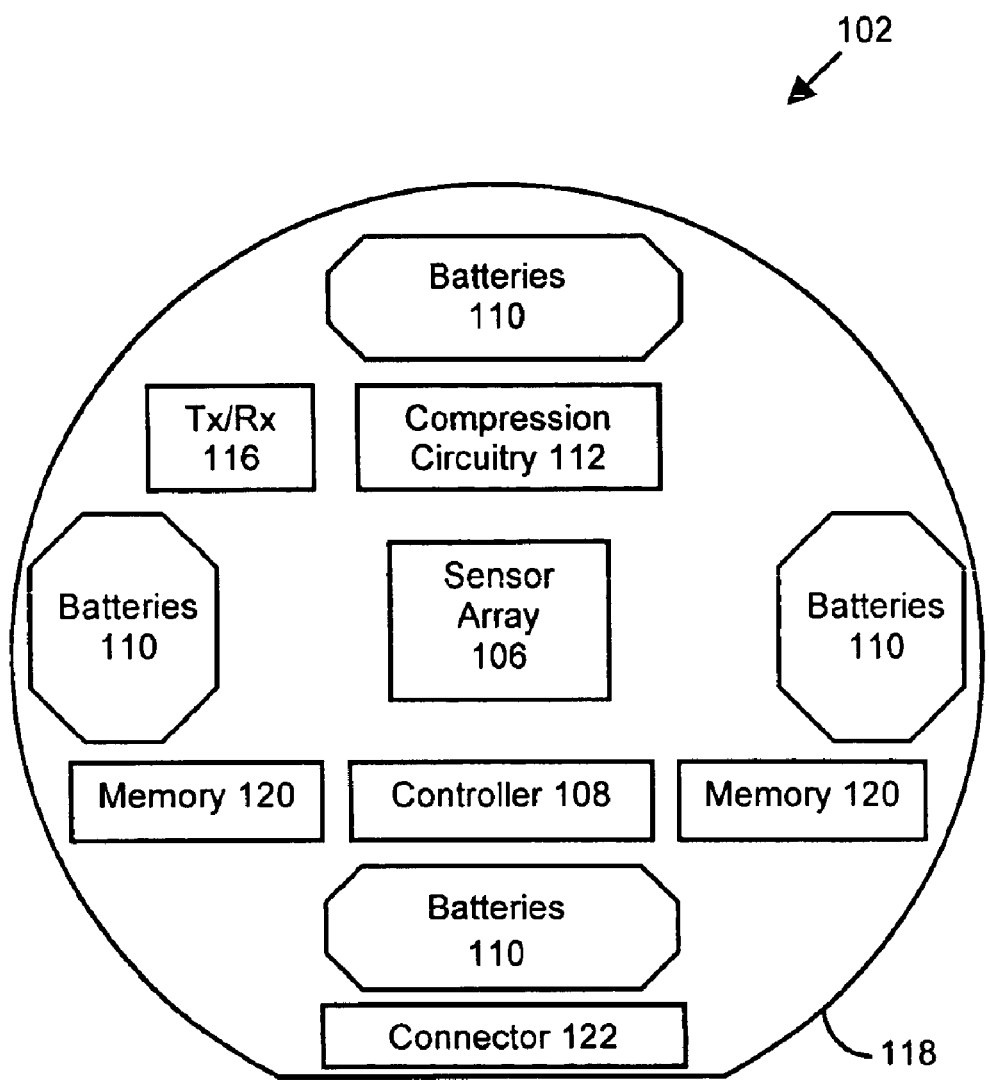
Figure 3C:
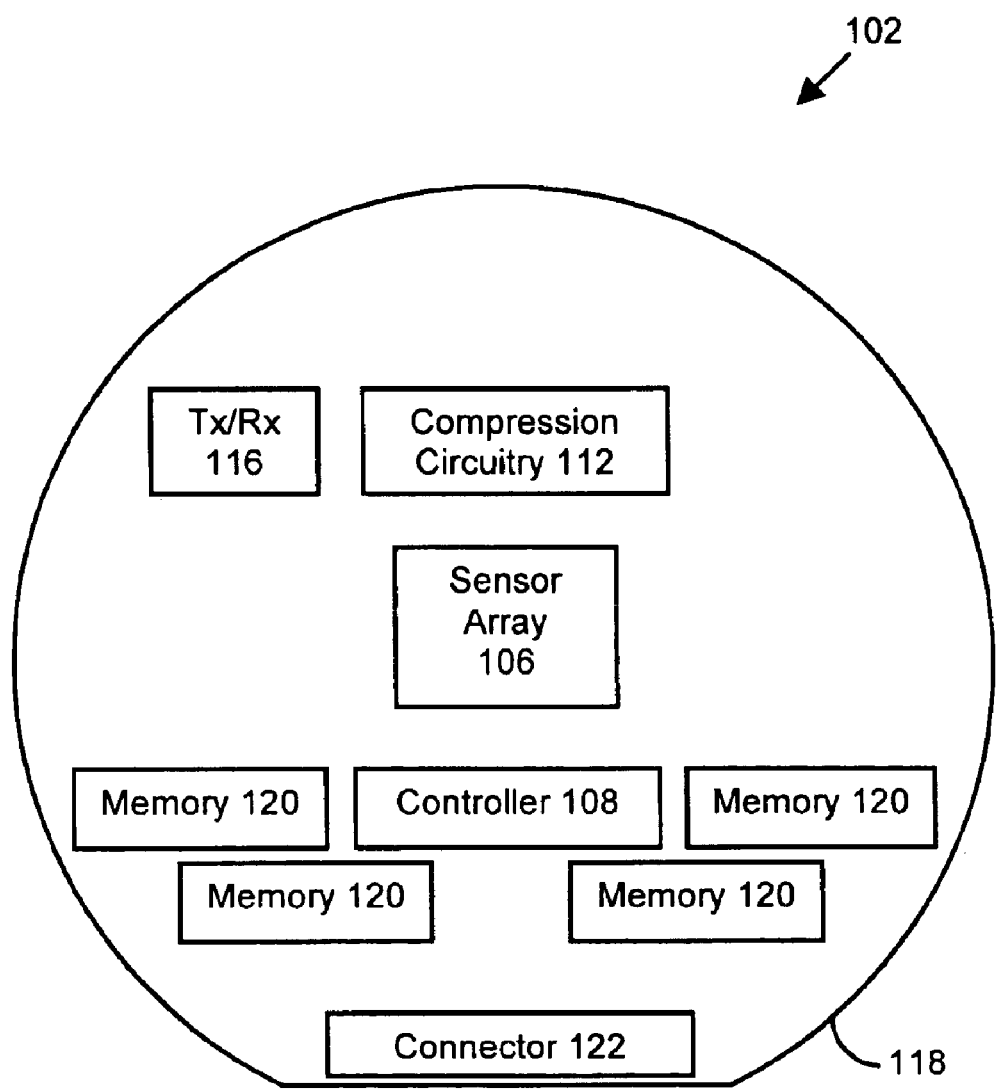

With reference to FIGS. 3A, 3B and 3C, as mentioned above, image sensor unit 102 may also include controller 108, a source of electrical power, for example, batteries 110, data compression circuitry 112, transmitter circuitry 114, transmitter/receiver circuitry 116, memory 120 and connector 122. The controller 108, data compression circuitry 112, transmitter circuitry 114, transmitter/receiver circuitry 116, and/or memory 120 may be incorporated on image sensor unit 102 as discrete components or may be integrated in substrate 118 (via VLSI or LSI integration techniques), or a combination thereof (for example, sensor array 106 is integrated in substrate 118 and transmitter circuitry 114 are discrete components). In those circumstances where the electronics of image sensor unit 102 is comprised of discrete components it may be advantageous to employ surface mount technologies, unpackaged die and/or cavities, holes or cut-outs in substrate 118 in order to further minimize the profile of sensor unit 102.

Further, in those circumstances where the electronics of image sensor unit 102 is comprised of discrete components, sensor unit 102 may be a circuit board-like structure which has the same or substantially the same two-dimensional shape as a wafer. In these embodiments, the hybrid-type sensor wafer may be thicker than an actual product wafer, where surface topography of substrate 118 and sensor unit 102 may not be flat or uniform. In one preferred embodiment, however the thickness range of sensor 102 is within the acceptable parameters to be handled by lithographic equipment 10.

The substrate 118 may be a blank silicon wafer, or be made of some other material (e.g., aluminum carbide) suitable to be placed on a stepper stage. The discrete components may be disposed onto the substrate, and interconnected through patterned metal wires on or in the substrate or via bonding wires.

For example, where sensor 102 is used in conjunction with lithographic equipment 10 (for example, a stepper), the:

(1) total weight of sensor unit 102 preferably should be within a range from an actual wafer, hence be able to be handled by the stage control system and wafer handling systems; and (2) the thickness of sensor unit 102 preferably should be within a range from actual wafers so that the stage may handle to keep the appropriate focus on the surface of sensor array 106. Of particular interest is a configuration that maintains sensor array 106, and potentially a focus area around it, at the same thickness as a typical wafer, so that the auto-focus system of lithographic equipment 10 (if any) may achieve focus on the surface of sensor array 106 without adjusting the Z-height of the wafer stage. It should be noted that areas outside sensor array 106 may not need to have the same thickness of a typical wafer. Preferably, however, there is enough "clearance" relative to the working distance of stepper optics and other wafer handling systems to permit automatic handling and/or placement on chuck 22 with no or minimal modification to lithographic equipment 10.

In those instances where sensor array 106 is a discrete device (or is manufactured in or on substrate 118), the "flatness" of the surface of sensor array 106 may be an important consideration, because for the sensor array to measure, sense, sample and detect useful information, all cells in the array need to lie within the depth of focus of lithographic equipment 10. For example, where lithographic equipment 10 is a stepper having a numerical aperture NA and using a radiation source of wavelength $\lambda$, the depth of focus may be characterized as $\lambda/(NA)^2$. As such, for 193 nm stepper with NA=0.75, the depth of focus is 340 nm and, it may be preferable to maintain a surface flatness of sensor array 106 smaller than the depth of focus, for example, within 100 nm.

It should be noted that in those situations where lithographic equipment 10 employs UV light, it is preferable to employ a sensor array 106 that is UV-stable (i.e., does not emit any significant contamination detrimental to lithographic equipment 10 (or portions thereof) under illumination. Moreover, it may be advantageous to passivate sensor unit 102 and/or sensor array 106, for example, with a coating of an inert material, to enhance the structural and/or performance stability of sensor unit 102 and/or sensor array 106. The sensor array 106 and/or sensor unit 102 may also be coated with anti-reflection materials to reduce reflecting light back into lithographic equipment 10 (for example, the optical sub-system of lithographic equipment 10).

When using anti-reflection (AR) costing on the sensor array 106, the coating may cover the entire sensor array 106, or may only cover the area outside the apertures 206. The AR coating may be applied before or after the apertures 206 are processed. When the AR is coated before the apertures are processed, the aperture processing may be drilling or etching the apertures through both the AR coating and the blocking layer 204. To reduce the total aperture aspect ratio for the benefits described before, it is maybe advantageous to recess the AR coating from the aperture, so that the AR layer's thickness does not contribute to the total aperture sidewall height. When fabricating the AR recess, it is similar to create the second layer of 204 as described above in conjunction with FIG. 6B and 7B. The recessed AR may be the second layer, or coincide with the second layer of 204, or be the third layer.

With continued reference to FIGS. 3A, 3B and 3C, in certain embodiments, controller 108 coordinates the operations and/or functions of the various electronics on or in image sensor unit 102. In this regard, controller 108 may coordinate the sampling of data by sensor array 106 with the exposure and movement operations by lithographic equipment 10. The controller 108 may also coordinate the operation and/or timing of the data communication, data collection and storage, clocking, synchronization, and testing.

In particular, controller 108 may be employed to: (1) interpret and execute the received commands, for example, from the input wired or wireless channel, (2) generate and manage clock signals for other electronics on sensor unit 102, (3) synchronize job start and operations of sensor array 106, compression circuitry 112, and/or wired or wireless transmission (for example, Tx 114 and/or Tx/Rx 116); (4) monitor the operating conditions of sensor array 106 and/or sensor unit 102 (for example, temperature, power, and local current); (5) perform, implement and/or coordinate self-testing of the electronics on sensor unit 102 (for example, sensor cells 200 of sensor array 106); (6) store and provide calibration and/or implementation data of the electronics on sensor unit 102 (for example, sensor array 106 and/or compression circuitry 112); (7) store and provide operations information to the electronics on sensor unit 102, including commands and operating conditions; and (8) perform and schedule testing of sensor unit 102 (based, for example, on historical information relating to testing and test results). Indeed, such testing may include statistical process control functions for sensor unit 102 and provide relevant warning or preventative maintenance requests to processor/controller 104. Further, based on monitored information, sensor unit 102 may provide warning messages or emergency shutdown safety functions.

The controller 108 may also have resident memory to store firmware, calibration data and/or sensor history. The controller, like the other electronics of sensor unit 102, may be implemented via FPGA, DSP, microprocessor or microcontroller, and/or an ASIC.

In certain embodiments, image sensor unit 102 may include a source of electrical power, for example, batteries 110 (for example, the embodiments of FIGS. 3A and 3B). In this regard, batteries 110 may be a primary source of electrical power and thereby may provide all or substantially all of the power requirements of image sensor unit 102. The batteries 110 may be rechargeable (after one or several aerial image capture routines). For example, batteries 110 may include lithium-ion based batteries and/or polymer based batteries. Where the invention is employed in a clean room environment, for example, batteries 110 should be stable and durable to prevent leakage.

The batteries 110 may be customized to accommodate the shape and profile constraints of the wafer-shaped embodiments of sensor unit 102. Further, batteries 110 may be disposed in cavities, holes or cut-outs in substrate 118 in order to minimize the profile of image sensor unit 102. Thus, image sensor unit 102 of these embodiments may be implemented in lithographic equipment 10 as a self-contained and/or self-sufficient sensing device without the need of electrical connection to lithographic equipment 10 or elsewhere.

In certain embodiments, the source of power may be provided to image sensor unit 102 using connector 122 (see, for example, FIGS. 3B and 3C). In this way, some or all of the electronics may be powered by an external power source, which may facilitate use of higher power consumption components that may offer features not offered by lower power consumption components (for example, speed).

It should be noted that in those instances where image sensor unit 102 is incorporated or integrated into chuck 22 of lithographic equipment 10, power may be provided by lithographic equipment 10. In this embodiment, as discussed in detail below, there may be no need to employ batteries 110, unless, for example, as an auxiliary or back-up power source, in the event of a power failure to sensor unit 102.

With reference to FIGS. 3A, 3B and 3C, image sensor unit 102 may also include data compression circuitry 112 to compress the image data (for example, 8 bits per pixel to represent a pixel's gray scale value) collected by sensor array 106 before transmission or communication to processor/controller 104. The data compression circuitry 112 may reduce the bandwidth requirements of the data communications. In those instances where wireless transmission is employed to provide data to processor/controller 104, compression of the data (via circuitry 112) may significantly reduce the bandwidth requirements of transmitter circuitry 114 and transmitter/receiver circuitry 116 and, as such, provide the data representative of the aerial image to processor/controller 104 in a more efficient, less time consuming manner. Compression of the data may also reduce the power consumption by such wireless transmission circuitry.

The data compression circuitry 112 may be in or on FPGA, microprocessors, DSP and/or ASIC(s). As mentioned above, in those circumstances where data compression circuitry 112 is a discrete component, it may be advantageous to employ surface mount technologies, unpackaged die and/or cavities, holes or cutouts in substrate 118 in order to minimize the profile of sensor unit 102 (if necessary).

It is preferred to use lossless data compression techniques. In this way, no information is lost in compression.

For an optical image of integrated circuit pattern, a 2:1 lossless compression ratio may be suitable. Many compression algorithms are suitable and are well known to those skilled in the art.

In one embodiment, to improve the compression ratio, the data may be arranged to improve the correlation between image data. In this regard, the image usually gives good correlation between neighboring pixels. In those instances where the data is provided to compression circuitry 112 in its sequence of availability, for example, sub-frame by sub-frame. A sub-frame refers to the array of output of an array of sensor cells, when the sensor array is positioned at a fixed location relative to the aerial image. The sub-frame embodiments will be discussed in more detail below, for example, in conjunction with FIGS. 12A–C, 13A–E, and 14A–C), the inter-pixel correction may be minimum. As such, it may be desirable to setup a buffer (using, for example, memory 120) to store or maintain several (for example, 2, 4, or 8) sub-frames before providing the data to the compression engine of compression circuitry 112. The data sequence may be re-arranged in the buffer so that the values of neighboring pixels (i.e., from neighboring sub-frames) are juxtaposed or stored in another predetermined arrangement that improves the compression ratio.

In another embodiment, image processing is performed on the data prior to providing the data to the compression engine of compression circuitry 112. For example, data which is representative of the aerial image measured, sensed, detected and/or sampled by sensor cells 200 may be processed to reduce, minimize or eliminate the noise content within the data. This may be accomplished using data from neighboring pixels. Thereafter, the pre-processed data may be provided to the compression engine of compression circuitry 112 and the compressed data may be transmitted or communicated to processor/controller 104. By performing some or all of the noise processing functions to image processing circuitry on image sensor unit 102, the compression ratio may improve.

In those instances where the functions and/or operations of processor/controller 104 are integrated on image sensor unit 102 or in lithographic equipment 10, there may be no advantage to compress the data which is representative of the aerial image before transmission. In this regard, data may be provided to the transmission circuitry via an internal bus in or on image sensor unit 102, or via connector 122 directly to lithographic equipment 10 or to processor/controller 104. In this circumstance, it may be advantageous to employ a high-speed and/or wide data bus as a mechanism for data transmission from image sensor unit 102 to the appropriate circuitry of processor/controller 104.

With continued reference to FIGS. 3A, 3B and 3C, image sensor unit 102 may employ wired, wireless and/or optical data transmission. In those instances where wireless transmission is implemented as a technique to provide some or all data and commands to/from image sensor unit 102 (see, for example, FIGS. 3A and 3B), image sensor unit 102 may include transmitter circuitry 114 and/or transmitter/receiver circuitry 116. In this way, image sensor unit 102 may be implemented in lithographic equipment 10 in the same manner as a product wafer. Moreover, where all data and commands are provided via wireless techniques (see, for example, FIG. 3A), image sensor unit 102 may be implemented in lithographic equipment 10 as a self-contained and/or self-sufficient unit without the need of electrical connection of any kind to/from lithographic equipment 10.

In those embodiments where image sensor unit 102 employs wired and/or optical data transmission, connector 122 may be disposed on substrate 118 to provide a mechanism for external communication. The connector 122 may be an electrical connector that includes signal, power and ground pins or contacts, where signals are transmitted using proprietary or non-proprietary protocols. The connector 122 may also be an optical connector (for example, an optical transmitter/receiver) that communicates signals using well-known protocols.

It should be noted that there are many wireless technologies that may be implemented. For example, Radio Frequency (RF) based wireless communication technologies may be more suitable than other free-space techniques because such techniques provide high data transfer rates but do not require the presence of a line of sight. Other suitable wireless technologies include, for example, infrared and free-space optical communications. Indeed, all such wireless communication techniques, whether now known or later developed, are intended to be within the scope of the present invention.

In one embodiment, wireless local area network technologies, for example, 802.11a/b/g, may be employed for the RF based wireless transmission. Indeed, in one embodiment, multiple channels of 802.11a/g (each channel supports 54 Mbps raw data rate) may be implemented to output data (for example, sensor data), and one channel of 802.11b (each channel supports 11 Mbps data rate) may be implemented to input data (for example, commands and/or configuration data). Moreover, implementing a configuration where there is short distance between antennas, the power consumption of these multiple channels may be significantly reduced without adversely affecting the communication quality.

Further, when using 802.11 technologies, or other general-purpose communication techniques, the communication protocols may be slightly modified to reduce the amount of overhead data, and hence increase the effective payload bit rate of the communication channels. For example, the "top-layer" in 802.11, namely TCP (Transmission Control Protocol) may be eliminated, which would eliminate the header data associated with it. In this way, the amount of overhead data is reduced.

In those instances where RF wireless is implemented, an antenna may be placed on or close/near to lithographic equipment 10 (for example, on or close/near to the door of the stepper) to communicate with an antenna disposed on image sensor unit 102. The distance between the two antennas may be very short, in the order of a few feet, which is the distance between the wafer stage and the stepper door. As such, the wireless transmission data rate may be high, in the range of hundreds of mega bits per second.

After the data is received at the antenna outside lithographic equipment 10, the data may be converted to other digital data formats, and provided to processor/controller 104 using wired, wireless and/or optical transmission (for example, wired Giga-bit Ethernet transmission). Implementing a wired or optical approach may minimize the "contamination" of the RF bands outside lithographic equipment 10. In this way, processor/controller 104 may be located some distance from the lithographic equipment 10, and even outside the clean room in those instances where the lithographic equipment 10 is employed for integrated circuit manufacture, for example.

In many embodiments, the output bandwidth requirement (i.e., transmission of image data from sensor unit 102) is likely to be larger than the input bandwidth (i.e., receipt of commands from, for example, processor/controller 104). In one embodiment, the output bandwidth supports a "real-time" image capturing data rate. In this embodiment, the image data is provided to the processor/controller 104 in real time (i.e., while sensor unit 102 is measuring, sampling and/or capturing image data). The input signals, in this embodiment, may include commands from processor/controller 104, for example, start and configuration information.

In particular, in at least one example, the data rate may be in the order of 200 Million pixels per second for a 3 cm×3 cm lithographic stepper printing field, a sensor array 106 having 100 Million sensor cells 200 each having a 3 $\mu$m pixel size, and an exposure rate of ½ seconds per exposure. Further, where 8 bits are used to represent each pixel's gray level, the data rate is in the range of 1.6 G bits/second.

It should be noted that, as mentioned above, the transmission data rate may be reduced using a number of techniques including, for example, data compression, noise reduction and buffering (elastic or otherwise). Assuming 2:1 data compression, a desired output bandwidth may be in the range of 800 M bits per second (Mbps). In short, there are many techniques to reduce the bandwidth requirement; accordingly, all such techniques, whether now known or later developed, are intended to be within the scope of the present invention.

It should be further noted that in some embodiments, a Forward Error Correction (FEC) technique may be employed to reduce the amount of potential re-transmission due to error or loss, if any, during wireless transmission.

In certain embodiment, the image data measured, sampled, and/or captured by sensor unit 102 may not be transmitted to processor/controller 104 in real time (i.e., while the image is being measured and the sensor unit 102 is still on the stepper stage), but may be stored in memory 120 (FIGS. 3B and 3C). After the data collection and after the sensor unit 102 is unloaded from the stepper stage, the image data may be downloaded to processor/controller 104 through wired, wireless, and/or optical communications, for example, using connector 122.

Figure 3D:
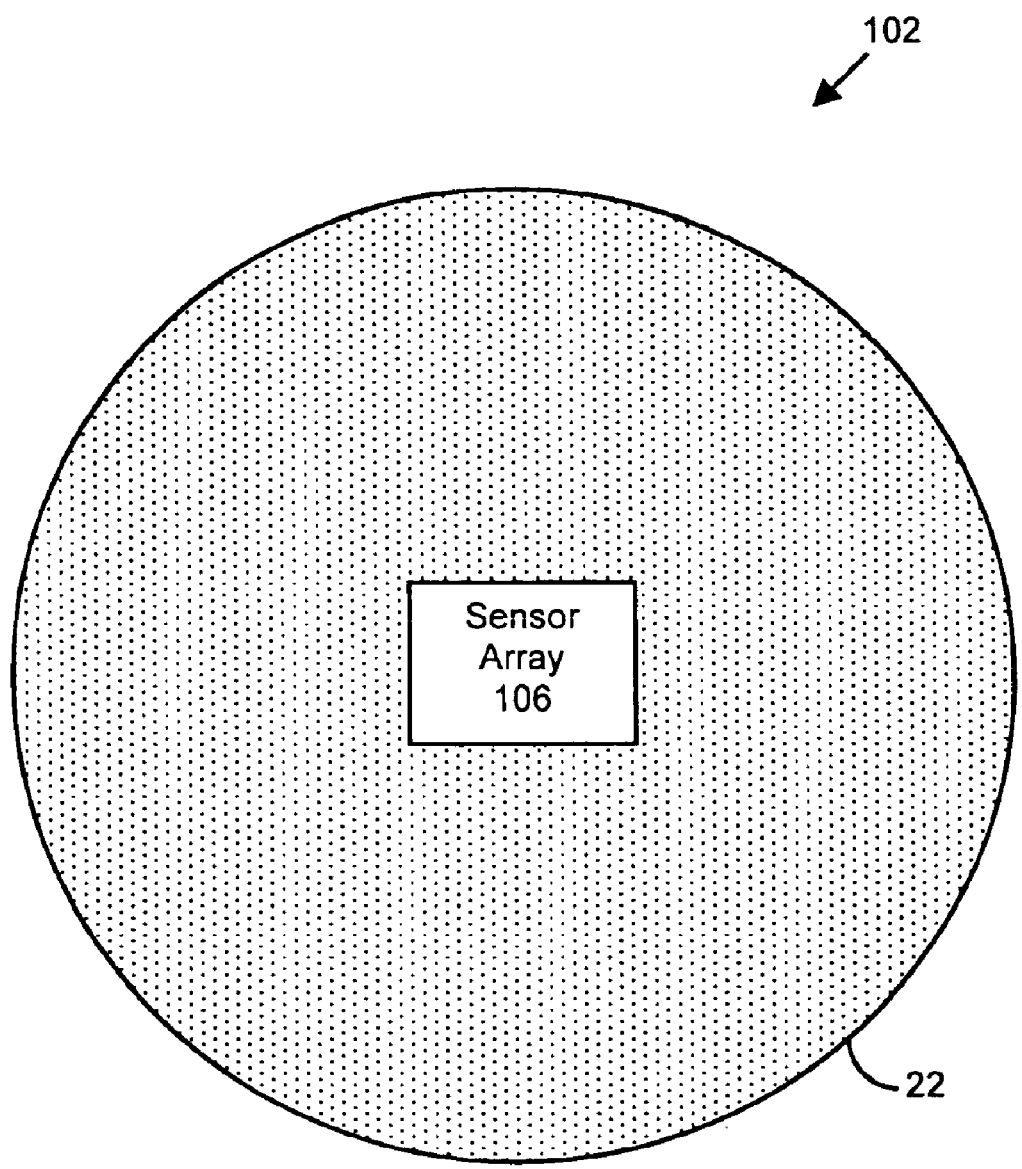
FIG. 3D is block diagram representation of an image sensor unit integrated on or in a chuck of lithographic equipment, according to one embodiment of the present invention.

With reference to FIG. 3D, in another embodiment, sensor array 106 may be disposed in, or integral with chuck 22 of lithographic equipment 10. In this embodiment, image sensor unit 102 need not be loaded into the lithographic equipment but may be positioned in the wafer plane (for example, by chuck 22) during inspection, characterization and/or evaluation of photomask 26 and/or the optical components of lithographic equipment 10. As mentioned above, electrical power may be provided to the components of image sensor unit 102 from lithographic equipment 10. Moreover, image sensor unit 102 may receive/provided data and commands using wired, wireless or optical communications.

The image sensor unit 102 of this embodiment may also include a controller, a source of electrical power, data compression circuitry, communications circuitry, memory and/or connector, as described above with respect to FIGS. 3A, 3B and 3C. This circuitry (and the functions performed thereby) may be integrated into components and/or circuitry in lithographic equipment 10 or external thereto. For example, the functions and operations performed by the controller of image sensor unit 102, as described above, may be undertaken or performed by a controller resident in lithographic equipment 10 or by a separate, dedicated device.

In addition, power to the components of image sensor unit 102 (for example, sensor array 106) may be provided by lithographic equipment 10 or by a dedicated power supply. Further, image sensor unit 102 may include separate communications circuitry, for example, components to implement wireless, wired and/or optical techniques; or image sensor unit 102 may employ the communication circuitry typically present in lithographic equipment 10.

In operation, image sensor unit 102 measures, collects, senses and/or detects an aerial image produced or generated by the interaction between photomask 26 and lithographic equipment 10 (whether in situ or not). In one embodiment, the image data which is representative of the aerial image is collected by repeatedly exposing sensor array 106 with a spatial shift (relative to the aerial image) between exposures. After each exposure, the sensor array 106 provides a sparsely sampled sub-image frame, which may be referred to as a sub-image or sub-frame in discussions below. The sub-images are interleaved to generate, create, provide and/or build-up the full-field image or to extract desired information directly without reconstructing the aerial image.

Figure 13A:
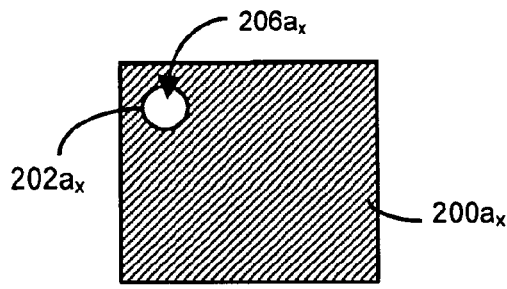

In particular, with reference to FIGS. 12A–C and 13A–E, in one embodiment, sensor array 106 is located in a first location relative to the aerial image projected on the wafer plane (See, for example, FIG. 13A). While in the first location, the aerial image is measured, sensed, detected and/or sampled by sensor cell 200$ax$–200$gx$ ($x=1$ to 7) and the data representative of the sample or measured values are provided to the other circuitry on image sensor unit 102 (for example, data compression circuitry 112, transmitter 114, and/or memory 120) for processing, transmission and/or storage.

Figure 13B:
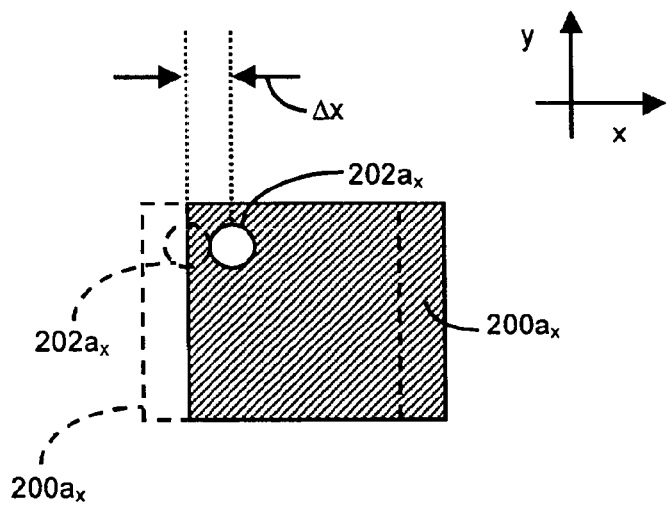

The sensor array 106 is then moved to a second location, via chuck 22, a distance $\Delta x$ from the first location (see, for example, FIG. 13B). In one embodiment, $\Delta x$ is substantially equal to the diameter or size of apertures 206. In another embodiment, the spatial shift is substantially equal to the "effective" active area 202 of sensor cell 200. Where the diameter or size of apertures 206 is about 75 nm, the spatial shift of a distance $\Delta x$ may be about 50 nm to about 75 nm.

While in the second location, the aerial image is again measured, sensed, detected and/or sampled by sensor cells 200$ax$–200$gx$ ($x=1$ to 7). The measured or sampled values (data representative of the aerial image) are again provided to the other circuitry on image sensor unit 102 (for example, data compression circuitry 112, transmitter 114, and/or memory 120) for processing, transmission and/or storage.

Figure 13C:
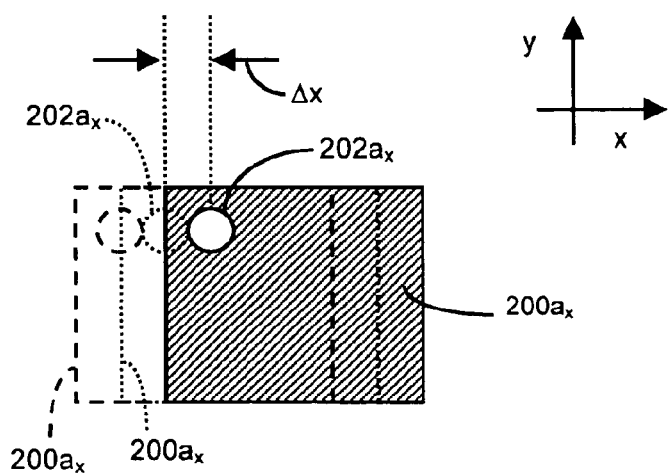

The sensor array 106 is then moved to a third location (a distance $\Delta x$ from the second location) and the aerial image is again measured, sensed, detected and/or sampled by sensor cells 200$ax$–200$gx$ ($x=1$ to 7) (see, for example, FIG. 13C). As before, the measured or sampled values are provided to the other circuitry on image sensor unit 102 for processing and/or storage.

Figure 13D:
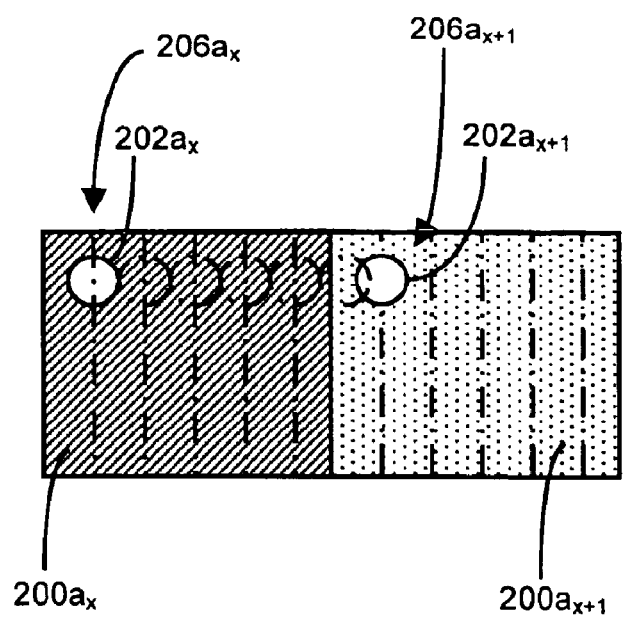
Figure 13E:
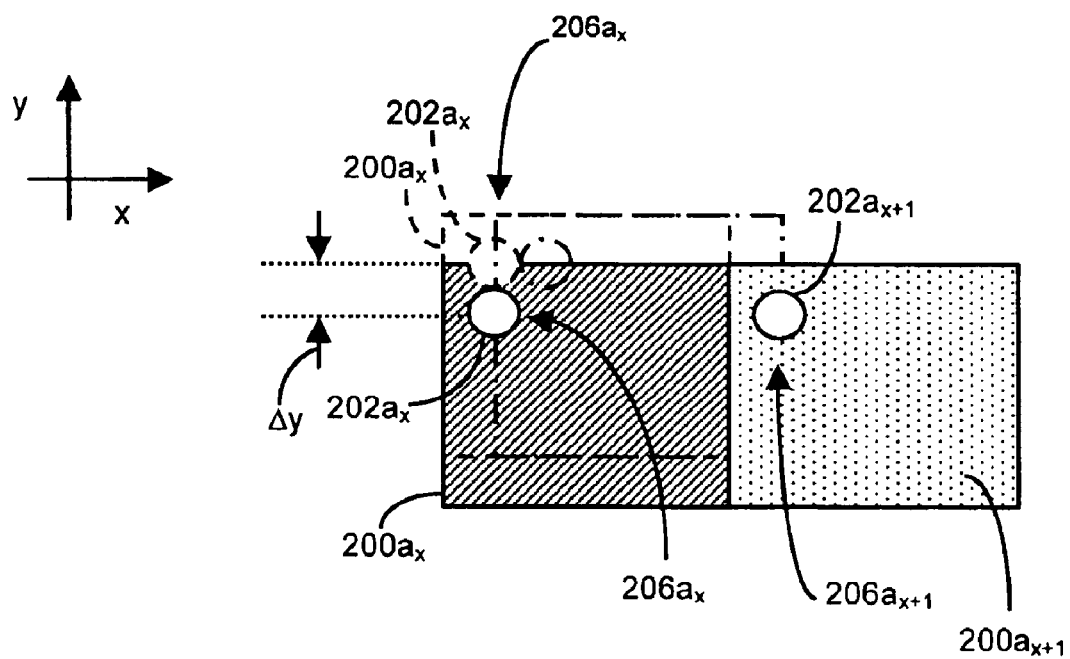

In one embodiment, this data collecting or sampling process continues in the x-direction until a portion of the aerial image that is collected by a given sensor cell 200 is contiguous (or substantially contiguous) with the first location collected or sampled by an adjacent lateral sensor cell (See, FIG. 13D). Thereafter, sensor array 106 (via chuck 22) is moved in the y-direction a distance $\Delta y$ from the previous location (See, FIG. 13E). In one embodiment, $\Delta y$ is substantially equal to the diameter or size of apertures 206. In another embodiment, the spatial shift $\Delta y$ is substantially equal to the "effective" active area 202 of sensor cell 200. Where the diameter or size of apertures 206 is about 75 nm, the spatial shift of a distance $\Delta y$ may be about 50 nm to about 75 nm.

While re-positioned a distance $\Delta y$, the aerial image is again measured, sensed, detected and/or sampled by sensor cells 200$a_x$–200$g_x$ ($x=1$ to 7). The measured or sampled values are provided to the other circuitry on image sensor unit 102 for processing, transmission and/or storage. The sensor array 106 is then moved to a distance $-\Delta x$ and the aerial image is again measured, sensed, detected and/or sampled by sensor cells 200$a_x$–200$g_x$ ($x=1$ to 7). This process is continued in the x and y directions until the aerial image (or portion thereof) is measured, sensed, detected, collected and/or sampled. That is, the sensor array 106 may be moved, positioned and/or re-positioned in an x and y direction until the entire, or selected portion of the aerial image has been measured, sensed, detected, collected and/or sampled. (See, for example, FIG. 12B) Thereafter (or simultaneously), the data measured, collected, sensed, detected and/or sampled at each location is processed and compiled into a full image (or portion thereof) that is representative of the aerial image formed by the stepper onto the wafer plane.

It should be noted that the data may also be collected in a vector fashion, for example, using absolute x and y coordinates to effectively guide the exposure to a particular portion of the aerial image. The data is collected, measured, sensed, detected and/or sampled in the same manner as described above. The aerial image may be processed and compiled in the same manner as well. In this way, particular area(s) of a mask may be examined in situ or certain locations or areas of the optical system of lithographic equipment 10 may be examined.

The size of the spatial shift may be a "pixel" of the final captured aerial image. In one embodiment, the spatial shift is equal to or substantially equal to the "effective" active area 202 of sensor cell 200. In another embodiment, the spatial shift is equal to or substantially equal to the size of aperture 206. In either embodiment, the data is collected or sampled in a raster fashion, for example, using "small" relative movement in an x and/or y direction. In this way, each exposure provides a sub-image or sub-frame; thereafter, all the sub-images are interleaved to build up the full-field (or partial-field) aerial image.

Since each sub-frame is captured by different exposures of the imaging field by lithographic equipment 10, there may be slight misalignment errors or a given amount of alignment offset between the sub-frames. These errors or offset considerations may be caused by non-perfect stage positioning repeatability. In a preferred embodiment, these errors or offsets may be calibrated by aligning each sub-frame image to database image, and, as such, be compensated in subsequent image processing steps. This sub-frame-to-database alignment step is called sub-frame alignment. Indeed, in one embodiment, historical data or the statistics of the sub-frame offset represents the stage's positioning repeatability, and hence may be used as information for stepper monitoring.

When the stage positioning is highly repeatability, for example, significantly smaller than of the pixel size (less than 20% of the pixel size), it may be possible to perform inter-sub-frame alignment without the database, to calibrate out the stage positioning offset errors between exposures. This step maybe accomplished through the optimization of the image and/or edge smoothness by fine adjustment of the relative position between the sub-frames. This alignment procedure, without database image, is called inter-sub-frame alignment. Like sub-frame alignment, the results of inter-sub-frame alignment may also be used as information for stepper monitoring.

In one embodiment, the image collecting and/or sampling technique employs the highly precise spatial positioning and/or movement of chuck 22 to collect and/or sample the aerial image. In another embodiment, chuck 22 and sensor 102 may remain stationary and the optics of lithographic equipment 10 and mask 26 may move.

As mentioned above, the sampled or measured values of sensor cells 200ax–200gx (x=1 to 7) may be "pixels" of the aerial image. In one embodiment, the "pixel" resolution may be equal (within 10% tolerance) or substantially equal (i.e., within 25% tolerance) to the dimensions of apertures 206ax–206gx (x=1 to 7). The size and/or shape of apertures 206 may be adjusted, designed or modified to accommodate a number of considerations including, for example, the features of the aerial image (critical dimensions), the fabrication techniques of the sensor array 106, the image acquisition time, the desired or necessary image resolution, and/or the wavelength of light 16. While illustrated as substantially circular in FIGS. 13A–E, the apertures 206 may be substantially square, rectangular, triangular or oval. Indeed, any shape may be implemented.

Moreover, the aperture may be shaped to match with certain test mask design pattern. For example, in certain application of the present invention such as focus analysis, the resolution along one direction may be most significant/important. Under that circumstance, the dimension of the aperture in the other direction may be larger to achieve higher photon passing rate.

It should be noted that the spatial shift $\Delta x$ and/or $\Delta y$ may be greater than or less than the diameter or size of apertures 206 and/or the "effective" active area 202 of sensor cell 200. In this regard, where the spatial shift $\Delta x$ and/or $\Delta y$ is less than the diameter or size of apertures 206 and/or the "effective" active area 202 of sensor cell 200, system 100 may be over-sampling the aerial image to, for example, provide a highly precise aerial image. Indeed, the over-sampled data may be used to confirm or verify the accuracy of surrounding data, or eliminate or minimize the need for data interpolation or extrapolation, or ensure that no spatial information is lost (i.e., the image between sampled pixels can be exactly interpolated (this is called the Nyquist theorem).

As described above, regardless of illumination, partial coherence, or reticle enhancement techniques on masks, in certain embodiments, the maximum spatial frequency in the light intensity distribution on wafer plane is $2 \times NA/\lambda$, where NA is the Numerical Aperture of the stepper projection optics, and $\lambda$ is the wavelength used in the imaging. Employing this relationship, the Nyquist sampling rate for aerial image in a stepper is $4 \times NA/\lambda$. As such, the pixel size may be at $p=\lambda/(4 \times NA)$ or smaller. For wavelength of 193 nm, and NA=0.75, the pixel size p may be 64 nm or smaller. For wavelength of 248 nm, and NA=0.65, the pixel size p may be 95 nm or smaller.

The pixel size may be equal or substantially equal to the shift between sub-frames. Therefore, with reference to FIG. 12B, when the distance between sensor cells 200 (the cell size may be equal to or substantially equal to as the distance between neighboring apertures 206) is C, in order to collect all spatial information, there will be a total of C/p sub-frames along x-direction, and all of them repeated C/p times along y-direction. As such, to collect or build-up a continuous full frame image, $(C/p)^2$ sub-frames should be collected. This determines the throughput of the full-field continuous aerial image capturing.

For example, where the size of sensor cell 200 is 9 $\mu$m, and a pixel size of 75 nm is employed, the total number of sub-frames required will be $(9000/75)^2=14400$. Under this circumstance, where a stepper takes 0.5 second to make one exposure, the total time required will be 7200 seconds, which is 2 hours.

Figure 14A:
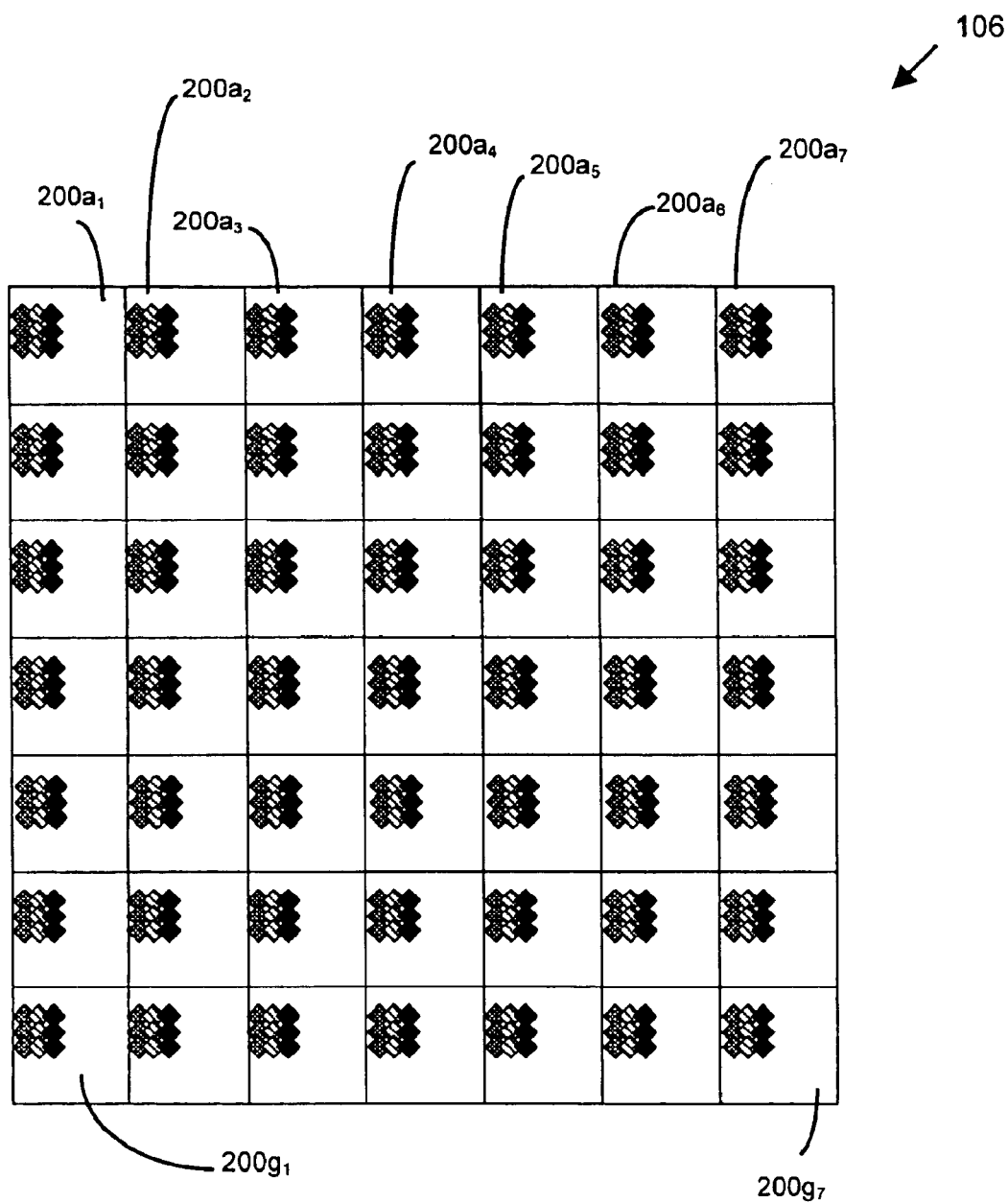
FIGS. 14A–C are representations of image collection techniques, in relation to the sensor array, according to certain aspects of the present invention.

In certain embodiments, the sampled areas are not continuous. For example, when the aerial image is used to map out the linewidth variation across the field (also called CD or critical dimension), collecting, sampling, measuring and/or sensing an entire full-field image may not be necessary or useful. In this regard, it may be sufficient to have blocks of small images distributed across the field, with each block sampled at Nyquist rate. With reference to FIG. 14A, in one embodiment, an array of image blocks where each block is sampled at Nyquist, and the block array covers the entire field. This sampling strategy may be called "block-mode sampling". In this embodiment, a continuous full field image is not generated, collected, sampled, sensed (compare FIG. 12B).

Using block-mode sampling, the image capturing time may be significantly reduced. For example, using the same considerations as described above, assuming a 2.25 $\mu$m×2.25 $\mu$m area for each block is to be collected, the number of sub-frames is reduced to $(2250/75)^2=900$, from the original 14400. This is a 15× reduction in data collection time.

Further, block-mode sampling may facilitate using a sensor array 106 having sensor cells 200 that are larger (for example, 10 $\mu$m, 20 $\mu$m, or larger). In addition, this sampling technique may permit use of the pixel decimation mode that is available in most CCD chips operations. The pixel decimation mode bins multiple neighboring cells into a single cell (for example, 1×2 or 2×2). This effectively enlarges the cell size and reduces the cell numbers, which thereby reduces the amount of data to be transmitted.

There are many applications that may employ block-mode sampling, for example: (1) full-field CD metrology; (2) full-field stepper lens aberration calibration; (3) full-field stepper printing field distortion calibration; and (4) full-field process window analysis. All such applications, whether now known or later developed, are intended to be within the scope of the present invention.

It should be noted that when implementing block-mode sampling, sporadic non-functional cells in sensor array 106 may not affect the functionality of the system 100 because the sampling technique inherently produces a loss of certain blocks; however, the across field statistics are still collected using the functional cells.

Figure 14B:
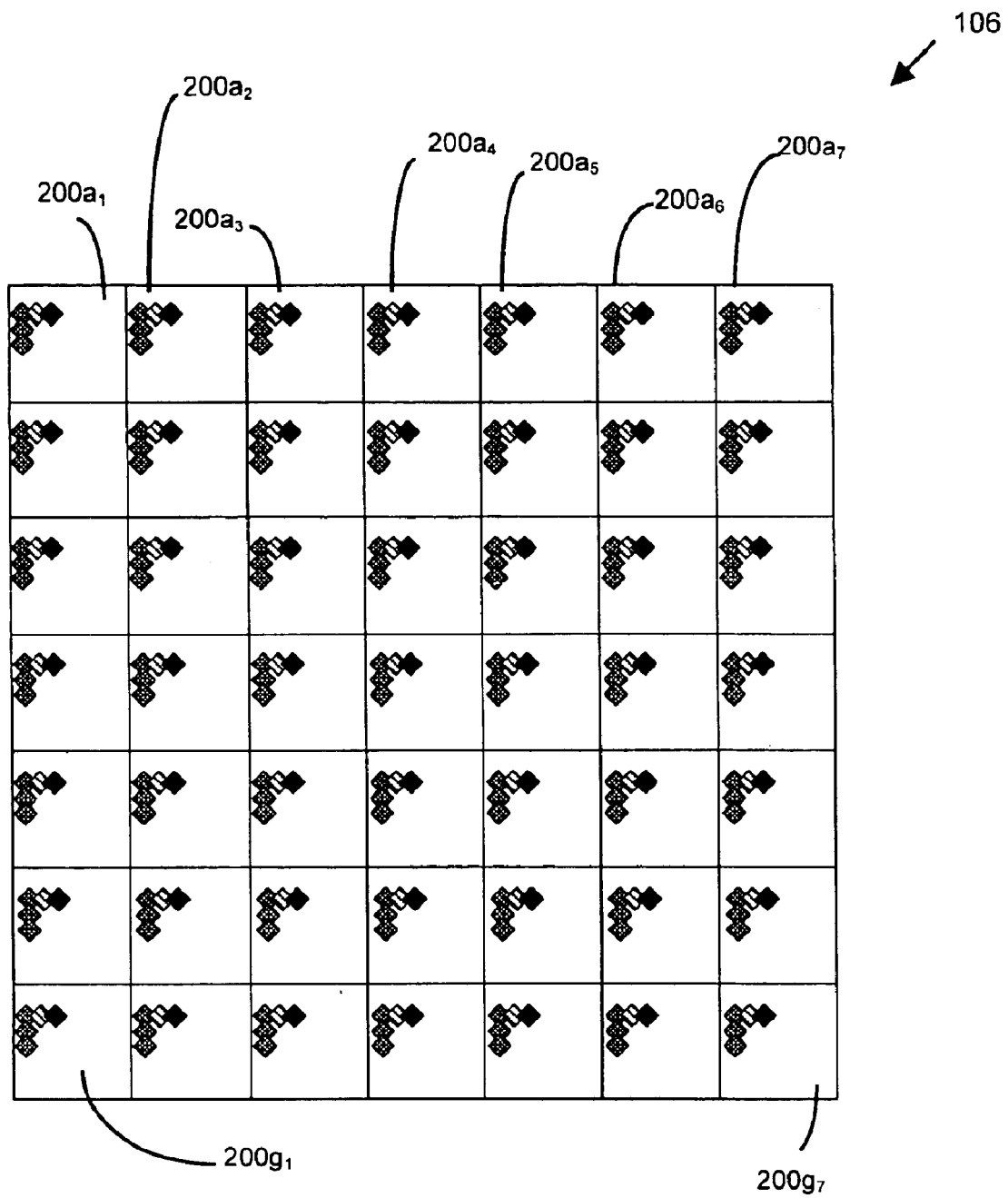

With reference to FIG. 14B, in another embodiment, the number of sub-frames may be further reduced to two one-dimensional samples. For example, where the application of the system 100 is to calibrate the focus plane location for x and y directional lines using a specially designed grating mask, the one-dimensional sampling along both x and y may suffice. The one-dimensional sampling may be either continuous or not continuous. Under this circumstance, and using the same considerations as described above, in a non-continuous application, the total number of sub-frames needed will be only (2250/75)+(2250/75)=60. In contrast, in the continuous application, the number of sub-frames will be (9000/75)+(9000/75)=240.

Figure 14C:
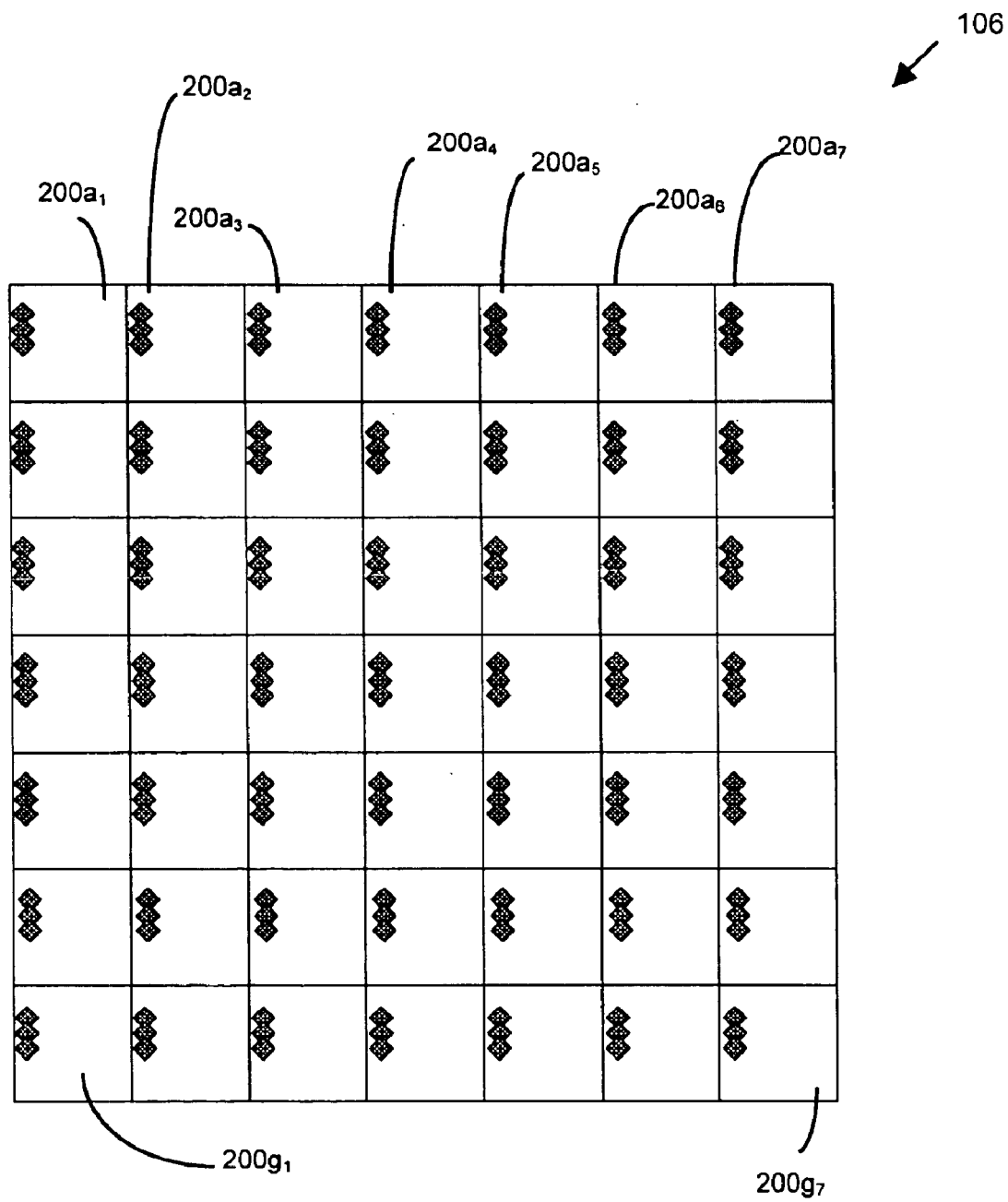

With reference to FIG. 14C, in another embodiment, one-dimensional sampling may be applied to any direction. In this regard, a 90-degree sampling technique is illustrated. Other one-dimensional sampling techniques may also be implemented (for example, 0-degree and 45-degree).

Sensor array 106 may be larger or smaller (or substantially larger or smaller) than the aerial image to be measured. In those circumstances where sensor array 106 is larger, certain sensor cells 200 may be located outside or beyond the projected aerial image (in either an x, y or x-y direction) and as such, a portion of the data measured by certain sensor cells 200, a certain portion of the data measured by sensor cells 200, or all of the data measured by certain cells 200 may be discarded because that data is not representative of, or related or pertinent to the aerial image. While some data may be discarded or unnecessary, where sensor array 106 is larger than the aerial image to be measured, any constraints, limitations or requirements of x-y alignment of the aerial image on the wafer plane may be reduced or eliminated altogether.

In those circumstances where sensor array 106 is smaller than the aerial image to be measured, chuck 22 may be positioned and repositioned, in a tile or block like manner, to collect the entire image (see, for example, FIGS. 15A–B, 19 and 20). The dimensions of each tile or block may be equal to or substantially equal to the dimensions of sensor array 106. When positioned at a first location, sensor array 106 may collect an image data set, as described in detail above, of the aerial image projected at that position. Thereafter processor/controller 104 may process the image data set measured, collected, sensed and/or detected at each position to generate or create an aerial image for each responsive position. The processor/controller 104, in turn, may then connect or combine the pieces or portions of the aerial image in a mosaic-like fashion, to produce a larger portion, or the entire, aerial image.

Figure 15A:
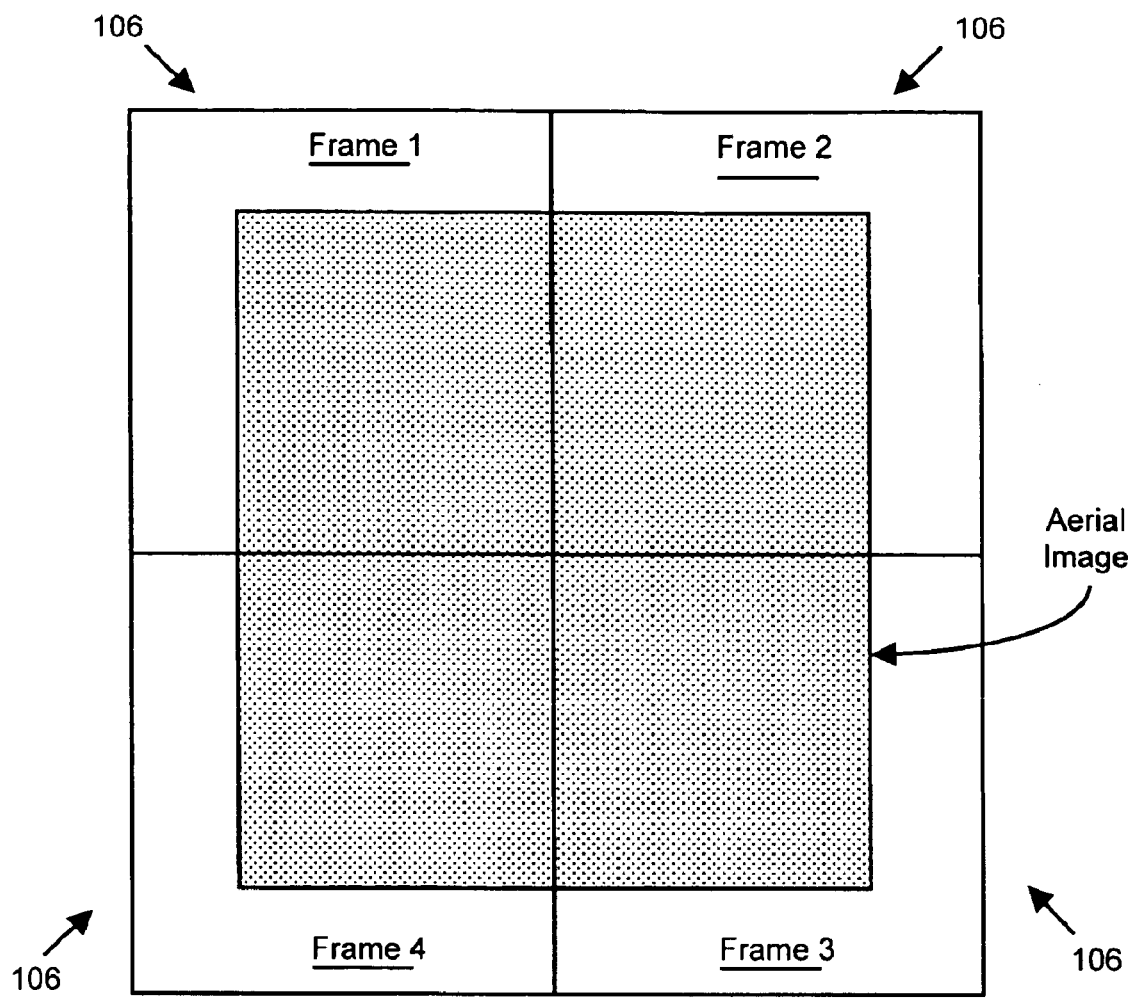
FIGS. 15A and 15B are exemplary representations of an image collection technique, in relation to a sensor array that is smaller than the aerial image to be collected, according to certain aspects of the present invention.
Figure 15B:
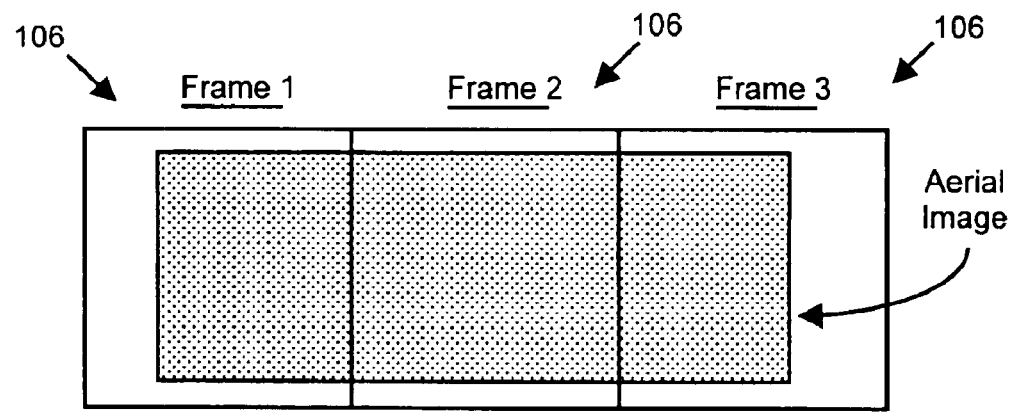

In particular, with reference to FIGS. 15A and 15B, while sensor array 106 is appropriately positioned, a first frame (i.e., Frame 1) is sampled and collected, as described above with respect to FIGS. 12A–C, 13A–E and/or 14A–C. Thereafter, sensor array 106 may be re-positioned to sample and collect a second frame (i.e., Frame 2), again as described with respect to FIGS. 12A–C, 13A–E and/or 14A–C. The other frames (if any) may be collected in the same manner. The aerial image is generated using the data sampled and collected for each frame.

Figure 16:
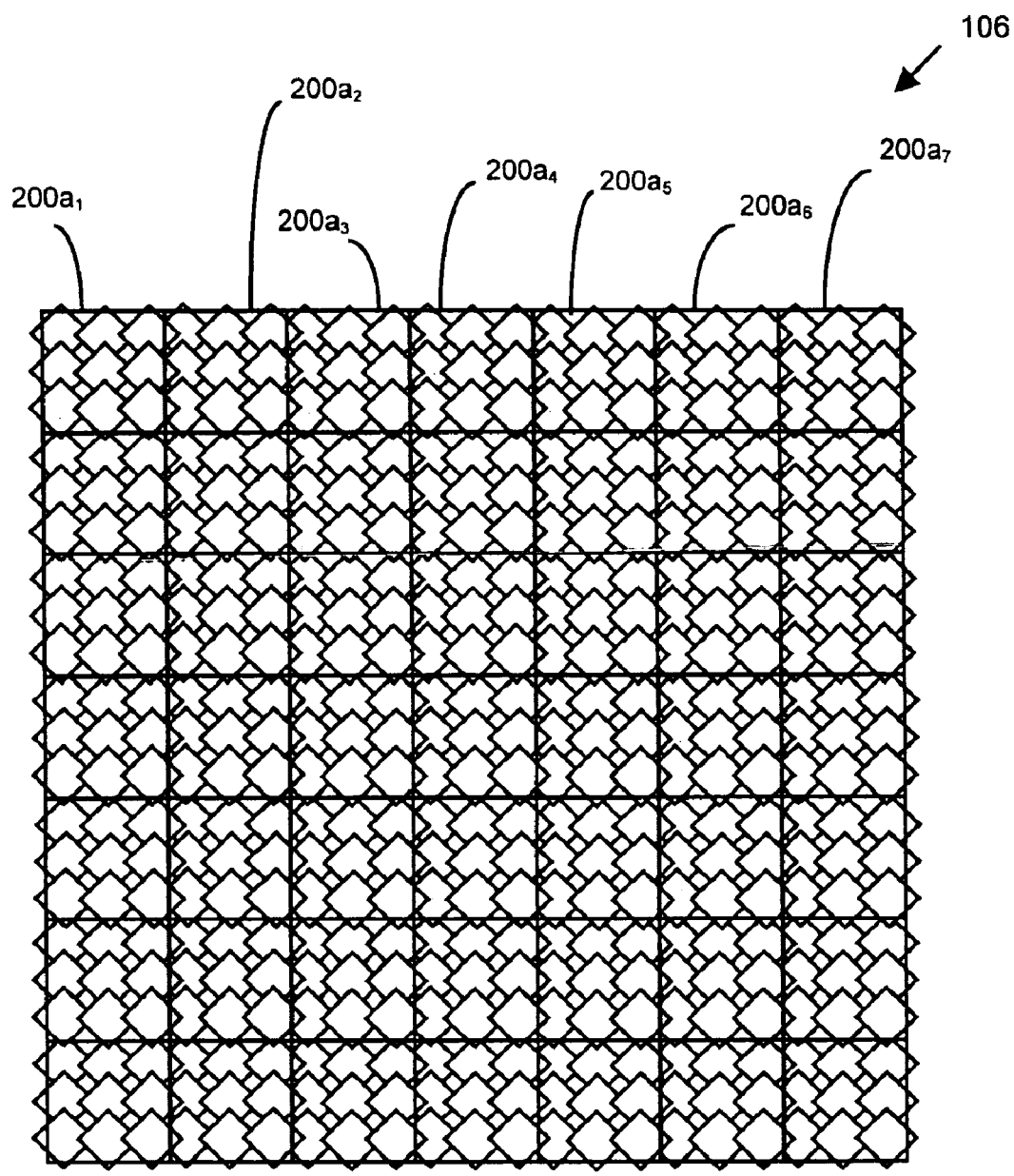
FIG. 16 is a representation of an image collection technique, in relation to the sensor array, according to another aspect of the present invention.

The present invention may be implemented to detect or inspect for contamination, for example, mask contamination or optical lens contamination. In this regard, the contamination refers to those that create large-area but small-magnitude intensity change in the final aerial image. In one embodiment, the aerial image may be collected, sampled and/or measured, below the Nyquist rate. With reference to FIG. 16, the aperture size may be larger than the aperture size determined above. In this embodiment, the appropriate aperture size to be used may depend on the size of the contamination defects that need to be captured. It should be noted that both the aperture size (graphically represented by the dots) and pixel size (the spacing between dots) are enlarged.

Figure 17:
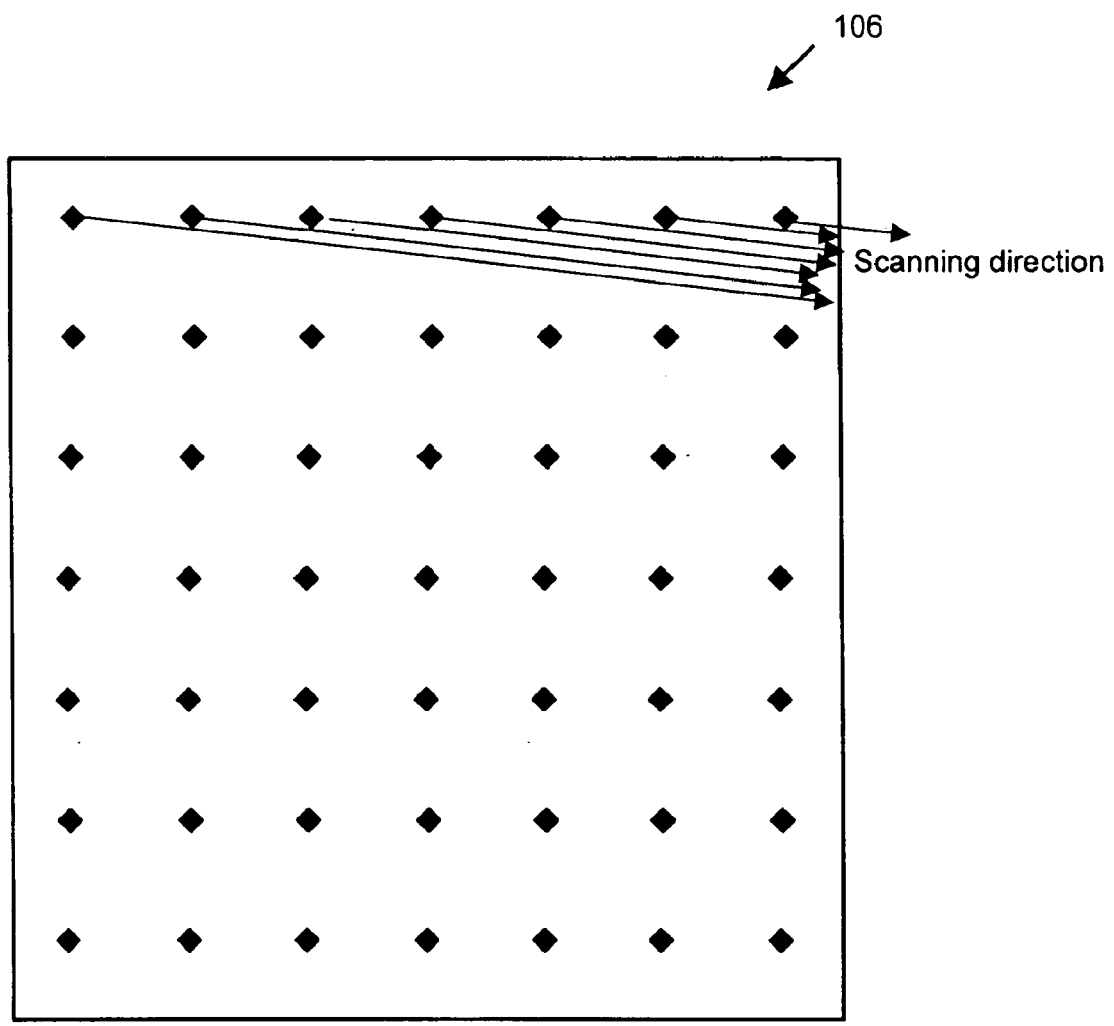
FIG. 17 is a representation of the image collection technique, in relation to the sensor array, according to another aspect of the present invention.

In another embodiment, system 100 may collect image data using sensor unit 106 by scanning sensor array 106 across the image field. With reference to FIG. 17, in one embodiment, a complete (or partial) aerial image is collected, measured, sampled or built-up by scanning sensor cells 200 in one direction at a small angle to the array x-coordinate such that all y-adjacent pixels on the image are covered by one scan.

It should be noted that other scanning or imaging techniques using image sensor unit 106 may be implemented to collect, measure, sample and/or build-up a complete (or partial) aerial image. All such techniques, whether now known or later developed, are intended to be within the scope of the present invention.

As mentioned above, the data which is representative of the aerial image (measured, collected, sampled, captured by sensor cells 200) is processed by processor/controller 104 to generate the aerial image projected on the wafer plane. In one embodiment, the aerial image is formed by the same imaging path of lithographic equipment 10 (including mask 26) that is used to print product wafers. By monitoring the actual aerial image, the present invention enables the end-to-end, close-loop process optimization. That is, optimization from design and fabrication of mask 26, to lithographic equipment 10 selection, to set-up of lithographic equipment 10.

When employed as a lithography inspection system 100, the present invention may automatically compensate for the defects that are anticipated or expected to occur during processing, i.e., mask, illumination, optics, contamination, and interactions there between. Obtaining the aerial image projected on the wafer plane also enables analysis of the impact on printability and yield of a defect detected and/or sensed, thereby allowing full lithography process integrity control.

The system of the present invention may also facilitate isolating sources of errors or problems caused or produced during the lithography process. For example, the impact of a given defect in mask 26 may be determined by substituting a mask having the same pattern thereon for the "defective" mask. Since lithographic equipment 10 remains constant, if the defect is again detected or measured in the aerial image, that defect may be attributed to the optics of lithographic equipment 10. However, if the defect is not detected or measured, that defect may be attributed to the "defective" mask. In this way, the sources of errors or problems may be isolated to the mask or lithographic equipment 10.

It should be noted that the image may also isolate imaging problems from resist development and substrate etching, providing critical or useful information for process development. Moreover, the present invention may also be used, in conjunction with software emulating the resist processing, to predict the developed resist image. Indeed, the present invention may be used, in conjunction with direct SEM inspection of the developed resist image, to verify the above emulation. In fact, the aerial image captured using the present invention, in conjunction with SEM inspection of the final developed resist image, may be further used to extract accurate resist models.

In addition to the capabilities of aerial image monitoring and defect inspection discussed above, the present invention(s) may also be implemented in wafer pattern metrology. In this regard, the present invention(s) may facilitate full-field, non-destructive, in-situ, and real circuit pattern or critical dimension measurements by comparing the sensed image to the mask pattern design database. In certain instances, it may be necessary to convert the polygon data within the design database to intensity data. Alternatively, the data representative of the information sampled, measured, detected, and/or sensed may be converted to data that permits comparison to the polygon data maintained in the design database.

The inventions described herein may also be used in stepper calibration (for example, aberration and field distortion calibration). Information captured, obtained and/or calculated during image processing, may also be used for stepper monitoring. For example, the sub-frame alignment offset may be used to monitor stage positioning repeatability, and the image quality may be used to monitor stepper lens contamination and lens drift.

It should be noted that one task of the algorithm(s) implemented by processor/controller 104 may be image processing to reconstruct the original un-filtered aerial image. Such image processing may involve deconvolution or other techniques of two-dimensional image processing.

As mentioned above, in certain embodiments, the image processing algorithms may be implemented before a full image is received, sampled, measured and/or captured by sensor unit 102. For example, processor/controller 104 may begin processing data received from sensor unit 102 before a full image is provided and/or sampled, measured and/or captured by sensor unit 102. In this regard, processor/controller 104 may initiate and implement decompression, data structure setup, sub-frame alignment, inter-sub-frame alignment, and noise reduction algorithms.

As mentioned above, in certain applications, a database image is employed to maintain the theoretical aerial image based on the mask pattern design and the ideal optics. As such, in certain embodiments, because the computation of the database image is extremely intensive, it may be advantageous to compute the database image "offline" and stored in the image computer in certain data structure that is easy to be retrieved and assembled. This offline database computation may use storage space, but the reduction in real time computation may present economical architectural advantages for system 100. Furthermore, when the computed database is stored, it may be stored in compressed format (lossless compression) to minimize or reduce the necessary storage space. Such compression may be very effective (for example, better than 5:1) for database images, since there is no noise in the database image.

For some applications, for example, CD metrology, processing window analysis, and mask design verification, the aerial image may be reconstructed. Yet for some other applications, the actual aerial image need not be reconstructed, but the sensor image itself may suffice, for example, image field placement distortion, and mask defect inspection. When performing Die-to-Die (D:D) mask inspection, direct comparison between the sensor images from multiple dice may be suitable. For Die-to-Database (D:DB) mask inspection, the database may be directly rendered to its theoretical image under "ideal" stepper and sensor configuration, and, as such, allow the D:DB inspection by comparing the sensor image to that "theoretical" database image.

In those instances where mask 26 includes OPC or PSM decoration/features, the database used in D:DB mask inspection may be either the one with the decoration, or the one without decoration. The database with decoration is typically used to make the mask, and is expected to be consistent with mask 26. The database without decoration is generally known as the "design-target" (i.e., the target on-wafer image which combines the effect from OPC/PSM decoration and the imaging path of the stepper). When using database with decoration, the database rendering should fully consider the stepper optics effect. When using the design-target database, the stepper imaging effect is already embedded and hence need not be computed again.

In one embodiment, the D:DB inspection method may include the comparisons of the: (1) decorated image to the sensor image or reconstructed aerial image (using sensor unit 102) and (2) design-target to the sensor image or reconstructed aerial image. In this embodiment, the decoration is inspected or verified through using the sensor image or reconstructed aerial image. For example, where there is an error in the decoration (for example, the OPC software made a mistake in decoration), and the mask is made "correctly" that is, the decoration is accurately produced according to the OPC software, the optical image produced by that mask will show that there is no defect when compared with the decorated database. However, the optical image produced by that mask will reveal a defect when compared with the design-target, and hence an OPC decoration error may be detected.

Thus, the present invention may be employed, for example, in: (1) stepper development, including lens aberration calibration, focus calibration, field distortion calibration, illumination calibration; (2) stepper qualification, including separation of stepper errors from resist development and etching errors, aerial image quality assessment; (3) stepper monitoring, including contamination monitoring, stage positioning repeatability monitoring, stepper aberration monitoring, illumination drift monitoring; (4) process development, including process window analysis, resist model extraction; (5) full field metrology, including linewidth (CD) measurement, contact energy measurement; (6) mask inspection, including D:D and D:DB inspection, mask contamination inspection; (7) mask design verification, including OPC and PSM decoration verification; (8) process optimization, including mask-specific adjustment and centering of process window, selection of optimization of mask-stepper pairing, adjustment of stepper parameters (for example, illumination filter, partial coherence, pupil filter, and so on) using mask-specific aerial images; (9) design to process optimization, including aerial image analysis to capture potential yield-loss hot spots, Design-Rule-Checking (DRC) on aerial images; (10) design verification and optimization, for example, extraction of electrical performance information, such as resistance, current, voltage, timing, noise, power, etc from a set of aerial images, and the subsequent use of such extract electrical performance data of the circuit for design optimization; and (11) failure analysis, for example, use the aerial images to analyze the potential failure mechanism (e.g., overlay-induce shorts) if the chip does not work as designed. Indeed, all applications of the present invention(s), whether now know or later developed, are intended to come within the scope of the present invention(s).

It should be noted that lithographic equipment 10 and/or processor/controller 104 may employ system 100, in conjunction with control software of lithographic equipment 10, to enable rapid and/or real-time optimization. In one embodiment, the system of the present invention may be combined with a specially designed mask to monitor the lithographic equipment 10, for example, optical aberration, field distortion, and illumination. The system 100 may then provide the real-time feedback to control software of lithographic equipment 10 (for example the stepper) to implement system modifications to minimize the aberrations and field distortion, and improve the illumination uniformity across the imaging field.

In another embodiment, the system of the present invention may directly sense the aerial image of the production mask, and compute the adjustment to the stepper settings to optimize the aerial image quality. This may facilitate mask-stepper-combination-specific optimization. For example, where the mask has a slow spatial CD variation, the system of the present invention may measure and detect that CD variation and feedback the suggested changes to the stepper illumination settings across the field to compensate the mask's CD non-uniformity. For certain areas that have a smaller CD than expected or permitted, the stepper may add more illumination dose to compensate for such an imperfection. Such a feature may significantly enhance the parametric yield of the lithography process, since it is well known in the art that CD uniformity directly translates into the speed at which the IC chip can be run.

In another example, the images captured using the system of the present invention may be used to adjust and center, for each mask-stepper combination, the optimal process window, allowing more robust and higher yield IC fabrication.

The system of the present invention may also be implemented to optimize for specific product masks. For example, where the locations of critical patterns are known, apertures 206 may be located to be more rapidly and easily aligned with the critical patterns. Indeed, the shape of apertures 206 may also be selected to better suit such an application. This may significantly improve the speed of image capturing, since there is no need to capture the sub-frames that do not contain the critical patterns.

Further, the customized aperture shape may significantly improve the performance of the monitoring. For example, the customized aperture shape may significantly improve monitoring gate linewidth CD in, for example, a microprocessor. Thus, in those instances where the locations of the critical-path transistors are known, apertures 206 may be located, positioned or aligned with the location of the gates of those transistors in order to more rapidly and accurately monitor the CD of such integrated circuits. Moreover, the shape of apertures 206 may also match the gates.

Yet another application in analyzing the aerial image is to combine images from multiple exposures. In this regard, for some PSM designs, multiple masks are made to expose the same layer. For example, in one implementation of alternating-PSM (see, for example, U.S. Pat. No. 6,228, 539), a first mask has multiple phases, and a second mask (called trim mask) has only a single phase, and both masks are exposed on the same layer to create the desired effect in the photo-resist. The system of the present invention may record the sensed aerial image from the first mask, then the sensed aerial image from the second mask is added to the first aerial image, and hence obtain the combined effect of the two masks in the photo-resist. The combined image may then be used to compare with the design-target image, for mask inspection, or for verifying the PSM design and decorations.

In the case of multiple masks, the individually captured aerial images of each mask may be further used to optimize the combination in actual process, for example, relative dose. The individually captured aerial images may also be used to analyze the process tolerance, for example, the overlay tolerance between the two masks, and where the most defect-prone spots are located. This inter-layer analysis may not only be applied to the multiple-mask-single-layer case as described above, but also between different adjacent layers on the circuit, for example, to analyze and optimize the interlayer overlay tolerance between the poly-gate layer and the contact layer using the aerial images from those two layers.

Yet another potential application of aerial images captured from multiple exposures is to analyze and inspect the phase information in PSM. For example, multiple aerial images can be captured at different focus planes for a PSM, and the images from these multiple focus planes can be used to extract the phase shift amount for each phase-shift region on the PSM, and be compared and verified again design.

The system of the present invention may also be used in Statistical Process Control ("SPC"). In this regard, the system 100 monitors the stepper performance every time it is used, and hence tracks the history of the performance of the stepper to provide, for example, preventive maintenance alerts.

The system of the present invention may also be used to inspect and optimize certain maskless lithography technologies. "Maskless lithography technology" generally refers to the lithography techniques that do not use a mask, rather the patterns are written on the wafer directly by the lithography tool, e.g., an electron-beam direct-write lithography tool. One category of maskless lithography technologies includes a "programmable mask", i.e., the pattern is still defined by a "mask", but the mask is programmable using the database and directly resides in a lithography tool, e.g. a micro-mirror array where each mirror can turn on and off of a pixel.

In the maskless technology that uses a programmable mask, there will be no mask to inspect. One way to assure the quality of the programmed mask and the quality of the printed pattern is to directly measure, analyze, and/or inspect the aerial image generated or produced by this maskless lithography system using the sensor unit 102 and the techniques described above. Under this circumstance, the aerial image analysis may be directly feedback to the maskless lithography system, to adjust and optimize the programming of the programmable mask, and thereby enable direct lithography quality optimization.

As mentioned above, in one aspect the present invention may be (or be implemented in) an imaging system that generates or produces the same or substantially the same aerial image (or producing, sampling, collecting and/or detecting information relating to), with the same or substantially the same spatial resolution, as certain lithographic equipment (for example a particular stepper system having a given set of parameters, features or attributes). In this regard, the imaging system emulates that lithographic equipment. Thus, in this embodiment, the imaging system includes a precision mechanical movement stage having the same or substantially the same mechanical precision and controllability as lithographic equipment. The imaging system may be employed as a standalone aerial image monitoring tool that may be used in the reviewing of the aerial image of a mask under the predetermined optic sub-system.

The stepper-like tool (stepper, mini-stepper, or other imaging optics) together with system (or portions thereof described above with respect to image sensor unit 102 and processor/controller 104 may be a stand-alone aerial image inspection tool. This stand-alone tool may be employed, for example, to perform mask inspection and/or mask defect review. In this embodiment, the aerial image is sensed directly, at high-NA and at the same magnification as on the product wafer. As such, not only is the wavelength and partial coherence matched (or substantially matched), but also the NA is matched (or substantially) with actual steppers, eliminating the potential deviation from actual aerial image when vector field in EM wave is considered. In this regard, the fidelity of the aerial image may be improved.

It should be noted that the discussions of, for example, image sensor unit 102 and processor/controller 104, are fully applicable to this aspect of the present invention. For the sake of brevity, those discussions will not be repeated.

There are many inventions described and illustrated herein. While certain embodiments, features, attributes and advantages of the inventions have been described and illustrated, it should be understood that many other, as well as different and/or similar embodiments, features, materials, attributes, structures and advantages of the present inventions, are apparent from the description, illustration and claims. As such, the embodiments, features, materials, attributes, structures and advantages of the inventions described and illustrated herein are not exhaustive and it should be understood that such other, similar, as well as different, embodiments, features, materials, attributes, structures and advantages of the present inventions are within the scope of the present invention.

It should be noted that while the present invention(s) is described in the context of measuring, inspecting, characterizing and/or evaluating optical lithographic equipment, methods, and/or materials used therewith, for example, photomasks, the present invention may be used to measure, inspect, characterize and/or evaluate other optical systems. Indeed, the image sensor unit described herein may be used to measure, inspect, characterize and/or evaluate microscopes and telescopes. Or, the present invention can be combined with a microscope or telescope optics and a precise mechanic stage, to realize sub-optical-wavelength resolution in image sensing. As such, any optical system, method and/or material used therewith, whether now known or later developed, are intended to be within the scope of the present invention.

Moreover, it should be noted that while the present invention(s) is described generally in the context of integrated circuit fabrication, the present invention(s) may be implemented in processes to manufacture other devices, components and/or systems including, for example, photomasks, hard disk drives, magnetic thin-film heads for hard disk drives, flat panel displays, and printed circuit board. Indeed, the present invention(s) may be employed in the fabrication of any devices, components and/or systems, whether now known or later developed, that may benefit (in whole or in part) from the present invention(s).

For example, in other applications or industries, substrate 118 may take a different form factor and may be made from different materials. For example, in photomask manufacturing, using laser exposure or other optical imaging exposure techniques, the substrate may be a mask blank (glass or quartz), or other material with the same shape of a photomask (which maybe a square plate of 5 or 6 inches each side, with thickness of a few millimeters). In Flat Panel Display manufacturing, the substrate may be a high quality glass plate of a predetermined shape and size. In hard disk drive manufacturing, the substrate is also wafer-like, but made from different materials. In printed circuit board (PCB) manufacturing, the substrate is a circuit board. It should be noted that the present invention(s) may be implemented using the given (different) substrate form-factors and/or materials of the particular application in which the invention is implemented. Such substrates may include one, some or all of the functionalities and capabilities described herein. Indeed, other functionalities and capabilities may be desired depending upon the particular application in which the invention is implemented.

It should be further noted that there are many techniques and materials (and, as a result, structures created thereby) for enhancing the spatial resolution and/or sensitivity of sensor cells 200. Indeed, there are many techniques and permutations of depositing, growing and/or forming opaque film 204, apertures 206, detection enhancement material 208 and/or photon-conversion material 210. All techniques and materials, and permutations thereof, that enhance, limit or restrict the spatial resolution of active areas 202 of sensor cells 200, whether now known or later developed, are intended to be within the scope of the present invention.

Further, while apertures 206 have been generally illustrated as having substantially vertical sidewalls, the sidewalls may include a tapered edge. Such sidewalls may be formed using a variety of fabrication techniques. For example, apertures 206 may be formed using a combination of anisotropic and isotropic etching techniques that form a tapering at the edges of the sidewalls after the relatively vertical etch is completed.

Indeed, another technique of limiting, restricting or enhancing the spatial resolution or sensitivity of sensor cells 200 of sensor array 106 is to employ anomalously high transmission of light or photons in arrayed apertures in a film (see, for example "Extraordinary Optical Transmission through Sub-wavelength Hole Arrays", T. W. Ebbesen et al. Nature 391, 667, (1998) and T. J. Kim et al. "Control of Optical Transmission through Metals Perforated with Sub-wavelength Hole Arrays", Optics Let. 24 256 (1999), the contents of which are hereby incorporated by reference). Where the film includes more than one aperture per active area/sensor cell, the system 100 may employ deconvolution or other image processing techniques to appropriately characterize, sense, detect, measure and/or sample the aerial image of mask 26 as projected at the wafer plane. Indeed, more than one aperture may be avoided by using blind (partially milled or etched) apertures or other surface modifications.

In addition, there are many techniques implemented by the structures of the inventive sensor unit. For example, communications between sensor unit 102 and processor/controller 104 may be via electronic, optical, wired or wireless. As such, suitable circuitry (for example, transmitters, receivers, connectors, data compression circuitry, controller and memory) may be implemented on or in sensor unit 102 to accommodate the various means of communication (see, for example, FIG. 3A (primarily wireless), FIG. 3B (wireless, optical and/or wired) and/or FIG. 3C (primarily optical and/or wired)). Indeed, all forms of communication, whether now known or later developed are intended to fall within the scope of the present invention.

Moreover, the communications of the data representative of the aerial image may be during data collection and/or after data collection. Such communication may be while sensor unit 102 resides in the lithographic equipment (for example, during data collection) or while the sensor unit is external to the lithographic equipment (for example, after data collection). Indeed, sensor unit 102 may include sufficient memory (for example, DRAM, SRAM, or flash) to store some or all of the data representative of the aerial image in order to increase the flexibility of data transmission (i.e., when such data is transmitted and how such data is transmitted). Indeed, in those instances where sensor unit 102 is transmitting data during collection, memory 120 may be employed as a buffer for such data communications/transmission.

In addition, it should be noted that although sensor cells 200 of sensor array 106 have been described above to be arranged in an array configuration, other configurations may be suitable. Moreover, the number of sensor cells 200 employed to comprise sensor array 106 may be selected based on various considerations, including, for example, data collection time, the size of the aerial image at the wafer plane, the spatial resolution of the data collection, and/or the spatial resolution of active areas 202 of sensor cells 200.

It should be further noted that the dimensions of sensor array 106 may depend on a number of considerations including, for example, the number of sensor cells 200 employed, the size of the aerial image at the wafer plane, the spatial resolution of the data collection, the spatial resolution of active areas 202 of sensor cells 200, constraints based on the data collection time, and/or data collection techniques. In one embodiment, the sensor array 106 is approximately 27 mm×33 mm and the aerial image (at the wafer plane) is about 26 mm×32 mm.

As mentioned above, sensor cells 200 may be CCDs, CMOS sensor devices, photodiode devices or the like. Moreover, sensor cells 200 may be a combination of such devices. Indeed, any device(s) that measures, senses, detects and/or samples light, whether known or later developed, is intended to fall within the scope of the present invention.

Figure 18A:
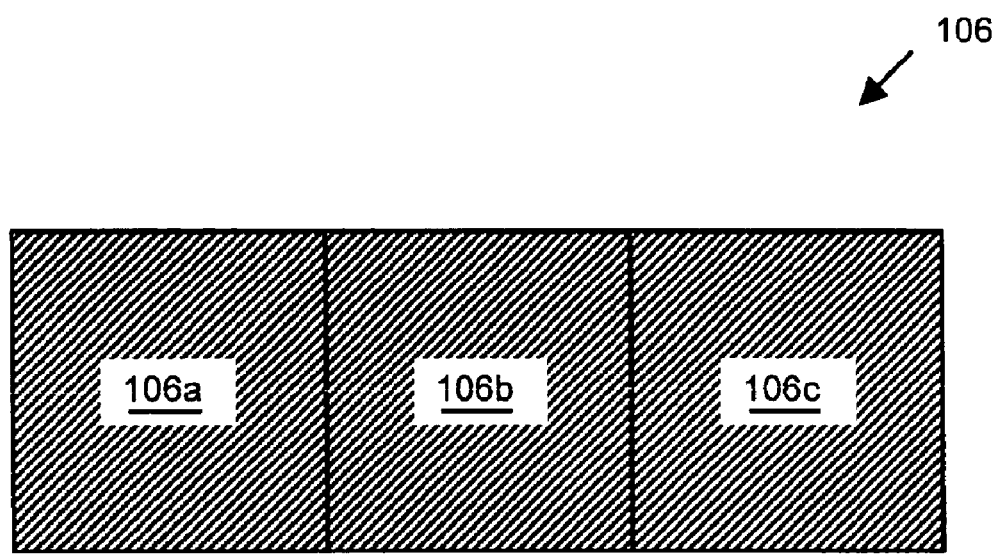
FIGS. 18A and 18B are block diagram representations of a sensor array having a plurality of sub-sensor arrays.
Figure 18B:
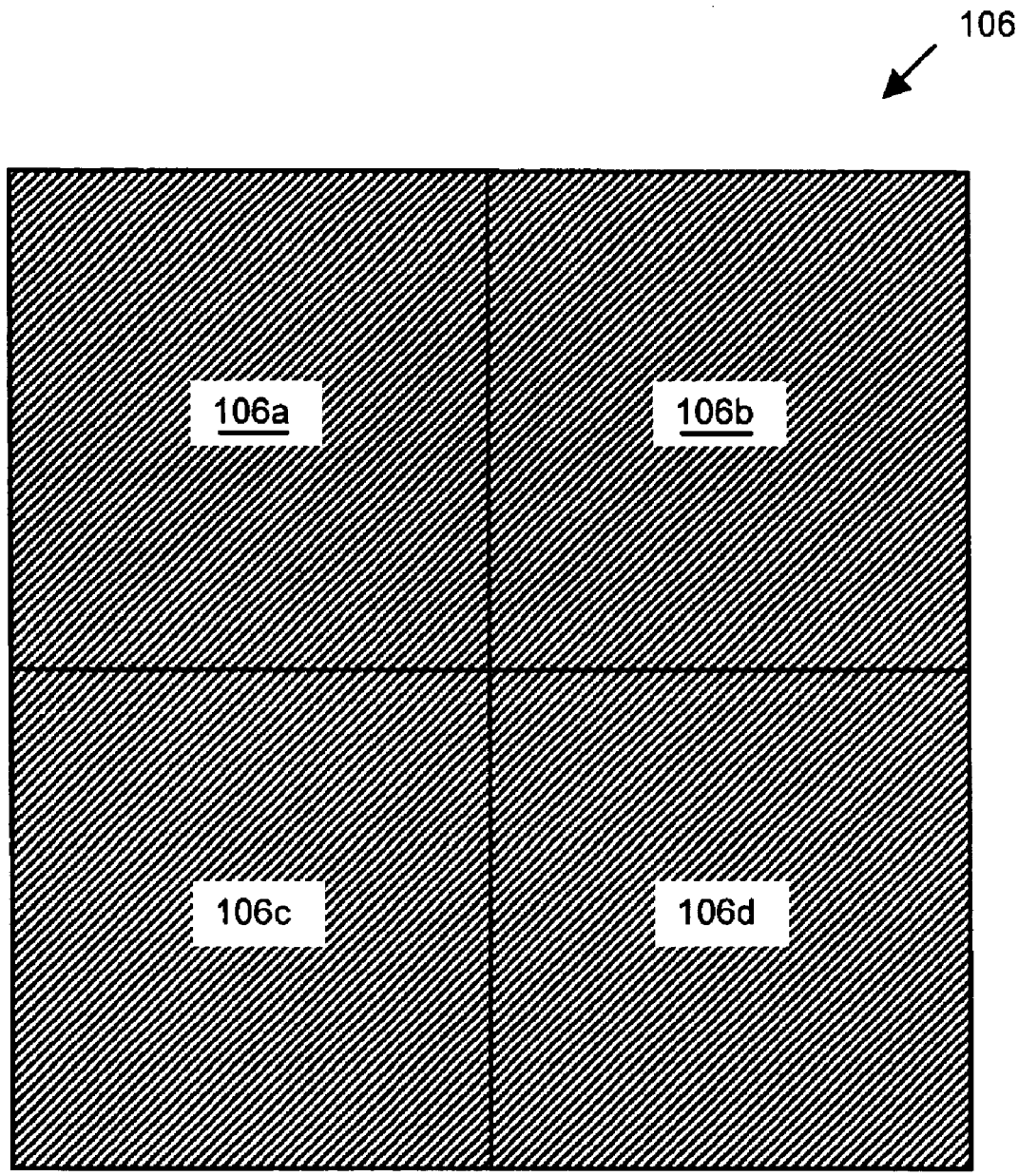

Moreover, sensor array 106 may be comprised of a plurality of sub-sensor arrays. For example, with reference to FIGS. 18A and 18B, sensor array 106 is comprised of sub-sensor arrays 106a–d. Each sub-sensor array 106a–d may be comprised of sensor cells 200 as illustrated in FIGS. 4–10 and/or described above. Such a configuration may provide an advantage of image data collection, and the speed thereof, since arrays 106a–d are smaller than the combined sensor array 106 and associated interface circuitry may collect and compile the information more rapidly, thereby reducing the inspection time. Further, it also reduces the requirement on the size of a single sensor array unit.

Figure 19:
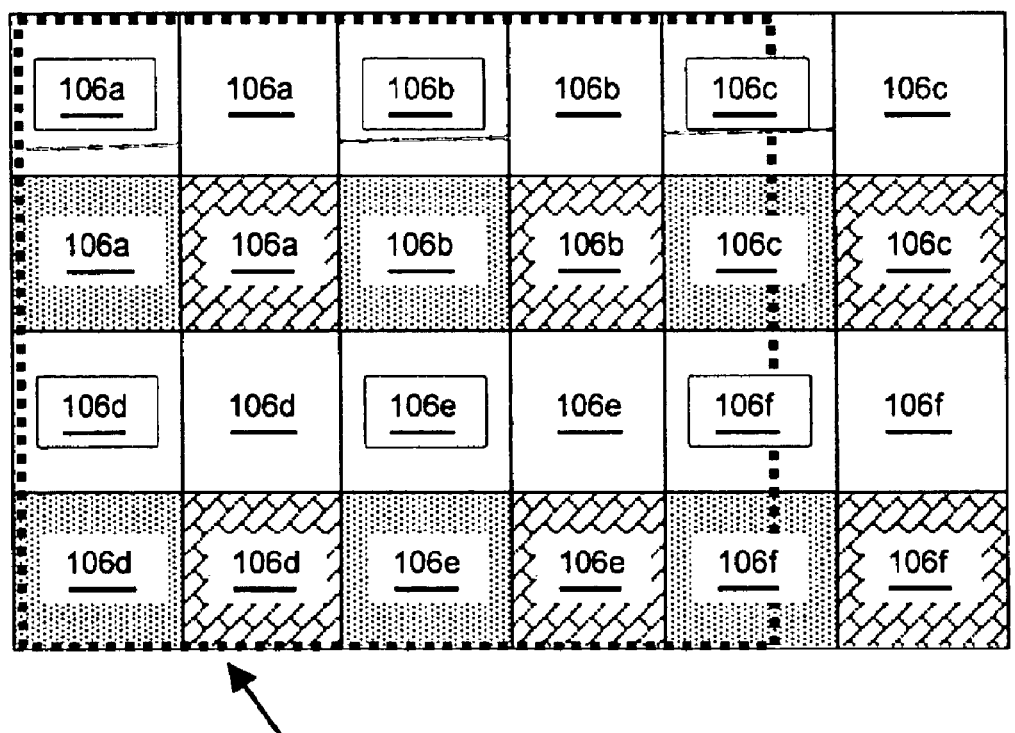
FIGS. 19 and 20 are exemplary representations of image collection techniques, in relation to a sensor array that is smaller than the aerial image to be collected, according to certain aspects of the present invention.

FIG. 19 illustrates one embodiment where multiple sub-sensor arrays are combined to construct a larger image sensor array. The sub-sensor arrays 106a–f in FIG. 19 are arranged in such a way that sensor array 106 (which includes 106a–f) is moved, relative to the field, four times to cover the area between the chips. In one embodiment, the operation sequence may be: (1) use the sub-frame capturing, then buildup the image for the first location of each sensor chip; (2) step the array to a previous uncovered area in the imaging field (represented by a different pattern or shading in FIG. 19; (3) repeat the sub-frame capturing process again to build-up the image in this new chip array location; (4) move the array, repeat the process until all area in the imaging field is covered.

It should be noted that it is acceptable to have double coverage (i.e., overlap between frames) in the butting areas between the four locations of the sensor array. So, the areas covered by different chip array location do not need to tile up seamlessly.

Figure 20:
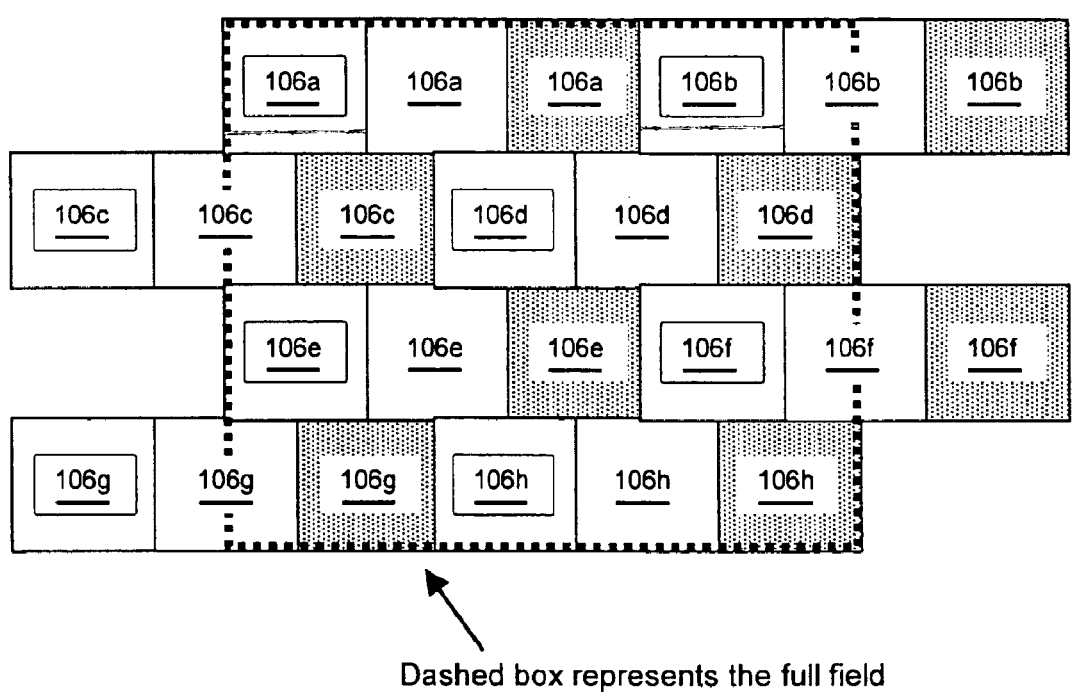

Another scanning or tile-up technique, though it uses slightly more sensor chips (106a–h), is illustrated in FIG. 20. In this embodiment, the array is positioned in three different locations relative to the imaging field, and hence this embodiment increases the image-capturing throughput.

It should also be noted that, for applications that use block-mode sampling, it may be acceptable to miss or eliminate the image blocks between the chips that are covered by the sensor readout circuitry and bonding pads. In that case, the tiling can be as simple as tiling up the sensor chips one to another, like the scheme illustrated in FIG. 18A–B. This configuration/technique allows the use of a single location of the chip array relative to the image, and hence avoid the throughput hit described in association with FIGS. 19 and 20.

Finally, it should be further noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, a processor(s), a processor(s) implementing software, or a combination of a circuit (whether integrated or otherwise), a group of such circuits, a processor(s) and/or a processor(s) implementing software. The term "data" may mean, among other things, a current or voltage signal(s) whether in an analog or a digital form. The term "sample" means, among other things, measure, sense, inspect, detect, capture and/or evaluate. Similarly, the phrase "to sample" or similar, means, for example, to measure, to sense, to inspect, to detect, to capture, to evaluate, to record, and/or to monitor.

What is claimed is:

1. A system to control the manufacture of integrated circuits using (1) a production-type mask, which includes features having a line width that includes a critical dimension, and (2) a lithographic integrated circuit manufacturing system having (i) an optical system to produce an image of the production-type mask on a wafer plane, and (ii) platform moveable between a plurality of discrete locations relative to the image, the system comprising:

an image sensor unit capable of being disposed on the moveable platform, the image sensor unit includes a sensor array capable of being located in the wafer plane, wherein the sensor array includes a plurality of sensor cells to sample light of a predetermined wavelength that is incident thereon, and wherein at each discrete location of the plurality of discrete locations of the platform the sensor cells sample the intensity of light; and a processing unit, coupled to the image sensor unit, to measure the critical dimension of the features using tile data which is representative of the intensity of light sampled by a plurality of sensor cells at a plurality of discrete locations of the platform and, in response to the measured critical dimension, to control at least one operating parameter of the lithographic integrated circuit manufacturing system.

2. The system of claim 1 wherein the operating parameter is a parameter of the optical system.

3. The system of claim 2 wherein the processing unit, in response to determining the measured critical dimension of a first feature on the production-type mask that is smaller than a target critical dimension, instructs the optical system to increase the illumination when the platform is located in an area corresponding to the particular feature.

4. The system of claim 3 wherein the target critical dimension is based on an expected or a desired critical dimension of the first feature.

5. The system of claim 1 wherein the image sensor unit further includes:

a substrate wherein the sensor array is disposed on or in the substrate;

a film, disposed over selected portions of the effective active areas of the plurality of sensor cells to reduce the effective active area and enhance the spatial resolution of each sensor cells wherein the film is comprised of a material that impedes passage of light of the predetermined wavelength.

6. The system of claim 5 wherein the film defines at least one aperture disposed over a selected portion of each effective active area of the plurality of sensor cells and wherein the aperture includes a shape, wherein the shape is based on at least the critical dimension of a first feature on the production mask.

7. The system of claim 5 wherein the film defines at least one aperture disposed over a selected portion of each effective active area of the plurality of sensor cells and wherein the location of the at least one aperture is correlated to the location of a first feature on the production-type mask.

8. The system of claim 5 wherein the film defines at least one aperture disposed over a selected portion of each effective active area of the plurality of sensor cells wherein the aperture includes a shape which is based on the critical dimension of at least one feature on the production-type mask.

9. The system of claim 5 wherein the substrate includes a wafer-shaped profile.

10. The system of claim 1 wherein:
the processing unit generates:
a first data set using the intensity of light sampled by each sensor cell when the platform is positioned at a first location relative to the aerial image, wherein the first data set includes data which is representative of the aerial image at locations corresponding to the locations of the sensor cells relative to the aerial image; and
a second data set using the intensity of light sampled by each sensor cell when the platform is positioned at a second location relative to the aerial image, wherein the second data set includes data which is representative of the aerial image at locations corresponding to the locations of the sensor cells relative to the aerial image; and
wherein the first location and the second location are adjacent locations along an axle in a first direction of the platform and wherein the distance between the first location and the second location is less than the distance between the two opposing edges of the effective active area of each sensor cell of the sensor array, wherein the opposing sides are transverse to the axis.

11. The system of claim 1 wherein:
the processing unit generates:
a first data set using the intensity of light sampled by each sensor cell when the platform is positioned at a first location relative to the aerial image, wherein the first data set includes data which is representative of the aerial image at locations corresponding to the locations of the sensor cells relative to the aerial image; and
a second data set using the intensity of light sampled by each sensor cell when the platform is positioned at a second location relative to the aerial image, wherein the second data set includes data which is representative of the aerial image at locations corresponding to the locations of the sensor cells relative to the aerial image; and
wherein the first location and the second location are adjacent locations along an axis in a first direction of the platform and wherein the distance between the first location and the second location is less than the diameter of the effective active area of each sensor cell.

12. The system of claim 1 wherein the processing unit generates an aerial image of the mask by interleaving the intensity data sampled by each sensor cell at each discrete location of the platform.

13. The system at claim 12 wherein the processing unit determines the critical dimension based on at least a portion of the interleaved intensity data.

14. A system for controlling the manufacture of integrated circuits using (1) a production-type mask which includes a plurality of features including a first feature having a line width that includes a target critical dimension, and (2) a lithographic integrated circuit manufacturing system having (i) an optical system to produce en image of the production-type mask on a wafer plane, and (ii) a platform moveable between a plurality of discrete locations relative to the image of the production-type mask on the wafer plane, the system comprising:
an image sensor unit disposed in the moveable platform, the image sensor unit includes a sensor array capable of being located in the wafer plane, wherein the sensor array includes a plurality of sensor cells wherein each sensor cell includes an effective active area to sample light of a predetermined wavelength that is incident thereon, and wherein at each discrete location of the plurality of discrete locations of the platform the sensor cells sample the intensity of light; and
a processing unit, coupled to the image sensor unit, to measure the critical dimension of the first feature using data which is representative of the intensity of light sampled by at least one sensor cell at at least one location of the plurality of discrete locations and, in response to determining the measured critical dimension of the first feature is smaller than a the target critical dimension, to adjust at least one operating parameter of the optical system of the lithographic integrated circuit manufacturing system.

15. The system of claim 14 wherein the operating parameter is an illumination of the optical system.

16. The system of claim 15 wherein the processing unit adjusts the illumination of the optical system by instructing the optical system to increase the illumination when the platform is located in an area corresponding to the first feature.

17. The system of claim 14 wherein the target critical dimension is based on an expected or a desired critical dimension of the first feature.

18. The system of claim 14 wherein the image sensor unit further includes:
a substrate wherein the sensor array is disposed on or in the substrate;
a film, disposed over selected portions of the effective active areas of the plurality of sensor cells to reduce the effective active area and enhance the spatial resolution of each sensor cell wherein the film is comprised of a material that impedes passage of light of the predetermined wavelength.

19. The system of claim 18 wherein the film defines at least one aperture disposed over a selected portion of each effective active area of the plurality of sensor cells and wherein the location of the at least one aperture is correlated with the location of the first feature on the production-type mask.

20. The system of claim 18 wherein the film defines at least one aperture disposed over a selected portion of each effective active area of the plurality of sensor cells wherein at least one aperture includes a shape which is based on the critical dimension of the first feature on the production-type mask.

21. The system of claim 14 wherein the distance between opposing edges of the effective active area of the at least one sensor cell is greater than or equal to the distance between two adjacent discrete locations of the platform along an axis in a first direction.

22. The system of claim 14 wherein the diameter of the effective active area of the at least one sensor cell is greater than or equal to the distance between two adjacent discrete locations of the platform along an axis in a first direction.

23. The system of claim 14 wherein the processing unit generates an aerial image of the mask by interleaving the intensity data sampled by each sensor cell at each discrete location of the platform.

24. The system of claim 23 wherein the processing unit determines the critical dimension of the first feature using the interleaved intensity data of at least one sensor cell.

25. A system to evaluate the integrity of production-type masks and to control the manufacture of integrated circuits using (1) a production-type mask, which includes a plurality of features including a first feature having a line width, and (2) a lithographic integrated circuit manufacturing system having (i) an optical system to produce an image of the production-type mask on a wafer plane, and (ii) a platform moveable between a plurality of discrete locations relative to the image of the production-type mask, the system comprising:
a sensor array disposed on or in the moveable platform, the sensor array capable of being located in the wafer plane, wherein the sensor array includes a plurality of sensor cells wherein each sensor cell includes an effective active area to sample light of a predetermined wavelength that is incident thereon, and wherein at a plurality of discrete locations the sensor cells sample the intensity of light; and
a processing unit, coupled to the sensor array, to:
generate image data which is representative of the aerial image, wherein the processing unit generates the aerial image of the production-type mask by interleaving the image data sampled by each sensor cell at a plurality of discrete locations of the platform; and
measure the critical dimension of the first feature using the data which is representative of the intensity of light sampled by at least one sensor cell at at least one discrete location corresponding to the first feature.

26. The system of claim 25 wherein the line width of the first feature includes a target critical dimension and wherein the processing unit, in response to determining the measured critical dimension of the first feature is smaller than the target critical dimension, adjusts at least one operating parameter of the optical system of the lithographic integrated circuit manufacturing system.

27. The system of claim 26 wherein the processing unit adjusts the illumination of the optical system.

28. The system of claim 27 the processing unit adjusts the illumination of the optical system by instructing the lithographic integrated circuit manufacturing system to increase the illumination when the platform is located in an area corresponding to the first feature.

29. The system of claim 25 wherein the sensor array is disposed on or in a substrate having a wafer-shaped profile, and wherein the system further includes a film, disposed over selected portions of the effective active areas of the plurality of sensor cells to reduce the effective active area and enhance the spatial resolution of each sensor cell wherein the film is comprised of a material that impedes passage of light of the predetermined wavelength.

30. The system of claim 29 wherein the film defines at least one aperture disposed over a selected portion of each effective active area of the plurality of sensor cells and wherein the location of at least one of the apertures is correlated with the location of the first feature on the production-type mask.

31. The system of claim 29 wherein the film defines at least one aperture disposed over a selected portion of each effective active area of the plurality of sensor cells wherein at least one of the apertures includes a shape which is based on a target critical dimension of the first feature on the production-type mask.

32. The system of claim 25 wherein the distance between opposing edges of the effective active area of the at least one sensor cell is greater than or equal to the distance between two adjacent discrete locations of the platform along an axis in a first direction.

33. The system of claim 25 wherein the diameter of the effective active area of the at least one sensor cell is greater than or equal to the distance between two adjacent discrete locations of the platform along an axis in a first direction.

34. The system of claim 25 wherein the processing unit compares data which is representative of the intensity of light sampled by each sensor cell at each discrete location to data of a mask pattern design database, wherein the mask pattern design database includes data which is representative of the features on the production-type mask.

35. The system of claim 34 wherein the mask pattern design database is a design-target of the wafer image of the mask.

36. The system of claim 34 wherein the mask pattern design database includes polygon data which is representative of the production-type mask.

37. The system of claim 34 wherein the mask pattern design database includes intensity data which is representative of the production-type mask.

38. The system of claim 34 further including a film, disposed over the effective active areas of the plurality of sensor cells and comprised of a material that impedes passage of light of the predetermined wavelength, wherein the film includes a plurality of apertures which are arranged such that one aperture of the plurality of apertures overlies an associated active area of a corresponding sensor cell to expose a portion of the effective active area and wherein light of the predetermined wavelength is capable of being sensed by the portion of the effective active area that is exposed by the associated aperture.

39. The system of claim 34 wherein the processing unit converts the data which is representative of the intensity of light sampled by each sensor cell at each discrete location to corresponding polygon data.

40. The system of claim 39 wherein the mask pattern design database is comprised of polygon data representing an intended wafer image.

41. The system of claim 34 further including a database conversion processing unit to convert the polygon data of a first design database to the mask pattern design database comprised of intensity data wherein the intensity data for each spatial location corresponds to the polygon data for each associated spatial location.

42. The system of claim 34 wherein the processing unit generates the aerial image of the production-type mask by interleaving the intensity data sampled by each sensor cell at each discrete location of the platform.

43. The system of claim 42 wherein the processing unit generates the aerial image of the production-type mask using de-convolution.

44. The system of claim 42 wherein the processing unit compares the aerial image of the production-type mask with an aerial image of the mask which is generated using the mask pattern design database.

45. The system of claim 42 wherein the processing unit compares the aerial image of the production-type mask with a design-target of the wafer image of the mask.

46. The system of claim 25 wherein the processing unit compares data which is representative of the intensity of light sampled by each sensor cell at each discrete location of a first die to data which is representative of the intensity of light sampled by each sensor cell at each discrete location of a second die.

47. The system of claim 46 wherein processing unit further compares data which is representative of the intensity of light sampled by each sensor cell at each discrete location of a first die to associated data of a mask pattern design database.

48. The system of claim 47 wherein the mask pattern design database includes polygon data.

49. The system of claim 47 wherein the mask pattern design database is comprised of intensity data.

50. The system of claim 47 wherein the processing unit may further include a database processing unit to convert the polygon data of a first design database to the mask pattern design database comprised of intensity data, and wherein the intensity data for each spatial location corresponds to the polygon data for each associated spatial location.

51. The system of claim 50 wherein the mask includes OPC or PSM features and wherein the mask pattern design database includes data which is representative of the design-target.

52. The system of claim 50 wherein the mask includes OPC or PSM features and wherein the mask pattern design database includes data which is representative of the after-OPC or PSM-decoration pattern.

53. The system of claim 50 wherein the mask includes OPC or PSM features and wherein the mask pattern design database includes data which is representative of the design-target and data which is representative of the after-OPC or PSM-decoration pattern.

* * * * *